(12) United States Patent
Sako

(10) Patent No.: US 6,194,914 B1
(45) Date of Patent: Feb. 27, 2001

(54) SEMICONDUCTOR INTEGRATED CIRCUIT CAPABLE OF REALIZING LOGIC FUNCTIONS

(75) Inventor: Norimitsu Sako, Chiba (JP)

(73) Assignee: Kawasaki Steel Corporation, Hyogo (JP)

( * ) Notice: Subject to any disclaimer, the term of this patent is extended or adjusted under 35 U.S.C. 154(b) by 0 days.

(21) Appl. No.: 09/266,890

(22) Filed: Mar. 12, 1999

Related U.S. Application Data

(63) Continuation of application No. 08/763,264, filed on Dec. 10, 1996, which is a continuation-in-part of application No. 08/716,883, filed on Sep. 20, 1996, now Pat. No. 5,808,483.

(30) Foreign Application Priority Data

| Sep. 22, 1995 | (JP) | ................................................ 244402 |
| Dec. 4, 1995 | (JP) | ................................................ 315603 |
| Dec. 11, 1995 | (JP) | ................................................ 7-321493 |
| Dec. 14, 1995 | (JP) | ................................................ 7-325756 |

(51) Int. Cl.$^7$ .................... H03K 19/094; H03K 19/01

(52) U.S. Cl. ................ 326/113; 326/113; 326/119; 326/121; 326/112; 326/17; 326/20

(58) Field of Search ................ 326/113, 119, 326/121, 17, 20, 101, 102, 103, 112

(56) References Cited

U.S. PATENT DOCUMENTS

| 3,739,193 | 6/1973 | Pryor . |
| 4,541,067 | 9/1985 | Whitaker . |
| 4,559,609 | 12/1985 | Robinson, Jr. et al. . |

(List continued on next page.)

FOREIGN PATENT DOCUMENTS

| 1-129611 | 5/1989 | (JP) . |
| 1-216622 | 8/1989 | (JP) . |
| 1-256219 | 10/1989 | (JP) . |

OTHER PUBLICATIONS

Robert J. Landers et al., "A Multiplexer–Based Architecture for High–Density, Low Power Gate Arrays", IEEE Journal of Solid–State Circuits, vol. 30, No. 4, pp. 392–396, Apr., 1995.

Jim Gallia et al., "A Flexible Gate Array for High Speed and High Density Applications", IEEE 1995 Custom Integrated Circuits Conference, pp. 1–4.

(List continued on next page.)

Primary Examiner—Michael Tokar
Assistant Examiner—Vibol Tan
(74) Attorney, Agent, or Firm—Oliff & Berridge, PLC.

(57) ABSTRACT

A semiconductor integrated circuit is constructed with composite pass-transistor logic circuits serving as elementary circuit units each including a plurality of pass-transistor logic trees and a multiple-input logic gate. A wide variety of logical operations, even complex opearations, can be efficiently expressed using the composite pass-transistor logic circuit, and the resultant logic circuit can operate at a high speed. Thus, the semiconductor integrated circuit of the present invention can realize various logic functions required for various users in an efficient fashion. The present invention is particularly useful when applied to a field-programmable gate array integrated circuit, since complex logical operations can be expressed in a simple and efficient fashion by the composite pass-transistor logic circuits. The gate array integrated circuit obtained in accordance with the present invention can operate at a high speed with low power consumption. The present invention also discloses a basic cell suitable for use in an integrated circuit in the form of a gate array, and more particularly, a programmable logic block for use in a field programmable gate array integrated circuit.

44 Claims, 36 Drawing Sheets

U.S. PATENT DOCUMENTS

| | | |
|---|---|---|
| 4,595,845 | 6/1986 | Briggs . |
| 4,620,117 | 10/1986 | Fang . |
| 4,633,220 | 12/1986 | Burgess . |
| 4,870,302 | 9/1989 | Freeman . |
| 4,940,908 | 7/1990 | Tran . |
| 5,027,012 | 6/1991 | Saeki et al. . |
| 5,040,139 | 8/1991 | Tran . |
| 5,122,685 | 6/1992 | Chan et al. . |
| 5,162,666 | 11/1992 | Tran . |
| 5,200,907 | 4/1993 | Tran . |
| 5,289,021 | 2/1994 | El Gamal . |
| 5,367,208 | 11/1994 | El Gamal et al. . |
| 5,489,860 * | 2/1996 | Kitagawa et al. .................. 326/103 |
| 5,625,303 | 4/1997 | Jamshidi . |
| 5,677,641 | 10/1997 | Nishio et al. . |
| 5,859,548 * | 1/1999 | Kong ................................... 326/113 |
| 5,872,716 * | 2/1999 | Yano et al. ......................... 364/489 |
| 5,955,912 * | 9/1999 | Ko ....................................... 327/410 |
| 6,005,418 * | 12/1999 | Taki .................................... 326/113 |

OTHER PUBLICATIONS

CMOS3 Cell Library, Addison–Wesley VLSI Systems Series, Edited by Dennis V. Heinbuch, pp. 137–143, Copyright © 1988.

"A 3.8–ns CMOS 16×16–b Multiplier Using Complementary Pass–Transistor Logic," Kazuo Yano et al., IEEE Journal of Solid–State Circuits, vol. 25, No. 2, Apr. 1990, pp. 388–395.

"Pass–transistor logic design," Waleed Al–Assadi et al., Int. J. Electronics, 1991, vol. 70, No. 4, pp. 739–749.

"A 1.5ns 32b CMOS ALU in Double Pass–Transistor Logic," Makoto Suzuki et al., ISSCC 93/Session 5/Microprocessors/Paper TA 5.4, Feb. 25, 1993, pp. 90–91.

"A High Speed, Low Power, Swing Restored Pass–Transistor Logic Based Multiply and Accumulate Circuit for Multimedia Applications,".

Akilesh Parameswar et al., IEEE 1994 Custom Integrated Circuits Conference, pp. 278–281.

"Lean Integration: Achieving a Quantum Leap in Performance and Cost of Logic LSIs," Kazuo Yano et al., IEEE 1994 Custom Integrated Circuits Conference, pp. 603–606.

"Pass Transistor Based Gate Array Architecture," Yasuhiko Sasaki et al., 1995 Symposium on VLSI Circuits Digest of Technical Papers, pp. 123–124.

"Differential Cascode Voltage Switch with the Pass–Gate (DCVSPG) Logic Tree for High Performance CMOS Digital Systems," F.S. Lai et al., International Symposium on VLSI Technology, Systems, and Applications/Proceedings of Technical Papers, May 12–14, 1993/Taipei, Tawiwan, R.O.C., pp. 358–362.

"Top–Down Pass–Transistor Logic Design," Kazuo Yano et al., IEEE Journal of Solid–State Circuits, vol. 31, No. 6, Jun. 1996, pp. 792–803.

"Low–Power Logic Styles: CMOS vs CPL," Reto Zimmermann et al., Proceedings of the $22^{nd}$ European Solid–State Circuits Conference (ESSCIRC '96), Neuchâtel, Switzerland, Sep. 17–19, 1996, pp. 112–115.

* cited by examiner

FIG. I
PRIOR ART
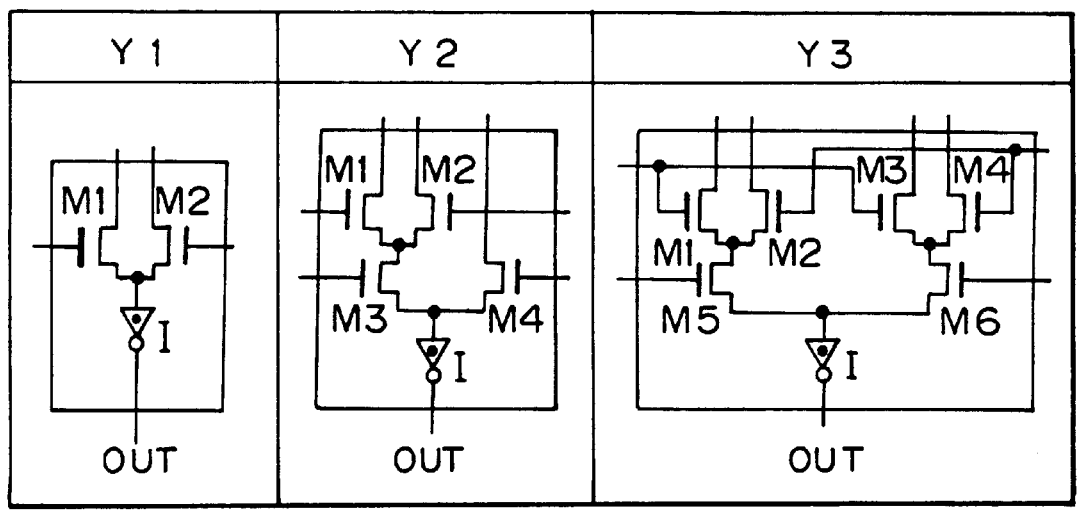
FIG. 2
PRIOR ART
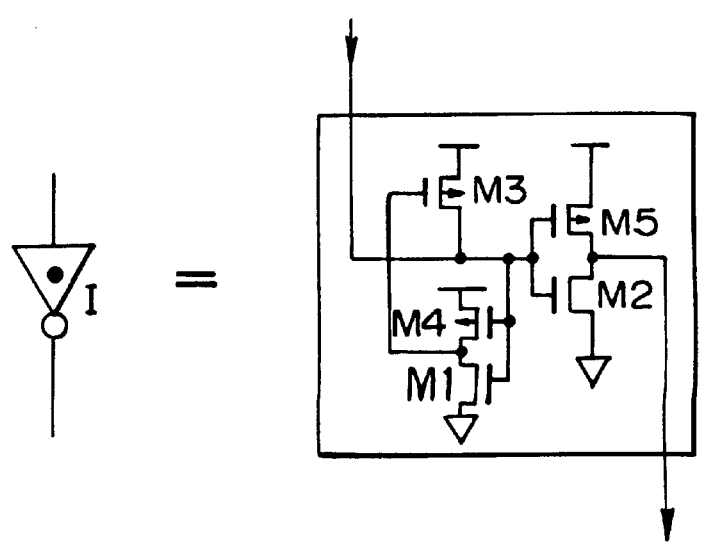

TRANSFER GATE | DATA HOLD

SEMICONDUCTOR INTEGRATED CIRCUIT CAPABLE OF REALIZING LOGIC FUNCTIONS

CROSS-REFERENCE TO RELATED APPLICATIONS

This application is a continuation of 08/763,264 filed Dec. 10, 1996, which in part of U.S. patent application Ser. No. 08/716,883 filed Sep. 20, 1996, now U.S. Pat. No. 5,808,483, which is incorporated by reference herein.

BACKGROUND OF THE INVENTION

1. Field of the Invention

The present invention relates to a general-purpose semiconductor integrated circuit for realizing a variety of logic functions required in various applications by combining of a plurality of logic circuits expressing discrete logical operations. In the present invention, individual logic circuits are each constructed by combining pass-transistor logic circuits and a multiple-input logic gate. Complex logical operations can be efficiently expressed using the logic circuity disclosed herein, which can operate at a high speed. The present invention also relates to a method of forming the logic circuits used in such an integrated circuit, as well as a method of executing various logical operations.

The present invention furthermore relates to a base cell used to construct a semiconductor integrated circuit in the form of a gate array, and more particularly, to a programmable logic block for use in a field programmable gate array integrated circuit. The present invention likewise relates to a method of programming such a programmable logic block.

2. Description of the Related Art

It is known in the art to realize a semiconductor integrated circuit comprising a plurality of logic circuits expressing various logical operations on a semiconductor substrate. The resulting integrated circuit realizes functions required in electronic applications by combining logical operations expressed by the logic circuits. Semiconductor integrated circuits of this type are widely used in the industry.

An example of this type of semiconductor integrated circuit is a full-custom integrated circuit. In the full-custom integrated circuit, the types, the dimensions, and the layouts of basic elements such as MOS transistors or other switching devices constituting the logic circuits are determined in accordance with the logical operation to be realized by the logic circuit. Masks required to fabricate the integrated circuit are produced, and the integrated circuit is then fabricated using these masks.

Another type of semiconductor integrated circuit is a gate array, which is also widely used in the industry. In gate arrays, basic cells each including a predetermined number of switching devices, each having a predetermined structure with predetermined dimensions, are arranged in an array on a surface of a semiconductor substrate. Logical operations are expressed by properly setting the interconnections within each basic cell. The gate array integrated circuit can realize different functions by properly making interconnections among the basic cells.

A typical example of gate array integrated circuits is a mask programmable gate array. In a mask programmable gate array, a semiconductor substrate (master slice), on which basic cells having no interconnections are arranged in an array, is prepared first. Interconnections among switching devices within each basic cell and interconnections among basic cells are determined depending on the function required in a specific application. Masks required to form the determined interconnections are then produced. Using these masks, interconnections are formed on the master slice which has already been prepared, thereby fabricating an integrated circuit having the desired function.

The mask programmable gate array. reduces turn around time, and thus the cost, required to design and produce integrated circuits having given desired functions. Thus, the mask programmable gate array provides users with an efficient means of realizing their own integrated circuits required by their specific applications.

In recent years, a field programmable gate array (FPGA), in which each basic cell includes programmable interconnections with programmable switches, has also been widely used. In the FPGA, a user can set programmable switches in each basic cell (often called a programmable logic block in the art of the FPGA) to either ON state or OFF state by programming, so that logic circuits required in an application are configured in the programmable logic blocks. The different programmable logic blocks are connected to each other via programmable interconnections among programmable logic blocks. Thus, the user can realize a desired integrated circuit by programming the programmable interconnections of the FPGA at the user's site. Pass transistors driven by data stored in an SRAM, EEPROM or similar devices, or anti-fuses are generally used as the switches.

It is also known in the art to employ a "pass-transistor logic circuit" to reduce the number of elements and improve operating speed (as for example U.S. Pat. No. 4,541,067). Pass-transistor logic circuits use pass transistors each comprising a switching device. Conduction between an input terminal and output terminal of the switching device is turned ON or OFF according to a potential at a control terminal. Each pass transistor is realized by connecting the switching devices so that whether a logic signal applied to the input terminal is transmitted to the output terminal can be determined with the conducting or nonconducting state of each switching device. In general, a plurality of pass transistors are connected in series and/or parallel to constitute a pass-transistor logic circuit for calculating a desired logical operation. As for the switching devices, MOS transistors, for example, may be used. In this case, the gate, source, and drain of each MOS transistor correspond to the control, input, and output terminals, respectively.

Use of such the pass transistor logic circuit allows a reduction in the number of required elements and an improvement in operating speed.

A specific example of a pass-transistor logic circuit is disclosed in U.S. Pat. No. 4,559,609, in which it has been demonstrated that a full adder can be realized using a pass-transistor logic circuit with a smaller number of transistors than required when the full adder is realized using only MOS transistor NOR gates. Although this patent discloses a technique of realizing a circuit for producing a C (carry) integral in the full adder, using six pass transistors and one triple-input NOR gate, the patent does not disclose a general technique to realize various logic circuits with a combination of pass transistors and a multiple-input logic gate, other than the circuit for producing a carry signal. In fact, in the above patent, the circuit to produce a carry signal is the only logic circuit that has been realized by a combination of pass transistors and a multiple-input logic gate. On the other hand, the circuit to produce an S (sum) signal is realized by using pass transistors and inverters without using a multiple-input logic gate.

K. Yano et al., have proposed three types of pass-transistor logic circuit cells Y1 to Y3 such as those shown in FIG. 1 in their paper entitled "Lean Integration: Achieving a Quantum Leap in Performance and Cost of Logic LSIs" (IEEE 1994 Custom Integrated Circuits Conference, p. 603). In these cells Y1 to Y3, pass-transistor logic circuits are constructed with a plurality of N channel MOS transistors M1 to M6, and an inverter I is connected to each pass transistor logic circuit. The cell Y1 is a single-stage pass-transistor logic circuit. The cell Y2 is a pass-transistor logic circuit in the form of a combination of a single-stage pass-transistor logic circuit and a dual-stage pass-transistor logic circuit. The cell Y3 is a full double-stage pass-transistor logic circuit. In these cells, each inverter I is constructed with two N channel MOS transistors M1 and M2 and three P channel MOS transistors M3 to M5, as shown in FIG. 2.

In FIG. 2 and other figures, T-shaped symbols are used to denote terminations connected to first power supply means for supplying a power supply potential. Interconnections terminated by inverted triangles are assumed here to be connected to second power supply means for supplying a reference potential. The ground potential is generally employed as the reference potential.

Other pass transistor logic circuits are also disclosed in the co-pending patent application Ser. No. 08/716,883.

It is also known in the art to use a pass transistor logic circuit to form a basic cell of a gate array. For example, a pass-transistor logic circuit which is constructed with three pairs of N channel MOS transistors to produce complementary output signals OUT and $\overline{OUT}$ is disclosed in a technical paper entitled "Pass Transistor Based Gate Array Architecture" (Y. Sasaki et al., 1995 Symposium on VLSI Circuit Digest of Technical Papers 16-1). The outputs of the pass transistor logic circuit are latched (or pulled up) by cascode-connected small-size P channel MOS transistors so as to prevent interference with a circuit in the succeeding stage. Furthermore, an inverter for driving the circuit in the succeeding stage is provided at the outputs of the pass-transistor logic circuit. The technical paper cited herein above also discloses a gate array using basic cells each including transistors which can construct two above-described pass-transistor logic circuits.

FIG. 1 of this technical paper is shown herein as FIG. 3. In this prior art, complementary input signals are applied to a pass-transistor tree constructed with N channel MOS transistors, and the results of the logical operation performed by the pass-transistor tree are output as OUT and $\overline{OUT}$ in a complementary form. The outputs OUT and $\overline{OUT}$ are connected to a latch consisting of two P channel MOS transistors.

As shown in FIG. 4 corresponding to FIG. 5 of the technical paper cited herein above, an SRAM (static random access memory) cell can be formed using the above basic cells. In FIG. 4, the input and the output of an inverter constructed with a P channel MOS transistor P1 and an N channel MOS transistor N1 are connected to the output and the input of an inverter constructed with a P channel MOS transistor P2 and an N channel MOS transistor N3, respectively, so that a latch is formed. The latch is connected to a pair of bit lines via N channel MOS transistors N2 and N4, wherein the gate of each MOS transistors N2 and N4 is connected to a word line.

Further, some FPGAs employ pass transistors as basic elements of the programmable logic blocks.

For example, U.S. Pat. No. 5,367,208 discloses an FPGA including programmable logic blocks each having a structure shown in FIG. 5. An N channel MOS transistor M1 and a P channel MOS transistor M2 form a first pass-transistor (called a "pass gate"). Similarly, an N channel MOS transistor M3 and a P channel MOS transistor M4 form a second pass gate. Thus, the programmable logic block shown in FIG. 5 includes a single-stage pass-transistor logic circuit.

FIG. 6 shows a programmable logic block employed in an FPGA disclosed in U.S. Pat. No. 4,870,302. As shown, this programmable logic block comprises eight pass transistors, two inverters 21 and 22 and a complex gate including a dual-input OR gate 23, a dual-input AND gate 24, a triple-input AND gate 25, and a dual-input NOR gate 26. In this programmable logic block, the logic states of configuration control signals C0, $\overline{C0}$, C1, $\overline{C1}$, ..., C5 are determined such that a desired logical operation is expressed by the logic block. These configuration control signals are applied to the control terminals of the respective pass transistors, so that the respective pass transistors are in either ON state or OFF state. When this logic block is actually operated as the logic circuit, the configuration signals C0 through C5 are maintained at the determined states. Input signals A and B are input to this logic circuit from, for example, a logic circuit realized using another programmable logic block at the preceding stage. The input signals A and B are input to corresponding input nodes of the complex gate either directly without being inverted or indirectly after being inverted by the inverter 21 or 22, depending on the states of the pass transistors. The complex gate performs a logical operation on the received signals, and provides the result via the output node.

For example, if the configuration control signals C0 and C1 are set to HIGH state, the pass transistors 29c and 29d are in ON states and thus the input signals A and B are directly input to the input nodes of the triple-input AND gates 25. Furthermore, if the configuration control signal C5 is also set to HIGH state, the result of logical AND operation between A and B is provided at the output of the AND gate 25. On the other hand, if $\overline{C0}$ and $\overline{C1}$ are set to HIGH state, the input signals A and B are input to the input nodes of the triple-input AND gate 25 after being inverted by the inverters 21 and 22, respectively. In this case, the result of logical AND operation of $\overline{A}$ and $\overline{B}$ is provided at the output of the triple-input AND gate 25. In the programmable logic block of this technique, as described above, each pass transistor simply serves to transmit an input logic signal to a complex gate either directly without being inverted or after being inverted, and a logical operation such as AND or OR on the input logic signals is effectively performed solely by a complex gate.

SUMMARY OF THE INVENTION

It is an object of the present invention to provide a general-purpose semiconductor integrated circuit capable of efficiently realizing various logic functions.

It is another object of the present invention to provide a method of efficiently forming individual logic circuits of an integrated circuit.

It is still another object of the present invention to provide a method of efficiently executing individual logical operations in an integrated circuit.

It is a further object of the present invention to provide a basic cell suitable for use in a gate array to realize the above semiconductor integrated circuit, in particular a basic cell in the form of a programmable logic block for use in an FPGA.

It is still another object of the present invention to provide a method of programming the programmable logic block.

According to an aspect of the present invention, there is provided a semiconductor integrated circuit for executing a plurality of logical operations, comprising a plurality of logic circuits each for receiving a plurality of input logic signals and for producing an output logic signal, each of the logic circuits comprising: at least two pass transistor logic trees each having at least two input nodes for receiving at least two of the input logic signals and an intermediate output node for providing an intermediate logic signal, each of the pass-transistor logic trees comprising at least two pass transistors; and a multiple-input logic gate having at least two intermediate input nodes each for receiving the intermediate logic signal from a corresponding one of the pass transistor logic trees, and an output node for providing the output logic signal produced by a selected one of the plurality of logical operations executed on the plurality of input logic signals.

A pass transistor is a unit for performing a desired logical operation, and employs a switching device in which conduction between an input terminal and output terminal is turned ON or OFF according to the potential at a control terminal thereof. When the switching device is turned ON, the pass transistor transmits a logic signal applied to an input terminal through an output terminal. In other words, when the input logic signal is HIGH, a HIGH signal is output. When the input logic signal is LOW, a LOW signal is output. By contrast, when the switching device is turned OFF, a logic signal applied to the input terminal of the pass transistor is not transmitted to its output terminal. In other words, the output terminal is floated, irrespective of the input logic signal. A MOS transistor is, typically, used as each switching device. The present invention however is not limited to this implementation or mode. For example, a junction field-effect transistor (JFET) can be used. Any switching device that is developed in the future will be able to be employed, as well. However, preferably, a normally-OFF type switching device is used because of the ease of applying an output logic signal of a preceding stage as an input logic signal to a control terminal thereof, without modification.

A pass-transistor logic tree is defined as a circuit having two or more pass transistors connected in series and/or parallel, and outputting a result of a logical operation based on input logic signals received through two or more input nodes as an intermediate logic signal through an intermediate output node. Typically, output terminals of two switching devices are coupled, thus forming an intermediate output node.

When pass transistors are connected in series, the output terminal of the pass transistor in a preceding stage is connected to the input terminal of the pass transistor in the next stage. When pass transistors are connected in parallel, the output terminals of the pass transistors are coupled. The control terminals and the input terminals which are not connected to the output terminals of the other pass transistors can be used as input nodes.

The input logic signals are usually received from a logic circuit in the preceding stage. The input logic signals may also be received from the outside of the integrated circuit chip via an I/O circuit. Each pass-transistor logic tree has at least two input nodes for receiving at least two input logic signals. The input logic signals may be received either directly or indirectly, for example after being inverted by an inverter. Each pass transistor logic tree may also has input nodes other than the at least two input nodes described above. Such input nodes may also be used to receive input logic signals, or logic signal having fixed logic states. In the latter case, the input nodes are connected to either first or second power supply means so that logic signals fixed at either HIGH or LOW state are received.

A multiple-input logic gate has a structure in which one switching device or a plurality of switching devices are connected in parallel and/or series between a first power supply means and an output node, and between a second power supply means and the output node. According to a result of a logical operation based on logic signals applied to intermediate input nodes, the output node is connected to either the first power supply means or second power supply means by means of the switching devices. The potential at the output node is thus determined. The first power supply means supplies a power supply potential, while the second power supply means supplies a reference potential. The reference potential is typically a ground potential. The present invention, however, is not limited to this implementation or mode. Depending on the intended use of the logic circuit, a potential different from the ground potential can be supplied as the reference potential. The power supply potential is typically a positive potential relative to the reference potential. The present invention, however again, is not limited to this implementation or mode. Depending on the intended use of the logic circuit or the characteristics of switching devices employed, it is possible to use a negative potential relative to the reference potential.

The multiple-input logic gate in accordance with the present invention in one aspect includes a plurality of intermediate input nodes used to receive intermediate logic signals from a plurality of pass-transistor logic trees.

As mentioned above, the logic circuit of the present invention has a pass-transistor logic circuit (pass-transistor logic trees) in a preceding stage and has a multiple-input logic gate to receive the outputs (intermediate logic signals) of the pass-transistor logic circuit. In other words, the logic circuit of the present invention is characterized by a composite configuration consisting of a pass-transistor logic circuit and a coupled multiple-input logic gate. Hereinafter, such logic circuit will be referred to as a "composite pass-transistor logic circuit".

The inventors have recognized a problem that the number of required switching devices in conventional pass-transistor logic circuits can become larger than that of ordinary CMOS logic circuits, depending on the logical operation to be realized. By contrast, in a logic circuit in accordance with the present invention, since pass-transistor logic trees and a multiple-input logic gate are combined, logical operations that are hard for known pass-transistor logic circuits to realize can be realized efficiently.

The inventors have already disclosed in the co-pending patent application Ser. No. 08/716,883 that the composite pass transistor logic circuit has advantages in terms of the number of transistors required, operating speed, and power consumption, over the conventional pass-transistor logic circuit and the CMOS logic circuit. In the composite pass-transistor logic circuit according to the present invention, complex logical operations can be expressed with a simpler structure with a smaller number of stages. It can also operate at a higher speed. The inventors have also disclosed that the composite pass-transistor logic circuit is not only suitable for particular logical operations, but is also capable of efficiently expressing a variety of kinds of logical operations. If this technique of composite pass-transistor logic circuits is employed, even those logical operations which cannot be expressed efficiently by conventional pass transistor logic circuits can be expressed in a more efficient manner than can be expressed by conventional CMOS logic circuits. And the obtained logic circuit exhibits higher performance than be achieved by the conventional CMOS logic circuits.

The present invention also relates to a technique of realizing desired function on a general-purpose integrated circuit, using the composite pass-transistor logic circuits as elementary building blocks. Various logical operations are expressed in the respective blocks and these blocks are combined into an integrated circuit so that the desired function is realized. In general-purpose logic integrated circuits, it is required that various functions needed not only by a particular user but by various users should be realized in a highly efficient fashion. Therefore, it is required that logic circuits used as building blocks in general-purpose logic integrated circuits can express various logical operations in an efficient manner. From this point of view, the composite pass-transistor logic circuit is particularly useful.

In each pass transistor logic tree, the at least two input nodes preferably include the control terminal of at least one of the pass-transistors. In this case, each of the pass transistor logic trees can convert the received input logic signals into the intermediate logic signal according to a logical operation, including a product term containing the at least two of the input logic signals. In this configuration, the composite pass transistor logic circuit, in which pass transistor logic circuits and a multiple-input logic gate are combined in a systematic and effective manner, is advantageously used to efficiently express various logical operations. Preferably, at least one of the pass-transistor logic trees comprises at least two stages. In the present invention, the term "at least two stages" is used to represent not only a full two or more stages, but also various composite configurations such as a combination of single-stage configuration and dual-stage configuration. The configuration with two or more stages makes it possible for the pass-transistor logic tree to express a more complex logical operation than single-stage configuration. As a result, the composite pass-transistor logic circuit can express complex logical operations.

Preferably the multiple-input logic gate comprises a third intermediate input node in addition to the at least two intermediate input nodes, for receiving one of the input logic signals. The present invention is not limited to the configuration in which all the intermediate input nodes of the multiple-input logic gates receive the intermediate logic signals produced by the pass-transistor logic trees. The multiple-input logic gate may also receive an input logic signal in addition to intermediate logic signals produced by the pass-transistor logic trees. This allows the composite pass-transistor logic circuit to express a wider variety of logical operations in a simple and efficient fashion. In this configuration, the multiple-input logic gate may "receive" an input logic signal not only directly but also indirectly, for example, after being inverted by an inverter.

The multiple-input logic gate in accordance with the present invention is preferably a complementary logic gate. In a complementary logic gate, opposite conduction type switching devices are used. The first conduction type switching devices are connected in series and/or parallel between the first power supply means and an output node. The second conduction type switching devices are connected in series and/or parallel between the second power supply means and output node. Characteristically, when the logic state of the output logic signal is either HIGH or LOW, either of the conduction type switching devices is OFF, and a static feedthrough current flowing from the first power supply means into the second power supply means is small. "Static feedthrough current" means a feedthrough current flowing when the logic state of the output logic signal is not changing.

Preferably, the complementary logic gate is a CMOS logic gate constructed with a combination of N channel MOS transistors and P channel MOS transistors, although other types of complementary logic gates may be employed.

Furthermore, in the present invention, each logic circuit preferably comprises a suppressor of a static feedthrough current of the multiple-input complementary logic gate. This allows a reduction in the power consumption of the integrated circuit. More specifically, the suppressor of static feedthrough current preferably comprises means for restoring potentials of the intermediate output nodes of all the pass transistor logic trees in response to the output logic signal of the multiple-input complementary logic gate. As is disclosed in the co-pending patent application Ser. No. 08/716,883, the suppressor of static feedthrough current of this form allows a reduction in probability of occurence of logical collision with a logic circuit in the carp preceding stage.

In the integrated circuit according to the present invention, each of the pass transistors preferably comprises a switching device having a first conduction type and a first driving capacity, and having an input terminal connected to the input terminal of the pass transistor, an output terminal connected to the output terminal of the pass transistor and a control terminal connected to the control terminal of the pass transistor;

each of the pass transistors further comprises auxiliary switching devices each provided for each of the switching devices, each of the auxiliary switching devices having a second conduction type and a second driving capacity which is less than the first driving capacity; and each of the auxiliary switching devices having an input terminal connected to the input terminal of the corresponding switching device, an output terminal connected to the output terminal of the corresponding switching device, and a control terminal for receiving a complement logic signal of a logic signal received by the control terminal of the corresponding switching device. Preferably, the switching devices are N channel MOS transistors each having a first W/L ratio, and the auxiliary switching devices are P channel MOS transistors each having a second W/L ratio which is less than the first W/L ratio.

The details of the technique of constructing a pass transistor in the form of a combination of a switching device having a first conduction type and an auxiliary switching device having a second conduction type and having a second driving capacity less than the first driving capacity have been disclosed in the co-pending patent application Ser. No. 08/716,883. This technique prevents reduction in the logical amplitude of the logic signal, which may otherwise occur when the signal is transmitted through a pass-transistor logic tree. In particular, when pass-transistor logic trees are combined with a multiple-input complimentary logic gate to construct a composite pass-transistor logic gate, the above technique makes it possible to suppress the static feedthrough current of the multiple-input complimentary logic gate without having a logic collision with a logic circuit in the preceding stage, thereby reducing power consumption. Furthermore, this technique allows stable operation even when the power supply voltage is lowered.

In the present invention, the integrated circuit is preferably a gate array integrated circuit. In the gate array integrated circuit, it is required that various functions, needed by a great number of various users, should be realized in a highly efficient fashion. Therefore, it is required that logic circuits used as building blocks in the gate array integrated circuit can express various logical operations in an efficient manner. From this point of view, the composite pass-transistor logic circuit may advantageously be used in gate array integrated circuits. Furthermore, in the gate array integrated circuit, it is required to express various logical operations using only a fixed number of switching devices of fixed types having fixed dimensions, which have been prepared beforehand in a basic cell. The technique of composite pass-transistor logic circuit can advantageously be employed to meet the above requirement, since various logical operations can be expressed by composite pass-transistor logic circuits having a fixed configuration consisting of a plurality of pass transistor logic trees and a multiple-input logic gate. The above features of the composite pass-transistor logic circuit are useful in both the mask programmable gate array and the FPGA. In particular, if the composite pass transistor logic circuit is used in an FPGA, it is possible to efficiently express complex logical operations in each programmable logic block in a simple manner. In the FPGA, large propagation delays occur along interconnections among basic cells (programmable logic blocks). If complex logical operations can be expressed in the respective programmable logic blocks, then it is possible to reduce the number of interconnections among the programmable logic blocks, and thus it is possible to improve operating speed.

According to another aspect of the present invention, there is provided a method of forming each of the logic circuits in an integrated circuit for executing a plurality of logical operations comprising a plurality of logic circuits each for receiving a plurality of input logic signals and for producing an output logic signal, the method of forming each of the logic circuits comprising the steps of: arranging pass transistors to form at least two pass-transistor logic trees each having at least two input nodes for receiving at least two of the plurality of input logic signals and an intermediate output node for providing an intermediate logic signal, each of the pass-transistor logic trees comprising at least two of the pass transistors; and providing a multiple-input logic gate having at least two intermediate input nodes each for receiving the intermediate logic signal from corresponding one of the at least two pass-transistor logic trees, and an output node for providing the output logic signal produced by a selected one of the plurality of logical operations executed on the plurality of input logic signals.

The step of arranging pass transistors may include the steps of: i) determining the number of pass-transistor logic trees and the number of stages of each of the pass-transistor logic trees taking into account the logical operation to be expressed by the overall composite pass-transistor logic circuit and the logical operations to be expressed by the multiple-input logic gate; ii) selecting as many pass transistors as required to construct the respective pass-transistor logic trees; and iii) constructing the respective pass-transistor logic trees by making interconnections among the pass transistors. The step of providing the multiple-input logic gate may include the steps of: i) determining the type of the multiple-input logic gate (such as NAND, NOR, etc.) and the number of intermediate input nodes thereof so as to express the logical operation of the multiple-input logic gate; and ii) making interconnections in such a manner that the respective intermediate input nodes may receive the corresponding intermediate logic signals produced by the respective pass-transistor logic trees constructed in the step of arranging pass transistors. Thus, a desired composite pass-transistor logic circuit including pass transistor logic trees and a multiple-input gate can be formed according to the above steps. In this logic circuit, the selected one of the plurality of logical operations is performed on the input logic signals, and the result is provided as an output logic signal at the output node of the multiple-input gate.

The specific procedures used to form the logic circuit varies, depending on the specific type of the integrated circuit. In the case of a full-custom integrated circuit, the pass transistors, multiple-input logic gate, and interconnections among them are designed first according to the procedure described above, and mask patterns required to produce the above integrated circuit are designed. Masks are then produced, and the integrated circuit including the above logic circuits is produced using these masks. In the case of a mask programmable gate array, on the other hand, mask patterns are determined which are used to make interconnections to form pass-transistor logic trees and multiple-input logic gate and also interconnections among other elements, wherein the mask patterns are determined according to the above-described procedure in such a manner as to achieve efficient use of switching devices prepared in each cell. Masks having the designed patterns are then produced. Using these masks, interconnections are formed on a semiconductor substrate on which basic cells have already been formed thereby obtaining a mask programmable gate array integrated circuit in which the above logic circuits are formed. In the case of an FPGA, the ON/OFF states of the programmable switches are determined according to the above-described procedure so that the desired logical operation can be expressed taking into account the available pass transistors and multiple-input logic gate formed in each programmable logic block and also taking into account the locations of the programmable switches. The programming is then performed to set the above ON/OFF states of the programmable switches, thereby obtaining an integrated circuit in which the required logic circuits are formed.

In the case of the full-custom integrated circuit, it is possible to freely design the integrated circuit starting with the design of the sizes of individual switching devices used to form pass transistors and their locations or layout. In the case of the mask programmable gate array, on the other hand, a desired logic circuit is formed using switching devices which have already been prepared in basic cells. Therefore, there are some limitations in terms of the number of stages of the pass-transistor logic trees, the kinds of available multiple-input logic gate, and the number of intermediate input nodes thereof. Under these limitations, it is required to form desired logic circuits efficiently using the switching devices. On the other hand, in the case of the field programmable gate array, pass transistors and multiple-input logic gates which have already been prepared in the respective programmable logic blocks are combined or connected by programming the programmable switches disposed at predetermined locations, thereby forming desired logic circuitry. This imposes stricter limitations in terms of the selection or design of the logic circuit than the mask programmable gate array. In some cases, particular pass transistors in each programmable logic block are connected beforehand to reduce the number of programmable switches. Similarly, a particular pass-transistor may be connected beforehand to the multiple-input logic gate. In the case of the composite pass transistor logic circuit in which the particular pass transistor has been connected beforehand to the multiple-input logic gate, the steps of selecting as many as pass transistors as required, making interconnections among these pass transistors, and making interconnections such that the intermediate input nodes of the multiple-input logic gate can receive the intermediate logic signals, included in the above-described steps, can be regarded as being performed during the formation of the programmable logic block.

According to still another aspect of the present invention, there is provided a method of executing each of a plurality of logical operations with an integrated circuit for executing the plurality of logical operations, comprising a plurality of logic circuits each for receiving a plurality of input logic signals and for executing a selected one of the plurality of logical operations, the method comprising the steps of:

providing at least two pass transistor logic trees of the logic circuit, each having at least two input nodes and an intermediate output node, each of the pass transistor logic trees comprising at least two pass transistors;

providing a multiple-input logic gate of the logic circuit, having at least two intermediate input nodes and an output node; inputting at least two of the input logic signals to the at least two input nodes of each of the pass transistor logic trees, such that an intermediate logic signal is provided at the intermediate output node; and inputting each of the intermediate logic signals to corresponding one of the intermediate input nodes of the multiple-input logic gate, such that an output logic signal produced by the selected one of the plurality of logical operations executed on the plurality of input logic signals is provided at the output node.

In this method, a composite pass-transistor logic circuit constructed with a combination of a plurality of pass transistor logic trees and a multiple-input logic gate is first prepared. Input logic signals are applied to each pass transistor logic tree, and specific logical operations are performed on these input logic signals. The resulting signals (intermediate logic signals) are input to the multiple-input logic gate. A desired logical operation is then performed by the multiple-input logic gates and the result is provided at its output node. Various logical operations are executed in the above-described manner and these logical operations are combined in such a manner as to realize a specific function required by a user in a specific application. Thus it is possible to obtain an integrated circuit which can provide a desired function to a user.

According to a further aspect of the present invention, there is provided a programmable logic block for use in a field programmable gate array, the programmable logic block comprising:

a plurality of signal input terminals for receiving input logic signals;

at least two pair pass-transistor elements each having two input terminals, an output terminal and a control terminal;

a multiple-input logic gate having at least two intermediate input nodes and an output node; and programmable interconnections for programmable arranging the pair pass-transistor elements and the multiple-input logic gate, wherein the programmable interconnections include at least two input signal interconnections each for connecting the control terminal of one of the pair pass-transistor elements to at least one of the signal input terminals.

The programmable interconnections include interconnection elements and programmable switches for programmably setting the connection/disconnection between interconnection elements. With the programmable interconnections, it is possible to make interconnections in a programmable fashion between the circuit elements in the programmable logic block. The interconnection which can be made with the programmable interconnections may include the interconnections between the signal input terminals and the pair pass-transistor elements, between a pair pass-transistor element and another pair pass-transistor element, and between the pair pass transistor elements and the multiple-input logic gate. This provides specific means to program the programmable logic block to form a logic circuit in which a desired logical operation is expressed. Preferably, the programmable switches may be anti-fuses. However, the programmable switches of the present invention are not limited to anti-fuses. Other types of switches such as fuses or pass transistors controlled by data stored in SRAM, EEPROM, flash EEPROM or other memories, may also be employed.

Each of the pair pass-transistor elements preferably comprises a first and a second pass-transistor each having an input terminal connected to corresponding one of the input terminals of the pair pass-transistor element, an output terminal connected to the output terminal of the pair pass-transistor element, and a control terminal, the control terminal of the first pass transistor connected to the control terminal of the pair pass-transistor element. Preferably, each of the pair of pass-transistor elements further comprises an inverter having an input and an output terminal, wherein the input terminal of the inverter is connected to the control terminal of the pair pass-transistor element and the output terminal of the inverter is connected to the control terminal of the second pass transistor.

In practical pass-transistor logic trees, two pass transistors whose output terminal are coupled are frequently used. Therefore, if pair pass-transistor elements each including two pass transistors whose output terminals are coupled are prepared in the programmable logic block, then it becomes possible to reduce the number of programmable switches. This allows a reduction in the size of the programmable logic block and thus the chip size of the FPGA. Furthermore, the reduction in the number of programmable switches in the logic circuit leads to an improvement in the operating speed of the logic circuit. In many cases, the control terminals of the two pass transistors receive logic signals which are complementary to each other. Therefore, if an inverter is provided such that a complementary signal is produced by the inverter, then it is possible to further reduce the number of programmable switches. This allows a further reduction in the chip size and an improvement in operating speed.

The above arrangement makes it possible to easily create, in a programmable logic block, a composite pass-transistor logic circuit including a plurality of pass-transistor logic trees and a multiple-input logic gate.

Furthermore, a specific function required by a user can be realized in a programmable gate array by forming logic circuits for expressing various logical operations in the respective programmable logic blocks, and further making interconnections among these programmable logic blocks. Since each composite pass-transistor logic circuit can express a complex logical operation, the number of programmable logic blocks used in the programmable gate array can be minimized. In other words, a more complex function can be realized on an FPGA including the same number of programmable logic blocks. An FPGA generally includes a great number of programmable switches in the paths of programmable interconnections among programmable logic blocks. Since these programmable switches have a large series resistance and a large parallel capacitance, the interconnections among the blocks can cause great signal delays. To minimize such signal delays due to the programmable interconnections among programmable logic blocks, it is desirable that complex logical operations be expressed in the logic circuits formed in the respective programmable logic blocks thereby minimizing the number of programmable logic blocks. This allows an improvement in the overall operating speed of the FPGA. As described above, the FPGA including the programmable logic blocks according to the present invention has the advantage that complex logical operations can be expressed in programmable logic blocks using composite pass transistor logic circuits and thus the number of required logic blocks can be minimized and high operating speed can be achieved.

Furthermore, each of the first and second pass transistors in each of the pair pass-transistor elements preferably comprises a switching device having a first conduction type and a first driving capacity, and having an input terminal connected to the input terminal of the pass transistor, an output terminal connected to the output terminal of the pass transistor and a control terminal connected to the control terminal of the pass transistor; each of the first and the second pass transistors further comprises auxiliary switching device, each having a second conduction type and a second driving capacity which is less than the first driving capacity; and each of the auxiliary switching devices having an input terminal connected to the input terminal of the corresponding switching device, an output terminal connected to the output terminal of the corresponding switching device, and a control terminal for receiving a complement logic signal of a logic signal received by the control terminal of the corresponding switching device. The switching device is preferably an N channel MOS transistor, and the auxiliary switching device is preferably a P channel MOS transistor having a smaller W/L ratio than that of the N channel MOS transistor.

The details of the technique of constructing a pass transistor in the form of a combination of a switching device having a first conduction type and an auxiliary switching device having a second conduction type and having a second driving capacity less than the first driving capacity have been disclosed in the co-pending patent application Ser. No. 08/716,883. This technique prevents reduction in the logical amplitude of a logic signal, which may otherwise occur when the signal is transmitted through a pass-transistor logic tree. In particular, this technique is useful in a composite pass-transistor logic circuit of the type in which a plurality of pass-transistor logic trees are combined with a multiple-input complimentary logic gate, since the static feedthrough current of the multiple-input complimentary logic gate is suppressed without having a logical collision with a logic circuit in the preceding stage thereby reducing the power consumption. Furthermore, this technique allows stable operation even when the power supply voltage is lowered.

The multiple-input logic gate is preferably a multiple-input complementary logic gate; and the programmable logic block further comprises a suppressor of a static feedthrough current of the multiple-input complementary logic gate. Furthermore, the suppressor of static feedthrough current preferably comprises means for restoring potentials of all the intermediate input nodes of the multiple-input complementary logic gate in response to the potential of the output node of the multiple-input complementary logic gate. As disclosed in the co-pending patent application Ser. No. 08/716,883, the suppressor of static feedthrough current of this form allows a reduction in probability of occurrence of logical collision with a logic circuit in the preceding stage, and a reduction in power consumption.

Preferably, programmable logic blocks of the present invention further comprise an inverter, wherein said programmable interconnections include at least two programmable switches each for programmably connecting one of the input terminals of one of the pair pass-transistor elements to one of the signal input terminals via one inverter. It is often required that some of the input logic signals be input to pass-transistor logic trees after being inverted. It is also often required that the input logic signal be received in complementary form. That is, both an input logic signal and an inverted input logic signal are required. To meet the above requirements, it is desirable that inverters for producing inverted signals be provided in each programmable logic block.

Preferably, the multiple-input logic gate comprises a third intermediate input node in addition to the at least two intermediate input nodes; and the programmable interconnections include at least one programmable switch for programmably connecting the third intermediate input node to at least one of the signal input terminals. Thus, the present invention is not limited to the configuration in which all the intermediate input nodes of the multiple-input logic gate receive the intermediate logic signals produced by the pass transistor logic trees, but some intermediate input node may receive an input logic signal. This allows the composite pass-transistor logic circuit to express a wider variety of logical operations in a more flexible fashion. It should be understood that the programmable switch can "programmably connect" the third intermediate input node to at least one of the signal input terminals either in a direct fashion or in an indirect fashion, such that the input logic signal is received after being inverted by an inverter.

The programmable interconnections preferably include at least two fixed interconnections each for connecting the output terminal of one of the pair pass-transistor elements to corresponding one of the intermediate input nodes of the multiple-input logic gates. Herein the "fixed interconnection" refers to a direct interconnection using no programmable switch. In simplest form, a composite pass transistor logic circuit includes two single-stage pass transistor logic trees and a dual-input logic gate. The composite pass transistor logic having such configuration can be constructed using two pair pass-transistor elements. Therefore, if two pair pass-transistor elements connected to corresponding intermediate input nodes of the multiple-input logic gate via fixed interconnections are prepared beforehand, it is possible to construct a logic circuit in the simplest form without having to use a programmable switch to connect an intermediate output node to an intermediate input node. This allows a reduction in the number of programmable switches present in the signal transmission paths in the logic circuit, and thus the logic circuit can operate at a higher speed.

Preferably, the at least two pair of pass-transistor elements include a third pair pass-transistor element in addition to the pair of pass-transistor elements connected by the fixed interconnections; and said programmable interconnections include at least one programmable switch for programmably connecting the output terminal of the third pair pass-transistor element to at least one of the input terminals of the pair pass-transistor elements connected by the fixed interconnections. This makes it possible to construct a dual-stage pass-transistor logic tree as required.

Still preferably, said multiple-input logic gate comprises a third intermediate input node in addition to the intermediate input nodes connected by the fixed interconnections; and the programmable interconnections further include a second programmable switch for programmably connecting the output terminal of the third pair pass transistor logic element to the third intermediate input node of the multiple-input logic gate. This makes it possible to construct a logic circuit including three pass-transistor logic trees as required.

Still preferably, the programmable logic block of the present invention further comprises a second multiple-input logic gate having at least two intermediate input nodes and an output node; wherein the at least two pair pass-transistor elements comprises a first group of pair pass-transistor elements and a second group of pair pass-transistor elements each including at least two of the pair pass-transistor elements;

the programmable interconnections include a first plurality of programmable switches each for programmably connecting the output terminal of one of the pair pass-transistor elements in the second group to corresponding one of the intermediate input nodes of the second multiple-input logic gate; and said programmable interconnections further include a second plurality of programmable switches each for programmably connecting the output terminal of one of the pair of pass-transistor elements in the second group to corresponding of the input terminals of the pair of pass transistor elements in the first group.

This makes it possible to flexibly construct, as required, a second composite pass-transistor logic circuit in the form of a combination of pair pass-transistor elements of the second group and a second multiple-input logic gate, and a composite pass-transistor logic circuit including a dual-stage pass-transistor logic tree in the form of a combination of a pair of pass-transistor elements of the second group and a pair of pass-transistor element, of the first group.

To make it possible to form a pass-transistor logic tree having a full dual-stage configuration, when the first group of the pair of pass-transistor elements include n pair pass-transistor elements, where n is an integer greater than one, it is preferable that the second group of the pair of pass-transistor elements includes 2n pair of pass-transistor elements.

In a preferred embodiment of the FPGA according to the present invention, the at least two pair of pass-transistor elements comprises a first group of pair pass transistor elements including two of the pair pass-transistor elements and a second group of pair pass-transistor elements including four of the pair pass-transistor elements; and said programmable interconnections include a plurality of programmable switches each for programmably connecting the output terminal of each of the pair pass-transistor elements in the second group to corresponding one of the input terminals of the pair pass-transistor elements in the first group. This makes it possible to flexibly form a wide variety of composite pass-transistor logic circuits ranging from a composite pass transistor logic circuit including two single-stage pass-transistor logic trees in which all pair pass-transistors are of the first group, to a composite pass-transistor logic circuit including two full dual-stage pass transistor logic trees containing pair pass-transistor elements of both the first and second groups.

In another preferred embodiment of the FPGA according to the present invention, the multiple-input logic gate has a first driving capacity; and each of the programmable logic blocks further comprises a driver having a second driving capacity greater than the first driving capacity. In FPGAs, the programmable interconnections among programmable logic blocks generally have a large parallel capacitance. As a result, a high driving capacity is required to drive such interconnections. Use of the driver having a greater driving capacity than that of the multiple-input logic gate makes it possible to drive the programmable interconnection between programmable logic blocks without having to increase the size of switching devices forming the multiple-input logic gate. As a result, the total size of the programmable logic block and thus the chip size of the FPGA can be reduced. Preferably, a CMOS inverter may be employed as the driver for the above purpose.

In still another aspect of the present invention; there is provided a method of programming a programmable logic block for use in a field programmable gate array, the field programmable gate array comprising:

a plurality of signal input terminals for receiving input logic signals;

at least two pair pass transistor elements each having two input terminals, an output terminal and a control terminal;

a multiple-input logic gate having at least two intermediate input nodes and an output node; and programmable interconnections for programmably arranging the pair of pass transistor elements and the multiple-input logic gate, the method of programming the programmable logic block comprising the steps of:

arranging the pair of pass-transistor elements to form at least two pass-transistor logic trees, such that each of the pass-transistor logic trees comprises at least one of the pair of pass-transistor elements and has at least two input nodes, and such that the output terminal of one of the at least one pair of pass-transistor elements in each of the pass-transistor logic trees acts as an intermediate output node;

connecting the at least two input nodes of each pass transistor logic tree to corresponding ones of the signal input terminals such that, when the input logic signals are received by the plurality of signal input terminals, each of the pass transistor logic trees receives at least two of the input logic signals and provides an intermediate logic signal through the intermediate output node to corresponding one of the intermediate input nodes of the multiple-input logic gate.

The step of arranging the pair of pass transistor elements may include the steps of: i) determining the number of pass-transistor logic trees and the number of stages of each of the pass-transistor logic tree taking into account the logical operation to be expressed by the overall composite pass-transistor logic circuit and the logical operation to be expressed by the multiple-input logic gate; ii) selecting as many pair pass-transistor elements as required to construct the above pass-transistor logic trees; and iii) programming the programmable interconnections so as to make interconnections among the selected pair pass-transistor elements thereby forming the required number of pass-transistor logic trees, each having the required number of stages. In the case where only single-stage pass-transistor logic trees are formed, there is no need to make interconnections among pair pass-transistor elements.

Said step of connecting the at least two input nodes may include the step of: i) selecting the input nodes for receiving input logic signals, from the input nodes of the respective pass transistor logic trees which have been formed in the step of arranging; and ii) programming the programmable interconnections so that the selected input nodes are connected to the corresponding signal input terminals. The input nodes may be connected to the corresponding signal input terminals either in a direct fashion, or in an indirect fashion via an inverter so that the input logic signal is input after being inverted. Thus, according to the present method, the programmable logic block is programmed such that when input logic signals are input to signal input terminals, the input nodes of the respective pass transistor logic trees correctly receive the corresponding input logic signals, and the respective pass transistor logic trees perform the assigned logical operations on the received input logic signals and provide the results at the respective intermediate output nodes as intermediate logic signals which are applied to the corresponding intermediate input nodes of the multiple-input logic gate which in turn provides, at its output node, the output logic signal representing the overall result of the logical operation assigned to the composite pass transistor logic circuit formed in the programmable logic block.

In the case where a particular input node is connected beforehand to a corresponding signal input terminal via a fixed interconnection, there is no need to program the programmable interconnection for that signal path.

BRIEF DESCRIPTION OF THE DRAWINGS

FIGS. 1 and 2 are circuit diagrams of conventional pass transistor logic circuit cells;

DESCRIPTION OF PREFERRED EMBODIMENTS

Referring to specific embodiments, the present invention will be described in further detail below in conjunction with the accompanying drawings.

Figure 7:
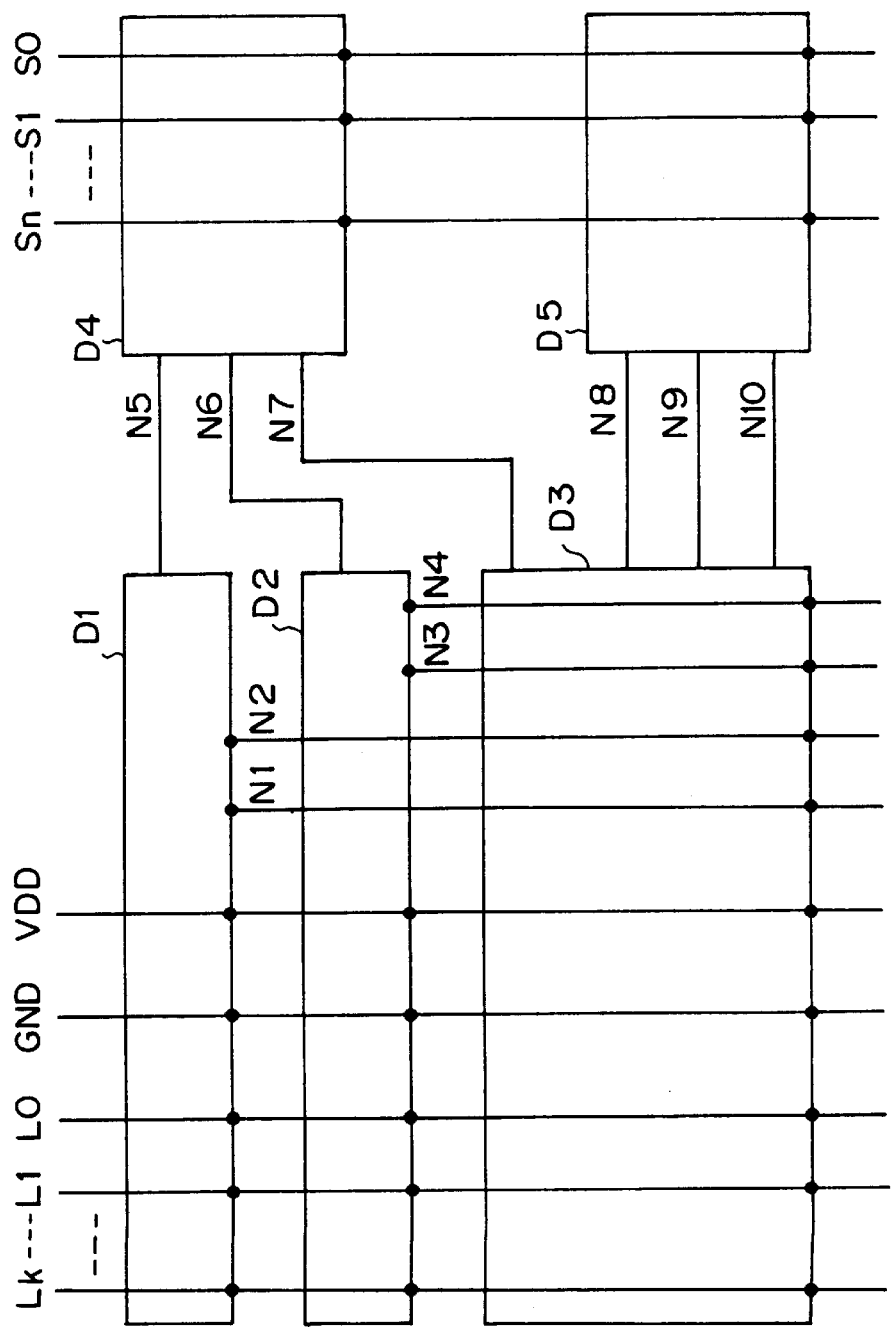
FIG. 7 is a block diagram of a programmable logic block for use in an FPGA according to the present invention.

FIG. 7 is a block diagram illustrating the construction of a programmable logic block for use in a field programmable gate array according to a first embodiment of the present invention.

As shown in FIG. 7, the programmable logic block of the present embodiment includes sub-logic blocks D1–D5. The interconnections among these sub-logic blocks in the programmable logic block are realized by interconnection elements N1–N10. The details of the sub-logic blocks D1–D5 are shown in FIGS. 8–12, respectively. The sub-logic block D1 is connected to the sub-logic block D3 via the interconnection elements N1 and N2. Similarly, the sub-logic block D2 is connected to the sub-logic block D3 via the interconnection elements N3 and N4. The sub-logic blocks D1, D2, and D3 are connected to the sub-logic block D4 via the interconnection elements N5, N6, and N7, respectively. The sub-logic block D3 is also connected to the sub-logic block D5 via the interconnection elements N8–N10.

The sub-logic blocks D1, D2, and D3 are also connected to external interconnection elements L0-Lk. These external interconnection elements L0-Lk, together with programmable switches and other external interconnection elements (not shown), form programmable interconnections among programmable logic blocks. The programmable interconnections among programmable logic blocks are used to realize connections between the logic circuit formed in one programmable logic block and the logic circuits formed in other programmable logic blocks. The programmable interconnections among programmable logic blocks are also used to connect the logic circuit in a programmable logic block to I/O circuits. The sub-logic blocks D4 and D5 are connected to external interconnection elements S0-Sn. These external interconnection elements S0-Sn, together with programmable switches and other external interconnection elements (not shown), also form programmable interconnections among programmable logic blocks. Elements which can transmit signals in both directions may be employed as the external interconnection elements. The sub-logic blocks D1–D5 are also connected to power supply means for supplying a power supply potential (VDD) and power supply means for supplying a ground potential (GND) via VDD interconnection elements and GND interconnection elements, respectively. The solid lines shown in FIGS. 8–12 denote the above-described external interconnection elements L0-Lk and S0-Sn and the interconnection elements within the programmable logic blocks.

Figure 8:
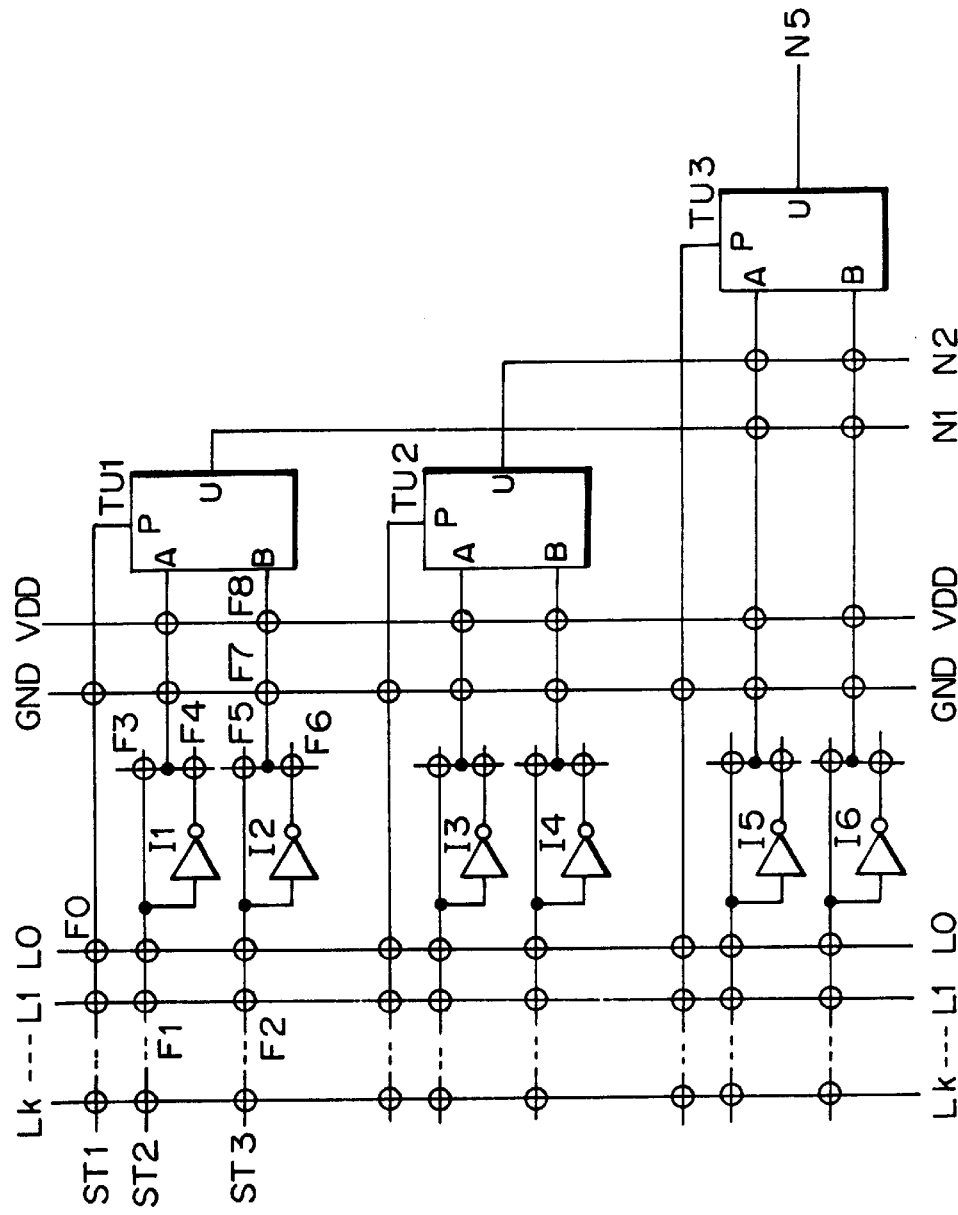
FIGS. 8, 9, 10, 11, and 12 are circuit diagrams of sub-logic blocks D1, D2, D3, D4, and D5, respectively, in the programmable logic block shown in FIG. 7.
Figure 9:
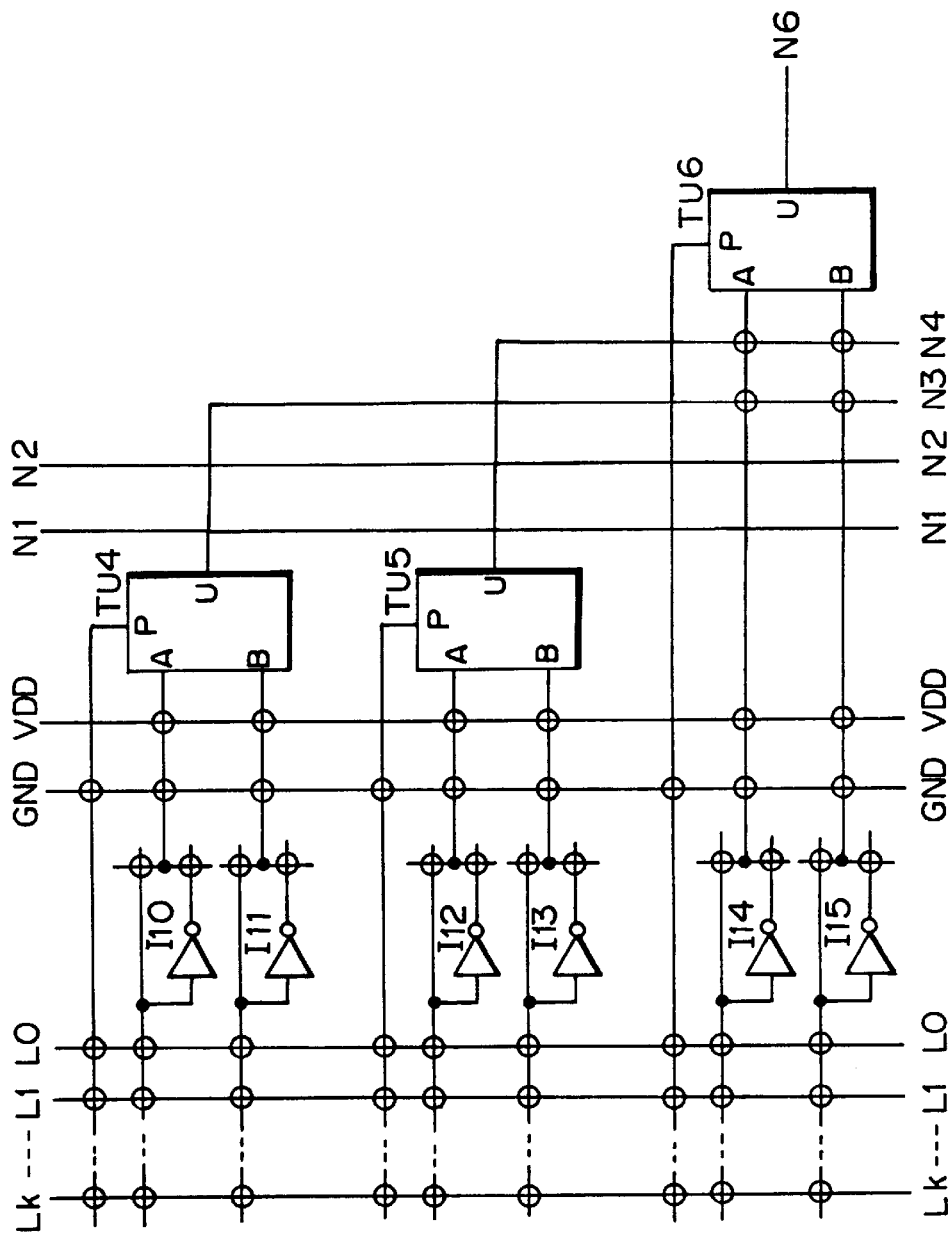
Figure 10:
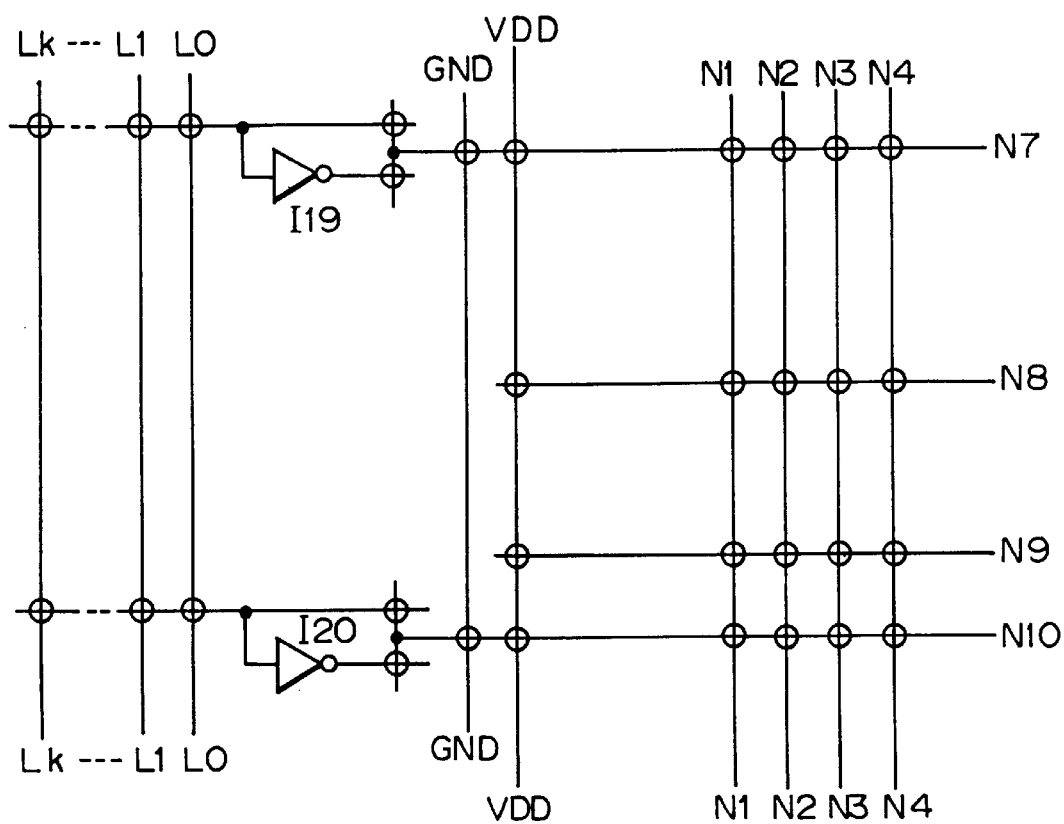

As shown in FIG. 8 and FIG. 9, both the sub-logic blocks D1 and D2 include similar circuit elements. More specifically, the sub-logic block DI includes six inverters I1–I6 and three pair pass-transistor elements TU1–TU3. Similarly, the sub-logic block D2 includes six inverters I10–I15 and three pair pass-transistor elements TU4–TU6. Therefore, in the present embodiment, the programmable logic block includes six pair pass-transistor elements TU1–TU6 in total.

Figure 13:
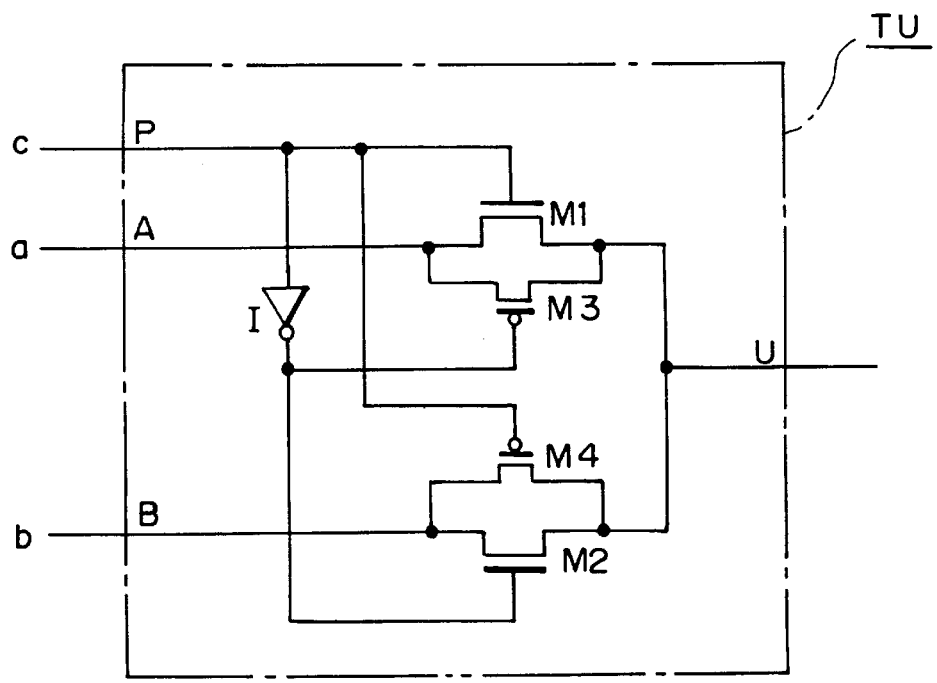
FIG. 13 is a circuit diagram of a pair pass-transistor element used in a composite pass-transistor logic circuit according to the present invention.

The pair pass-transistor elements TU1–TU6 of the present embodiment each has the circuit structure shown in FIG. 13. Each pair pass-transistor element includes: a first unit pass transistor including an N channel MOS transistor M1 and a P channel MOS transistor M3; a second unit pass transistor including an N channel MOS transistor M2 and a P channel MOS transistor M4; and an inverter I. Each unit pass transistor includes an N channel MOS transistor and a P channel MOS transistor wherein their source/drain terminals are coupled such that the two transistors are connected in parallel. In each unit pass transistor, the N channel MOS transistor serves as a switching device of a pass transistor, wherein the source, drain, and gate of the N channel MOS transistor serve as the input, output, and control terminals of the pass transistor. On the other hand, the P channel MOS transistor serves as an auxiliary switching device for restoring the reduced logical amplitude which occurs when the pass transistor is constructed with only an N channel MOS transistor. The P channel MOS transistors have dimensions (W/L ratios) smaller than those of the N channel MOS transistors. For example, the dimensions of the P channel MOS transistors are ½ to 1/10 times those of the N channel MOS transistors, and more preferably ¼ or less times those of the N channel MOS transistors. The input terminals of the two unit pass transistors form two input terminals A and B, respectively, of the pair pass transistor element. The output terminals of the two unit pass transistors are coupled together, and form an output terminal U of the pair pass-transistor element. The control terminal of the first unit pass transistor forms a control terminal P of the pair pass-transistor element.

The gate of the N channel MOS transistor M2 serves as the control terminal of the second unit pass transistor, and is connected to the control terminal of the pair pass-transistor element via an inverter I. Therefore, the control terminal of the second pass transistor receives a signal complementary to the signal received by the control terminal of the first pass transistor. Furthermore, the gate of the P channel MOS transistor of the first unit pass transistor is connected to the control terminal of the second unit pass transistor, and the gate of the P channel MOS transistor of the second unit pass transistor is connected to the control terminal of the first unit pass transistor. As a result, the gate of the P channel MOS transistor of each unit pass transistor receives a signal complementary to the signal received by the gate of the N channel MOS transistor in the same unit pass transistor. In the above configuration, both the P channel MOS transistor and the N channel MOS transistor of each unit pass transistor simultaneously turn ON and OFF. The pair pass-transistor element performs the operation represented by the equation shown below on received logic signals a, b and c, and provides the resulting logic signal U.

$$U = a \cdot c + b \cdot \bar{c} \qquad (1)$$

In the above logical expression, "·" denotes logical AND, "+" denotes logical OR, and the overline (the bar over a variable name) denotes logical NOT.

Figure 11:
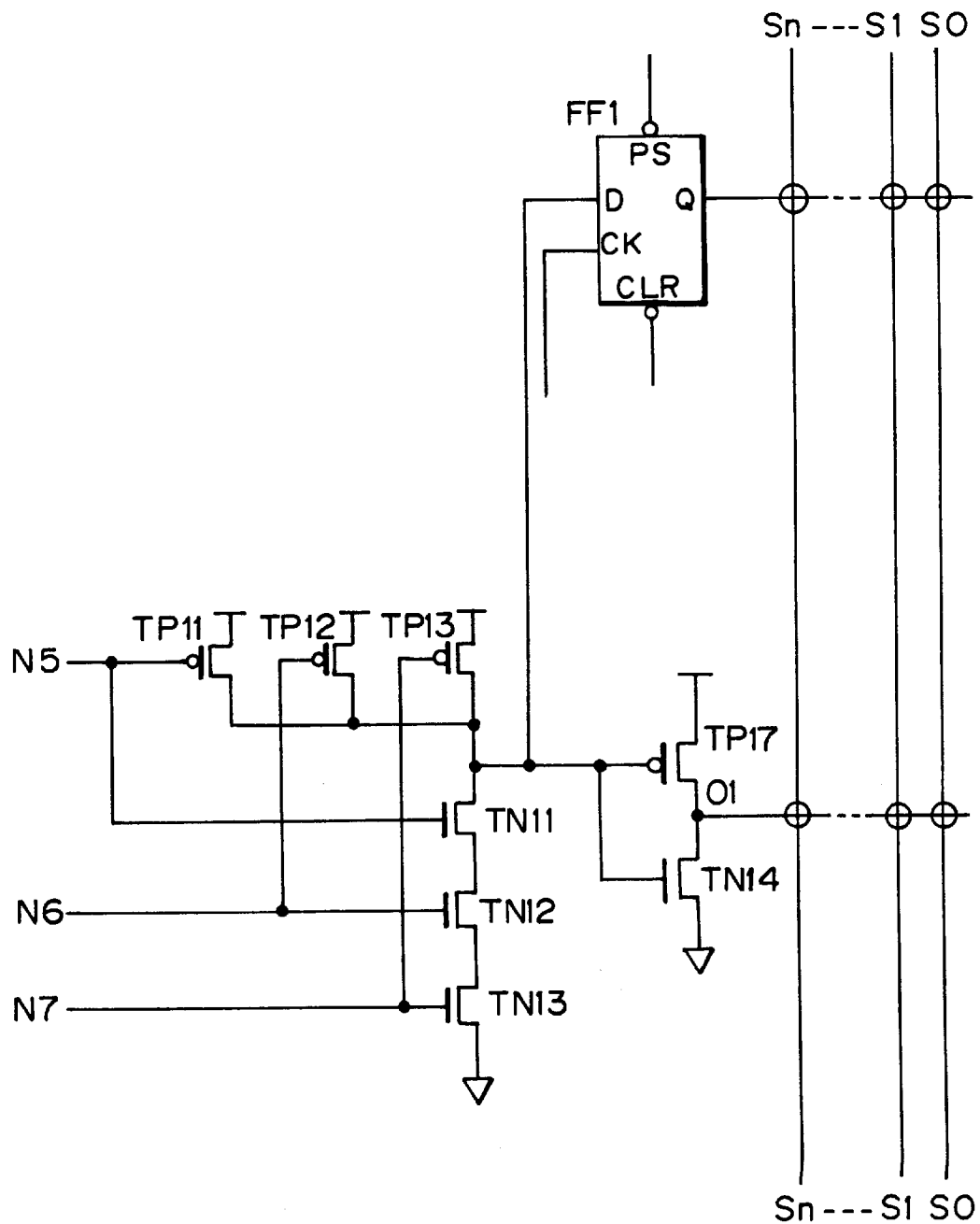
Figure 12:
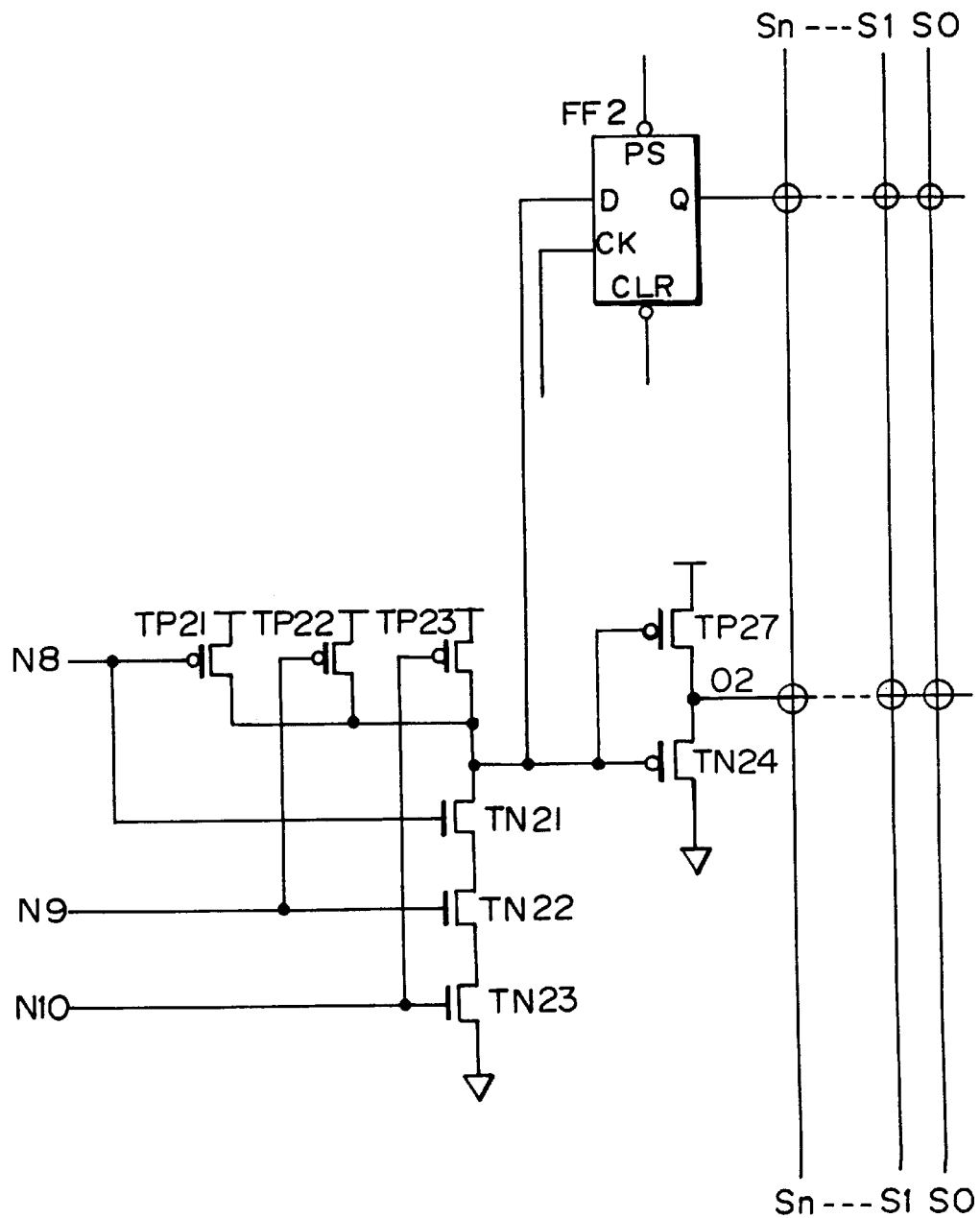
Figure 14:
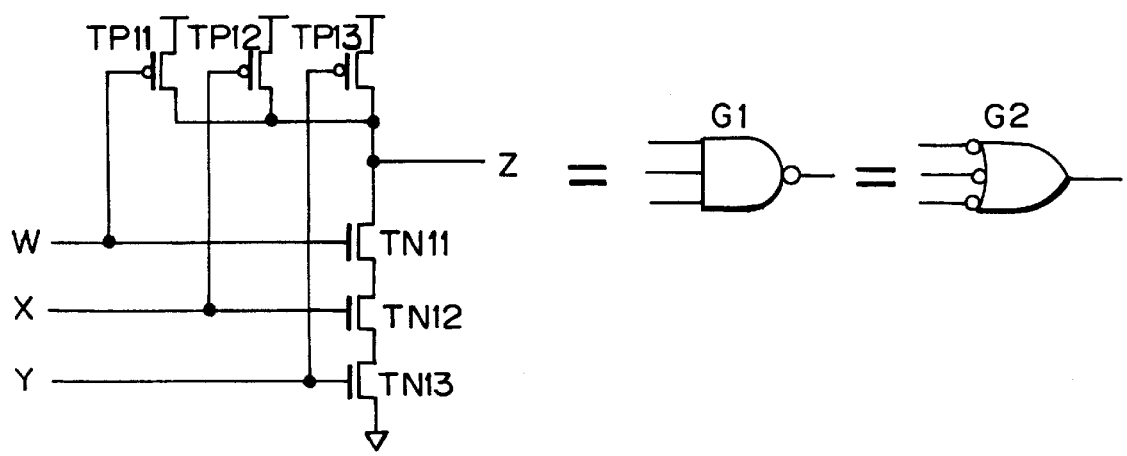
FIG. 14 illustrate schematic symbols of a triple-input CMOS NAND gate in the sub-logic block shown in FIG. 11.

The sub-logic block D4 includes, as shown in FIG. 11, a triple-input CMOS NAND gate constructed with N channel MOS transistors TN11, TN12, and TN13, and P channel MOS transistors TP11, TP12, and TP13. This triple-input NAND gate is also shown in FIG. 14. This logic gate performs the operation represented by $Z = \overline{W \cdot X \cdot Y}$. This logic gate is also denoted by either a schematic symbol G1 or G2. Similarly, as shown in FIG. 12, the sub-logic block D5 also includes a triple-input CMOS NAND gate constructed with N channel MOS transistors TN21, TN22, and TN23, and P channel MOS transistors TP21, TP22, and TP23.

In FIGS. 8, 9, and also in the succeeding figures, open circles at intersections between interconnections denote anti-fuses serving as the programmable switches. These anti-fuses are initially in OFF-states and the interconnections are electrically isolated from each other at the intersections. If a voltage greater than a predetermined value is applied between the interconnections, the anti-fuses at the corresponding intersections are programmed into ON states. The programmable interconnections are formed with these programmable switches and the interconnection elements. A user of the FPGA of the present invention can set the connection and disconnection among interconnection elements by programming the proper switches, thereby realizing a desired logical operation in the logic circuit.

The sub-logic blocks D1 and D2 shown in FIGS. 8 and 9 each include nine interconnection elements each extending transversely across the external interconnection elements L0-Lk. Programmable switches are disposed at the respective intersections between these interconnection elements and the external interconnection elements, wherein the programmable switches selected from those are programmed into ON states so that the input logic signals transmitted via the selected external interconnection elements are input into the programmable logic block. Thus, the nine interconnection elements of each sub-logic block serve as signal input terminals of the programmable logic block. Similarly, the sub-logic block D3 shown in FIG. 10 also has two interconnection elements which serve as signal input terminals. On the other hand, in FIGS. 11 and 12, the two interconnection elements each extending transversely across the external interconnection elements S0-Sn serve as signal output terminals of the programmable logic block.

The procedure of forming various composite pass transistor logic circuits in a programmable logic block by programming the programmable interconnections will be described.

First, the logical operation to be expressed by the pass-transistor logic circuit is determined taking into account the logical operation to be expressed by the composite pass-transistor logic circuit, and also taking into account the logical operation which can be performed by the multiple-input logic gate. The number of pass-transistor logic trees and the number of stages of each of the pass-transistor logic tree are then determined. After that, as many as pair pass-transistor elements as required are selected, and the interconnections among the selected pair pass transistor elements are determined to form the required number of pass-transistor logic trees each having the required number of stages.

Figure 15:
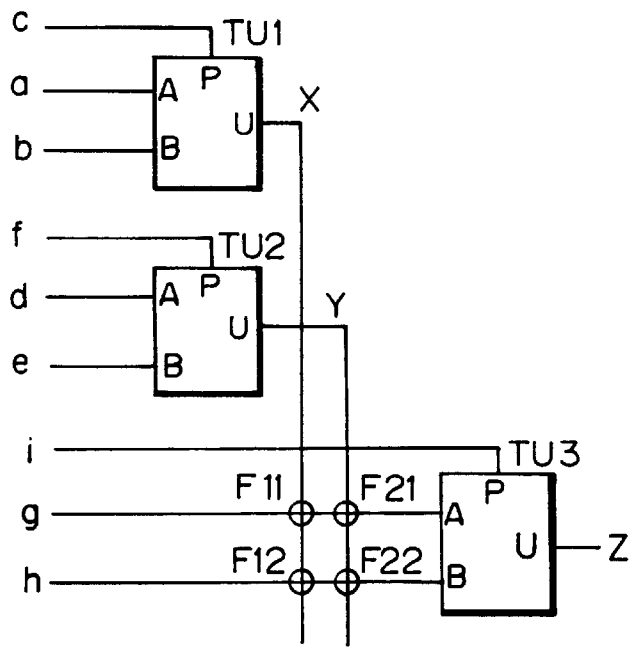
FIG. 15 is a circuit diagram illustrating the programmable interconnections extending among pair pass-transistor elements in the sub-logic block shown in FIG. 8.

FIG. 15 is a circuit diagram illustrating the three pair pass-transistor elements in the sub-logic block D1 shown in FIG. 8 and also illustrating the programmable interconnections extending among these pair pass-transistor elements. The sub-logic block D1 includes three pair pass-transistor elements TU1–TU3 and anti-fuses F11, F12, F21, and F22. The sub-logic block D2 also includes pair pass-transistor elements and anti-fuses which are the same in number and structure as those of the sub-logic block D1.

The three pair pass-transistor elements in the sub-logic block D1 are classified into two groups. The first group includes a pair pass-transistor element TU3 which is used to form a final stage in a pass-transistor logic tree. The second group includes a pair pass-transistor elements TU1 and TU2 which are used to form a preceding stage of the pass-transistor logic tree.

If all the anti-fuses F11, F21, F12, F22 are programmed into OFF-state, the resultant pass-transistor logic tree includes only the pair pass-transistor element TU3. That is, the control terminal P and the input terminals A and B of the pair pass-transistor element TU3 serve as three input nodes of the above resultant pass-transistor logic tree, and thus the pass-transistor logic tree can receive three logic signals g, h, and i. On the other hand, the output terminal U of TU3 serves as the intermediate output node of the pass-transistor logic tree.

In the case where both the anti-fuses F11 and F22 are programmed into an ON state, the output terminal of the pair pass-transistor element TU1 is connected to the input terminal A of the pair pass-transistor element TU3, and the output terminal of the pair pass-transistor element TU2 is connected to the other input terminal B of the pair pass-transistor TU3. As a result, the pass-transistor logic tree has a full dual-stage configuration constructed with all the three pair pass-transistor elements TU1, TU2, and TU3. In this case, the control terminals of TU1, TU2, and TU3 and the two input terminals of each of TU1 and TU2 serve as the input nodes of the resultant pass-transistor logic tree, and thus the pass-transistor logic tree can receive seven logic signals. On the other hand, the output terminal of TU3 serves as the intermediate output node of the pass-transistor logic tree, at which an intermediate logic signal Z represented by the logical expression (2) shown below is provided. If both the anti-fuses F12 and F21 are programmed into ON state, the resultant pass-transistor logic tree provides an intermediate logic signal similar to that obtained in the previous case, although there are differences in the name of the input signals.

$$Z = i \cdot (a \cdot c + b \cdot \bar{c}) + \bar{i} \cdot (d \cdot f + e \cdot \bar{f}) = a \cdot c \cdot i + b \cdot \bar{c} \cdot i + d \cdot f \cdot \bar{i} + e \cdot \bar{f} \cdot \bar{i} \quad (2)$$

If only one anti-fuse, for example F22, is programmed into ON state, the resultant pass-transistor logic tree has a dual-stage/single-stage composite configuration constructed with the pair pass-transistor elements TU2 and TU3. In this case, the pass-transistor logic tree has five input nodes, and performs the logical operation represented by the logical expression (3) shown below on the logic signals received at these input nodes.

$$Z = h \cdot i + \bar{i} \cdot (d \cdot f + e \cdot \bar{f}) = h \cdot i + d \cdot f \cdot \bar{i} + e \cdot \bar{f} \cdot \bar{i} \quad (3)$$

As described above, it is possible to flexibly form a single-stage or dual-stage pass transistor logic tree in the sub-logic block shown in FIG. 15.

In the specific example shown in FIG. 15, four anti-fuses are provided in the sub-logic block and thus the output terminal of each pair pass-transistor element of the second group may be connected to any of two input terminals of the pair pass-transistor element of the first group. However, in the present invention, it is not necessary to provide such a large number of programmable switches in a programmable logic block. For example, a programmable logic block may include only two anti-fuses F11 and F22. Even in this case, a single-stage or dual-stage pass-transistor logic tree can be configured by programming via these anti-fuses.

After the above procedure, the input nodes of the configured pass-transistor logic tree are connected to desired signal input terminals for receiving desired input logic signals. For example, the control terminal P and the input terminals A and B of TU1 may be used as the input nodes of the pass-transistor logic tree as follows. First referring to FIG. 8, the anti-fuses F0, F1, and F2 are programmed into ON state. As a result, it becomes possible for the signal input terminal ST1 to receive an input logic signal transmitted via the external interconnection element L0, and it also becomes possible for the signal input terminals ST2 and ST3 to receive an input logic signal transmitted via the external interconnection element L1. As shown in FIG. 8, the control terminal P of TU1 is directly connected to the signal input terminal ST1 via an interconnection element without passing through any programmable switch. Thus, as a result of the above programming, the control terminal P can receive the input logic signal transmitted via the external interconnection element L0. Hereinafter, such interconnection which includes only an interconnection element and includes no programmable switch will be referred to as an "fixed interconnection".

In addition to the above programming, if the anti-fuse F3 is programmed into ON state, then the input terminal A can receive an input logic signal transmitted via the external interconnection element L1. Furthermore, if the anti-fuse F6 is programmed into ON state, then the input terminal B can receive, after being inverted by the inverter I2, the input logic signal transmitted via the external interconnection element L1. In this case, the input terminals A and B receive logic signals which are complementary.

In many applications, logic signals which are complementary are required to be input to a pass transistor logic tree, as in the above example. To meet the above requirement, it is desirable that there be provided inverters for inverting input logic signals and also programmable switches which may be programmed to connect the control terminals and the input terminals of pair pass-transistor elements to signal input terminals via the above inverter.

Alternatively, the programmable logic block, including the logic circuit which produces the above input logic signal, may produce two complementary signals and transmit them via programmable interconnections among programmable logic blocks. However, in this case, the complementary signals occupy two lines of external interconnection elements. Therefore, instead of employing such method, it is more desirable that the programmable logic block have inverters as well as programmable switches, so that either a normal or inverted logic signal may be selected.

However, it is not necessary that an inverter be available for all input logic signals. For example, in the case of the sub-logic block D1 shown in FIG. 8, no inverter is available for inverting the signal applied to the control terminal P of TU1. In this case, if the programming is performed in such a manner that F4 and F5, instead of F3 and F6, are switched into ON state so that the input logic signal is directly input to the input terminal B and the inverted signal is input to the input terminal A, then the logical operation becomes equivalent to that obtained when the inverted signal is applied to the control terminal P. Alternatively, inverters and programmable switches may be provided such that the control terminal of each pair pass-transistor element can be connected to a signal input terminal either directly or via an inverter, and an inverter may be provided for only either one of input terminals of each pair pass-transistor element. In this case, it is desirable that the other input terminal which cannot use an inverter be connected directly to an signal input terminal without passing through an anti-fuse.

In the present invention, all input nodes of a pass-transistor logic tree are not required to be connected to signal input terminals. In the simplest case, two input logic signals may be input to two input nodes of a pass-transistor logic tree wherein one of the nodes is formed by the control terminal of a pair pass-transistor element of the pass-transistor logic tree and the other node is formed by one of the input terminals of the same pair pass-transistor element. In this case, the resultant pass-transistor logic tree performs an logical operation including a product term containing the two input logic signals. The other input nodes which are not used to receive input logic signals may receive logic signals fixed at either HIGH or LOW logic level. For example, in the sub-logic block D1, if the anti-fuse F7 instead of the anti-fuse F6 is switched into ON state, the input node B receives a logic signal fixed at GND potential or LOW logic level. Instead, if the anti-fuse F8 is switched into ON state, the input node B receives a logic signal fixed at VDD potential or HIGH logic level.

In the programmable logic block shown in FIGS. 8 and 9, programmable interconnections are provided such that the control terminal and the input terminals of each pair pass-transistor element may each receive an input logic signal via a corresponding signal input terminal. However, the present invention is not limited to that. For example, programmable interconnections may also be provided such that the control terminal and the input terminals of each pair transistor element may each be connected to any of a plurality of signal input terminals.

As described above, a desired number of pass transistor logic trees with a desired number of stages are formed first, and then the programmable switches are programmed so that desired input logic signals are input to the respective input nodes of the pass-transistor logic trees. Furthermore, a multiple-input logic gate is selected which will be combined with the above pass-transistor logic trees to form a composite pass-transistor logic circuit. The intermediate output terminals of the respective pass-transistor logic trees are then connected to the corresponding intermediate input nodes of the multiple-input logic gate. In the composite pass-transistor logic circuit formed in the above procedure, the intermediate logic signals produced by the respective pass-transistor logic trees are applied to the corresponding input nodes of the multiple-input logic gate, and the multiple-input logic gate produces an output logic signal as a function of the received intermediate logic signals. That is, the composite pass-transistor logic circuit as a whole performs the logical operation defined by the above connecting procedure on the input logic signals received by the pass-transistor logic trees, and provides the result as an output logic signal at the output node of the multiple-input logic gate.

Figure 16:
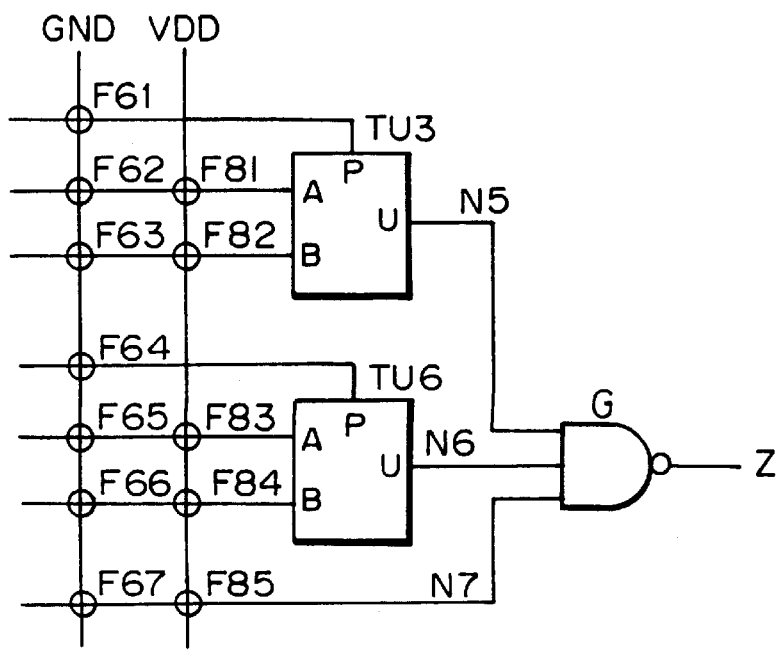
FIG. 16 is a circuit diagram illustrating the triple-input NAND gate shown in FIG. 11 and the pair pass-transistor elements in the sub-logic block shown in FIG. 8 or 9.

In a specific example shown in FIG. 16, the output terminal U of the pair pass-transistor element TU3 in the sub-logic block D1 and the output terminal U of the pair pass-transistor element TU6 in the sub-logic block D2 are connected directly to the respective two intermediate input nodes of the triple-input NAND gate in the sub-logic block D4 via the interconnection elements N5 and N6, respectively, without passing though any programmable switch, Therefore, if TU3 and TU6 are selected as the pair pass-transistor elements at the final stages of the first and second pass-transistor logic trees, respectively, and the triple-input logic gate in the sub-logic block D4 is selected as the multiple-input logic gate, then it is possible to form a composite pass-transistor logic circuit without having to provide any programmable switch between the intermediate output nodes of the pass-transistor logic trees and the intermediate input nodes of the multiple-input logic gate. Thus, the resultant composite pass-transistor logic circuit includes a small number of programmable switches in signal paths. In general, programmable switches have a large series resistance and a large parallel capacitance. Therefore, the reduction in the number of programmable switches present in signal paths can lead to an improvement in the operating speed of the logic circuit.

The third intermediate input node of the multiple-input logic gate, which is connected to the sub-logic block D3 via the interconnection element N7, is connected for example to the VDD interconnection element by programming the corresponding anti-fuse in the sub-logic block D3 into ON state. As a result, potential of the third intermediate input node of the multiple-input logic gate is fixed at VDD potential or HIGH logic level. In this case, the triple-input NAND gate in the sub-logic block D4 acts as a dual-input NAND gate. In the case where the multiple-input logic gate is prepared as a dual-input logic gate in the sub-logic block D4, the programmable switch used to connect the third input node to the VDD interconnection element is no longer necessary. However, in this case, the maximum number of pass-transistor logic trees which can be formed in a composite pass-transistor logic circuit is limited to two.

It is also possible to program another anti-fuse in the sub-logic block D3 into ON state so as to connect the third intermediate input node to a desired signal input terminal thereby making it possible for the intermediate input node to directly receive an input logic signal. The intermediate input node may also be connected to a signal input terminal via the inverter I19 in FIG. 10 so that the intermediate input node can receive an inverted input logic signal. Furthermore, if the anti-fuse located at the intersection between the interconnection element N7 and the interconnection element N1 is programmed into ON state, then a composite pass-transistor logic circuit is formed which has three single-stage pass1transistor logic trees including the pair pass-transistor elements TU3, TU6, and TU1, respectively.

In the present embodiment of the invention, the sub-logic block D5 of the programmable logic block includes a second triple-input NAND gate constructed with N channel MOS transistors TN21, TN22, and TN23 and P channel MOS transistors TP21, TP22, and TP23. It is possible to form a second composite pass-transistor logic circuit using this NAND gate. That is, it is possible to produce a second output logic signal using the above NAND gate. In this sense, the programmable logic block of the present embodiment can be regarded as having two output paths.

Figure 17:
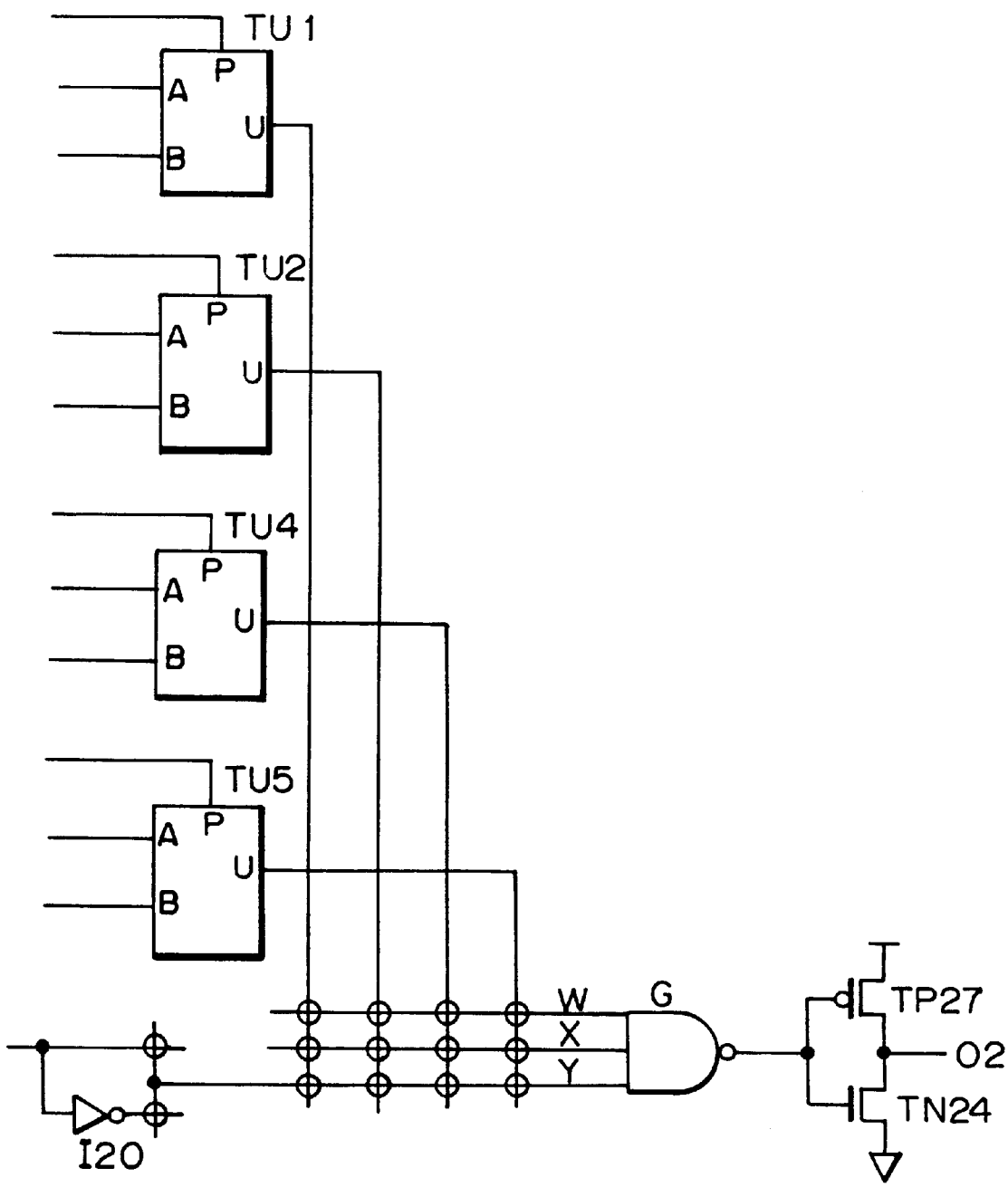
FIG. 17 is a circuit diagram illustrating the triple-input NAND gate in the sub-logic block shown in FIG. 12 and pair pass-transistor elements which can be connected to this NAND gate.

FIG. 17 is a circuit diagram illustrating the second NAND gate and also pair pass-transistor elements which can be used in conjunction with the second NAND gate to form a composite pass-transistor logic circuit. That is, there are shown the pair pass-transistor elements TU1 and TU2 in the sub-logic block D1 and the pair pass-transistor elements TU4 and TU5 in the sub-logic block D2. As described above in conjunction with FIG. 15, TU1 and TU2 are pair pass-transistor elements belonging to the second group in the sub-logic block D1. Similarly, the pair pass-transistor elements TU4 and TU5 belong to the second group in the sub-logic block D2. In FIG. 17, there is also shown an inverter I20 which is included in the sub-logic block D3. Furthermore, the second triple-input NAND gate of the sub-logic block D5, and also an inverter constructed with a P channel MOS transistor TP27 and an N channel MOS transistor TN24 are shown. This inverter will be described in further detail later.

In FIG. 17, it is possible to form the second composite pass-transistor logic circuit having up to three single-stage pass-transistor logic trees by programming proper anti-fuses into ON state. The intermediate input node Y of the second triple-input NAND gate may also be connected to a signal input terminal so that an input logic signal can be applied directly to that intermediate input node. Alternatively, the intermediate input node Y may also be connected to a signal input terminal via the inverter I20 so that the intermediate input node Y can receive an inverted input logic signal. Although not shown in FIG. 17, there is also provided an anti-fuse used to connect the intermediate input node Y to the VDD interconnection element or the GND interconnection element so that the intermediate input node Y receives a logic signal fixed at either HIGH or LOW logic state.

In the circuit shown in FIG. 17, twelve anti-fuses are disposed at the intersections between the four interconnection elements extending from the output terminals of the four pair pass-transistor elements and the three interconnection elements extending from the intermediate input nodes of the second triple-input logic gate. This allows each output terminal of the four pair pass-transistor elements to be connected to any desired intermediate input node of the second triple-input logic gate. However, the programmable logic block of the present invention is not limited to such a configuration. For example, with a configuration in which only three programmable switches are disposed in such a manner that each is located at the intersection between the interconnection element extending from the output terminal of each one of the pair pass-transistor element TU1, TU2 and TU3 and the interconnection element extending from corresponding one of the intermediate input node W, X, and Y of the triple-input logic gate, it is also possible to form a composite pass-transistor logic circuit having up to three single-stage pass-transistor logic trees.

Although in the programmable logic block of the present embodiment, pair pass transistor-elements such as that shown in FIG. 13 are employed as elements to form pass-transistor logic trees, other types of pair pass-transistor elements may also be employed. For example, the pair pass-transistor element may also be configured in such a manner that the connection between the gate of the N channel MOS transistor MI with the gate of the N channel MOS transistor M2 via the inverter I is removed so that both the gates of the N channel MOS transistors M1 and M2 may be used as the independent control terminals. Furthermore, in the pair pass-transistor element, the connection between the output terminals of the two unit pass transistors may be removed so that the output terminals can be used independently. In general, if the number of connections which have been made beforehand in a programmable logic block is reduced and if the number of programmable switches used to make programmable interconnections is increased correspondingly, then it is possible to increase the flexibility in programmable interconnections. This allows, for expressing some kinds of logical operations, a reduction in the number of unit pass transistors and inverters required to form a logic circuit. However, the increase in the number of programmable switches leads to an increase in the size of the programmable logic block, and thus a larger chip size is required to accommodate a required number of programmable logic blocks. Furthermore, the increase in the number of programmable logic switches in the signal transmission paths of the logic circuit results in a decrease in operating speed. If the above factors are taken into account, it is preferable to employ the pair pass-transistor element shown in FIG. 13 as a basic circuit unit to form pass-transistor logic trees in a programmable logic block for practical use in an FPGA.

In the programmable logic block of the present embodiment of the invention, there are provided pair pass-transistor elements of the first group whose output terminals are connected to corresponding intermediate input nodes of a multiple-input logic gate via fixed interconnections. The first group includes two pair pass-transistor elements TU3 and TU6. With this configuration, it is possible to form a composite pass-transistor logic circuit having two single-stage pass-transistor logic trees which include no programmable switch for connecting the intermediate output nodes to the corresponding intermediate input nodes and which thus can operate at a high speed. However, it is not essential to the present invention that the first group includes two pair pass-transistor elements. Alternatively, the first group may also include three or more pair pass-transistor elements.

Furthermore, in the programmable logic block of the present embodiment of the invention, there are provided pair of pass-transistor elements of the second group whose output terminals are not connected to any particular intermediate input node. The second group includes four pair pass-transistor elements TU1, TU2, TU4, and TU5. Furthermore, in the programmable logic block of the present embodiment, there are provided programmable switches which may be programmed to connect the output terminals of the pair pass-transistor elements of the second group to the corresponding input terminals of the pair pass-transistor elements of the first group. Thus it is possible to form a composite pass-transistor logic circuit having dual-stage pass-transistor logic trees by means of a combination of the pair pass-transistor elements of the first and second groups. In this configuration, it is not essential to the present invention that there be provided four pair pass-transistor elements of the second group. However, when two pair pass-transistor elements of the first group are available, if it is required to form two full dual-stage pass transistor logic trees, there must be four pair pass-transistor elements of the second group. More generally, when there are n pair pass-transistor elements of the first group, 2n pair pass-transistor elements are needed to form n full dual-stage pass-transistor logic trees (wherein n is an integer equal to or greater than 2).

In the programmable logic block of the present embodiment, the multiple-input logic gate has a third intermediate input node in addition to the intermediate input nodes which are connected to the output terminals of the pair pass-transistor elements of the first group. Furthermore, there are provided programmable switches which may be programmed to connect the third intermediate input node to the output terminals of the pair pass-transistor elements of the second group. Thus, if required, it is possible to form a composite pass-transistor logic circuit having three pass-transistor logic trees. There are also provided programmable switches which may be programmed to connect the third intermediate input node to a signal input terminal. This makes it possible to form a logic circuit in which a triple-input logic gate receives intermediate logic signals from two pass-transistor logic trees and also receives, at its third intermediate input node, an input logic signal produced by, for example, a logic circuit formed in another programmable logic block.

As described above, in the programmable logic block according to the present embodiment of the invention, it is possible to construct a desired logic circuit in various forms such as a composite pass-transistor logic circuit having two single-stage pass-transistor logic tree; a composite pass-transistor logic circuit having two dual-stage pass-transistor logic trees; a composite pass-transistor logic circuit having three pass-transistor logic trees; or a composite pass-transistor logic circuit having two pass-transistor logic trees and a third intermediate input node of a multiple-input logic gate to receive an input logic signal. Thus, it is possible to efficiently express various logical operations in the programmable logic block of the present embodiment. Therefore, a user can efficiently realize various logic functions using an FPGA including programmable logic blocks of the present embodiment.

Furthermore, in the present embodiment, the programmable logic block includes a second multiple-input logic gate in addition to the above-described multiple-input logic gate. The programmable logic block also includes programmable switches which may be programmed to connect the output terminals of the pair pass-transistor elements of the second group to desired intermediate input nodes of the second multiple-input logic gate. This makes it possible to form a second composite pass-transistor logic circuit using the second multiple-input logic gate and pair pass-transistor elements of the second group. Furthermore, there are also provided programmable switches which may be programmed to connect one of the intermediate input nodes of the second multiple-input logic gate to a signal input terminal. Thus it is also possible to form a logic circuit such that the multiple-input logic gate of the second composite pass-transistor logic circuit receives not only intermediate logic signals from a plurality of pass-transistor logic trees but also an input logic signal produced, for example, by a logic circuit formed in another programmable logic block.

As described above, in the programmable logic block according to the present embodiment of the invention, it is possible to flexibly construct up to two composite pass-transistor logic circuits in various forms by connecting the pair pass-transistor elements of the second group by means of proper programming of the programmable switches. However, since the pair pass-transistor elements of the second group are used in common to construct composite pass-transistor logic circuits in various forms, there are limitations in the configurations of the composite pass-transistor logic circuits which can be formed at the same time. However, it is rare that such logic circuits are required to be formed at the same time in the same programmable logic block, and thus the above limitations are not serious in practical applications. If additional pair pass-transistor elements are prepared in a programmable logic block, it will become possible to form a wider variety of logic circuits at the same time. However, such the additional pair pass-transistor elements will seldom be used. Therefore, from the practical viewpoint, it is better, as in the present embodiment, to use pair pass-transistor elements of the second group in common in forming various logic circuits in that the circuit elements in programmable logic blocks can be used in a highly efficient manner and thus a desired logic function can be realized in a smaller FPGA chip.

The inverter constructed with a P channel MOS transistor TP17 and an N channel MOS transistor TN14 shown in FIG. 11 and the inverter constructed with a P channel MOS transistor TP27 and an N channel MOS transistor TN24 shown in FIG. 12 will be described below. These inverters have a greater driving capacity than the triple-input NAND gate used as the multiple-input logic gate. These inverters are used to transmit a logic signal produced by a logic circuit formed in a programmable logic block of the present embodiment to the outside of the programmable logic block via programmable interconnections among programmable logic blocks indlucing external interconnection elements SO-Sn. The programmable interconnections among programmable logic blocks extend a long distance over a chip and pass through a great number of programmable switches. Therefore, they, have a large series resistance and a large parallel capacitance. As a result, to transmit a signal via the programmable interconnections among programmable logic blocks at a high speed, a high driving capacity is required. An alternative technique is to increase the driving capacity of the triple-input NAND gate itself instead of employing the inverter having a larger driving capacity P. In this case, however, it is required to increase the sizes of all six transistors including the P channel MOS transistors TP11–TP13 and the N channel MOS transistors TN11–TN13 shown in FIG. 14. Furthermore, since the three N channel MOS transistors TN11–TN13 are connected in series, the overall impedance becomes high. This creates an additional requirement of increase in the transistor sizes to obtain a sufficiently high driving capacity of the NAND gate. As can be understood from the above discussion, it is preferable to combine an inverter having a high driving capacity with a multiple-input logic gate constructed with rather small-sized MOS transistors in that the high driving capacity can be achieved in a smaller-sized programmable logic block.

The programmable logic block of the present embodiment has been designed mainly to realize in a highly efficient manner a composite pass-transistor logic circuit having a plurality of pass-transistor logic trees and a multiple-input logic gate with a plurality of intermediate input nodes for receiving intermediate logic signals from the corresponding pass transistor logic trees. However, in the FPGA of the present invention, it is not necessary to use only such composite pass transistor logic circuits to realize a desired logic function. That is, it is also possible to construct other types of logic circuits using the programmable logic block of the present embodiment.

For example, in FIG. 16, if the anti-fuses F61 and F82 are programmed into ON state, potential of the output terminal U of the pair pass transistor element TU3 is fixed at HIGH logic level. This makes it possible for the triple-input NAND gate to act as a dual-input NAND gate which receives an intermediate logic signal from the pass-transistor logic tree including the pair pass-transistor element TU6 an input logic signal via the interconnection element N7. If the anti-fuses F64 and F84 are also programmed into ON state, then the potential of the output terminal U of the pair pass-transistor element TU6 is also fixed at HIGH logic level. As a result, the triple-input NAND gate G behaves as an inverter which receives only an input logic signal via the interconnection element N7. Furthermore, it is also possible to make the entire triple-input NAND gate G inactive. In this case, the potential of the output Z is fixed at HIGH logic level. The above setting can be achieved as follows. First, the anti-fuses F61 and F64 are switched into ON state so that potential of the input terminals of the inverters included in the pair pass-transistor elements TU3 and TU6 are fixed at LOW level, thereby preventing incorrect operation of these inverters. If at least one of the anti-fuses F63, F66, or F67 is also-switched into ON state, then potential of the output Z is fixed at HIGH logic level.

It is desirable that not only combinational logic circuits but also sequential logic circuits using a flip-flop, register, latch, etc., may be formed in a programmable logic block of the FPGA. Thus, in the programmable logic block of the present embodiment, the sub-logic blocks D4 and D5 include flip-flops FF1 and FF2, respectively. This makes it possible to form not only combinational logic circuits but also sequential logic circuits in the programmable logic block. For example, if two flip-flops are combined, a register is formed. Although the required number of sequential logic circuits depends on the specific application, one flip-flop is required for each logical operation including four to eight variables in typical applications. In the present embodiment, the programmable logic block includes signal input terminals capable to receive up to twenty input logic signals or variables, and two flip-flops. However, in practice it is rare to utilize such a large number of variables.

Figure 18:
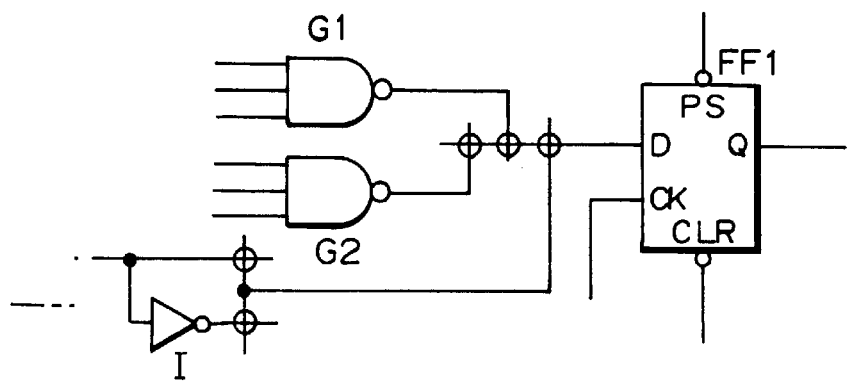
FIG. 18 is a circuit diagram illustrating an example of a programmable interconnection to the D-input terminal of a flip-flop in a programmable logic block for use in an FPGA, according to the present invention.

In the circuits shown in FIGS. 11 and 12, the D-input terminals of the flip-flops FF1 and FF2 are connected via the fixed interconnections to the respective output nodes of the triple-input logic gate in the respective sub-logic blocks. The connections in terms of the flip-flops may also be made in different ways. In the specific example shown in FIG. 18, there are three programmable switches in the path of the interconnection element. extending from the D-input terminal of a flip-flop. Any desired logic signal can be selected from the three by properly programming these programmable switches, and the selected logic signal can be applied to the flip-flop. That is, the output of the triple-input logic gate G1 or G2 or otherwise the input logic signal received at the signal input terminal denoted by the broken line in FIG. 18 may be selected to input to the flip-flop. This configuration allows a flip-flop to receive a logic signal via a signal input terminal from another programmable logic block. In other words, this flip-flop can be commonly used by a plurality of logic circuits formed in a plurality of programmable logic blocks. This allows a reduction in the number of flip-flops which should be prepared in each programmable logic block.

In the specific example described above, inverters are provided which can be used to invert the input logic signals to be received at the respective input nodes of the pass-transistor logic trees. Similarly, the programmable logic block may include inverters for inverting the intermediate logic signals produced by the respective pass-transistor logic trees, and also programmable switches for connecting a desired intermediate input node of the multiple-input logic gate to the intermediate output node of a desired pass-transistor logic tree via a corresponding inverter. This makes it possible for an intermediate input node to receive an intermediate logic signal produced by a pass-transistor logic tree after inverting it. This expands the logical operations which can be expressed in the programmable logic block.

Now specific examples of logic circuits which may be formed in the programmable logic block of the present embodiment will be described below. In the following discussion, it will be assumed that all input logic signals to the programmable logic block are active high.

Figure 19:
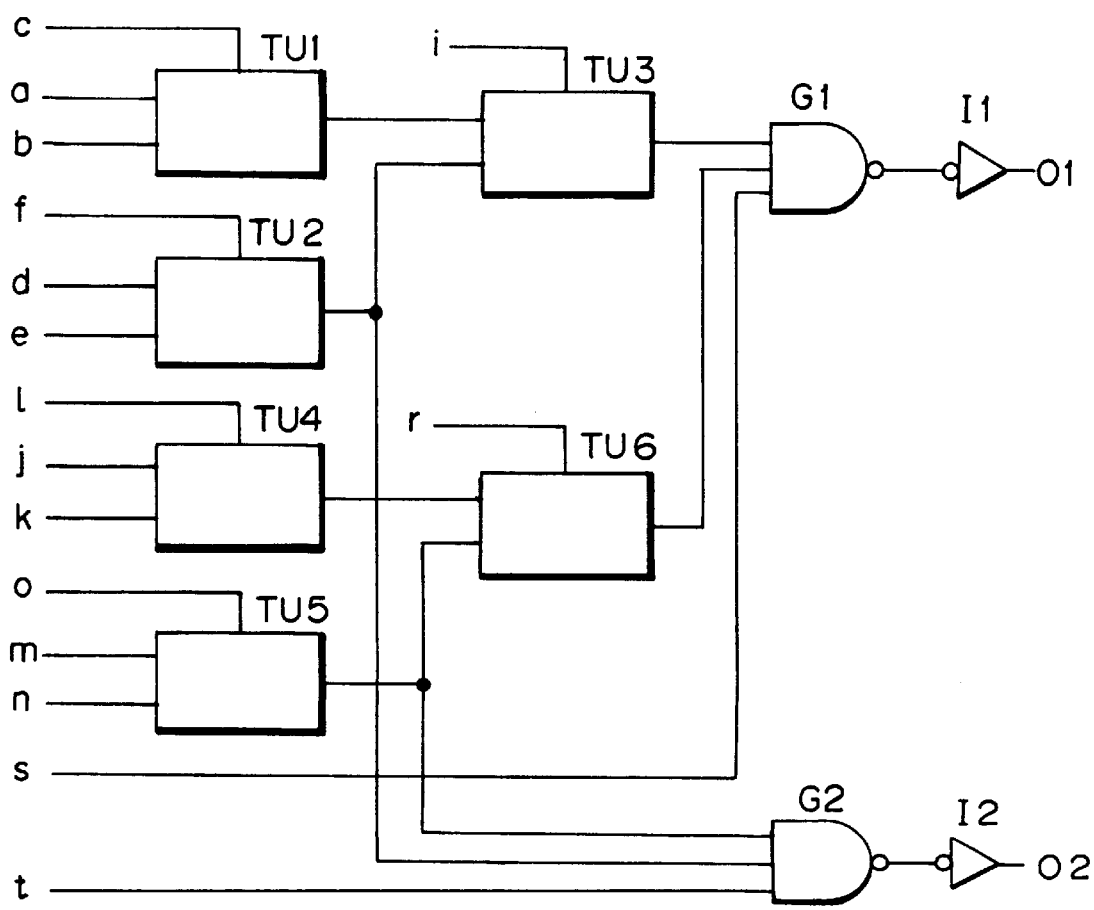
FIG. 19 is a circuit diagram of an example of a logic circuit which can be formed in a programmable logic block according to the present invention.

FIG. 19 illustrates a first example of a logic circuit which can be formed in the programmable logic block according to the present embodiment.

Figure 20:
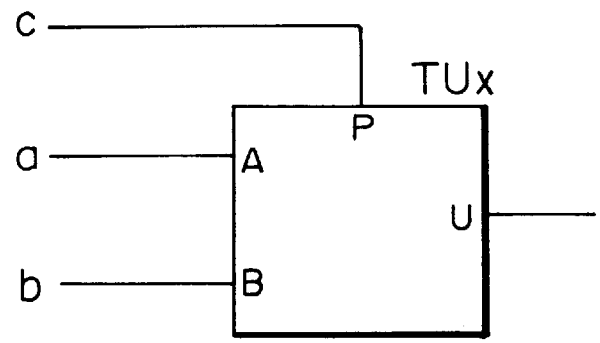
FIG. 20 illustrates a symbol denoting a pair pass transistor element, used in FIG. 19 figures following.

In FIG. 19 and also in the following figures, the pair pass-transistor element shown in FIG. 13 is represented in a simpler manner as shown in FIG. 20. Furthermore, hereinafter symbols A, B, and P denoting the terminals of pair pass-transistor elements will not be shown in the circuit diagrams for simplicity.

In FIG. 19, the output O1 provides the result of the logical operation represented by the expression (4) shown below. In this logical operation, up to fifteen variables can be dealt with, and up to sixteen product terms each including up to seven variables can be expressed.

$$O1 = a \cdot c \cdot i \cdot j \cdot l \cdot r \cdot s + a \cdot c \cdot i \cdot k \cdot l \cdot r \cdot s + a \cdot c \cdot i \quad m \cdot \bar{o} \cdot \bar{r} \cdot s + a \cdot c \cdot i \cdot n \cdot \bar{o} \cdot \bar{r} \cdot s + b \cdot \bar{c} \cdot i \cdot j \cdot l \cdot r \cdot s + \\ b \cdot \bar{c} \cdot i \cdot k \cdot l \cdot r \cdot s + b \cdot \bar{c} \cdot i \cdot m \cdot \bar{o} \cdot \bar{r} \cdot s + b \cdot \bar{c} \cdot i \cdot n \cdot \bar{o} \cdot \bar{r} \cdot s + d \cdot \bar{f} \cdot \bar{i} \cdot j \cdot l \cdot r \cdot s + d \cdot \bar{f} \cdot \bar{i} \cdot k \cdot l \cdot r \cdot s + \\ d \cdot \bar{f} \cdot \bar{i} \cdot m \cdot \bar{o} \cdot \bar{r} \cdot s + d \cdot \bar{f} \cdot \bar{i} \cdot n \cdot \bar{o} \cdot \bar{r} \cdot s + e \cdot \bar{f} \cdot \bar{i} \cdot j \cdot l \cdot r \cdot s + e \cdot \bar{f} \cdot \bar{i} \cdot k \cdot l \cdot r \cdot s + \\ e \cdot \bar{f} \cdot \bar{i} \cdot m \cdot \bar{o} \cdot \bar{r} \cdot s + e \cdot \bar{f} \cdot \bar{i} \cdot n \cdot \bar{o} \cdot \bar{r} \cdot s \quad (4)$$

In FIG. 19, the output O2 provides the result of the logical operation represented by the expression (5) shown below. In this logical operation, up to seven variables can be dealt with, and up to four product terms each including up to five variables can be expressed.

$$O2 = d \cdot f \cdot m \cdot o \cdot t + d \cdot f \cdot n \cdot \bar{n} \cdot t + e \cdot \bar{f} \cdot m \quad o \cdot t + e \cdot \bar{f} \cdot n \cdot \bar{o} \cdot t \quad (5)$$

Figure 21:
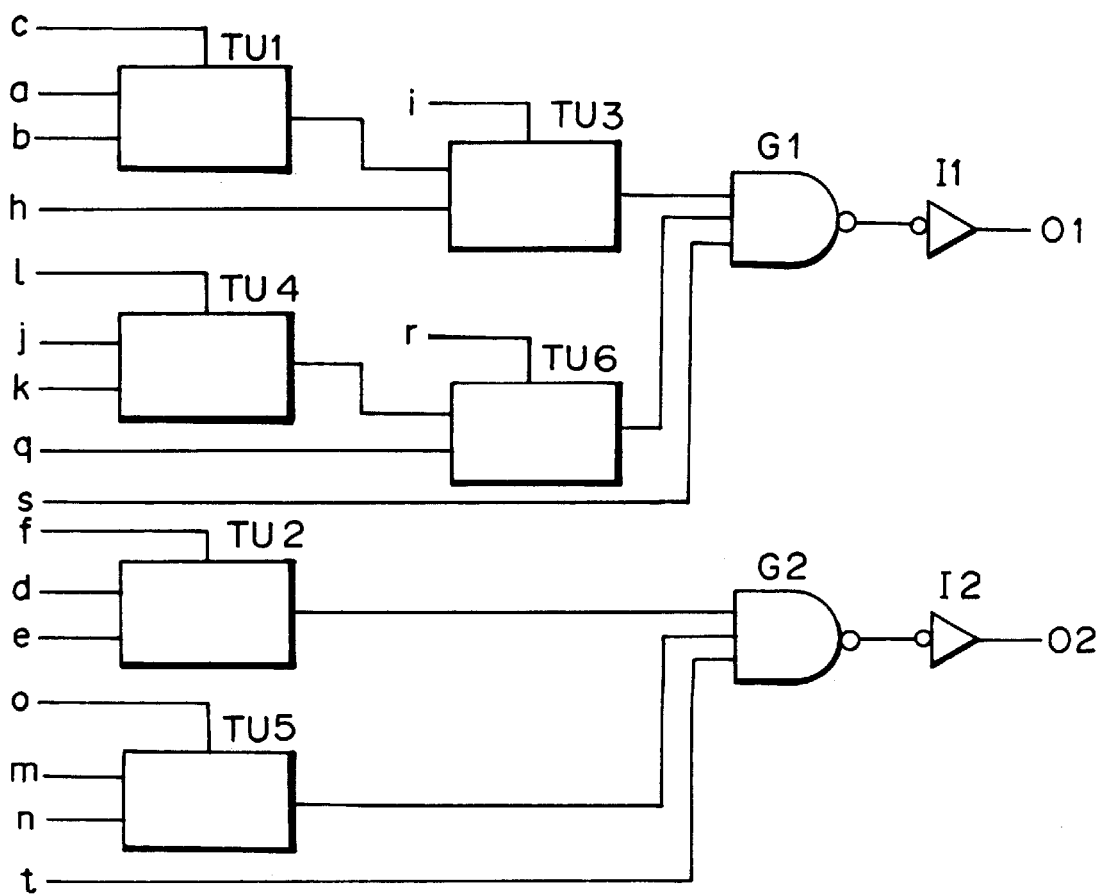
FIGS. 21 and 22 are circuit diagrams of other examples of logic circuits which can be formed in a programmable logic block according to the present invention.

FIG. 21 illustrates a second example of a logic circuit which can be formed in the programmable logic block according to the present embodiment.

In the logic circuit shown FIG. 21, the output O1 provides the result of the logical operation represented by the expression (6) shown below. In this logical operation up to eleven variables can be dealt with, and up to four product terms each including up to seven variables, up to four product terms each including six variables, and one product term including up to five variables can be expressed.

$$O1 = a \cdot c \cdot i \cdot j \cdot l \cdot r \cdot s + a \cdot c \cdot i \cdot k \cdot l \cdot r \cdot s + a \cdot c \cdot i \cdot q \cdot \bar{r} \cdot s + b \cdot \bar{c} \cdot i \cdot j \cdot l \cdot r \cdot s + b \cdot \bar{c} \cdot i \cdot k \cdot l \cdot r \cdot s + b \cdot \bar{c} \cdot i \cdot q \cdot \bar{r} \cdot s + h \cdot \bar{i} \cdot j \cdot l \cdot r \cdot s + h \cdot \bar{i} \cdot k \cdot l \cdot r \cdot s + h \cdot \bar{i} \cdot q \cdot \bar{r} \cdot s \quad (6)$$

In the logic circuit shown in FIG. 21, the output O2 provides the result of the logical operation represented by the expression (7) shown below. In this logical operation, up to seven variables can be dealt with, and up to four product terms each including up to five variables can be expressed.

$$O2 = d \cdot f \cdot m \cdot o \cdot t + d \cdot f \cdot n \cdot \bar{o} \cdot t + e \cdot \bar{f} \cdot m \cdot o \cdot t + e \cdot \bar{f} \cdot n \cdot \bar{o} \cdot t \quad (7)$$

Figure 22:
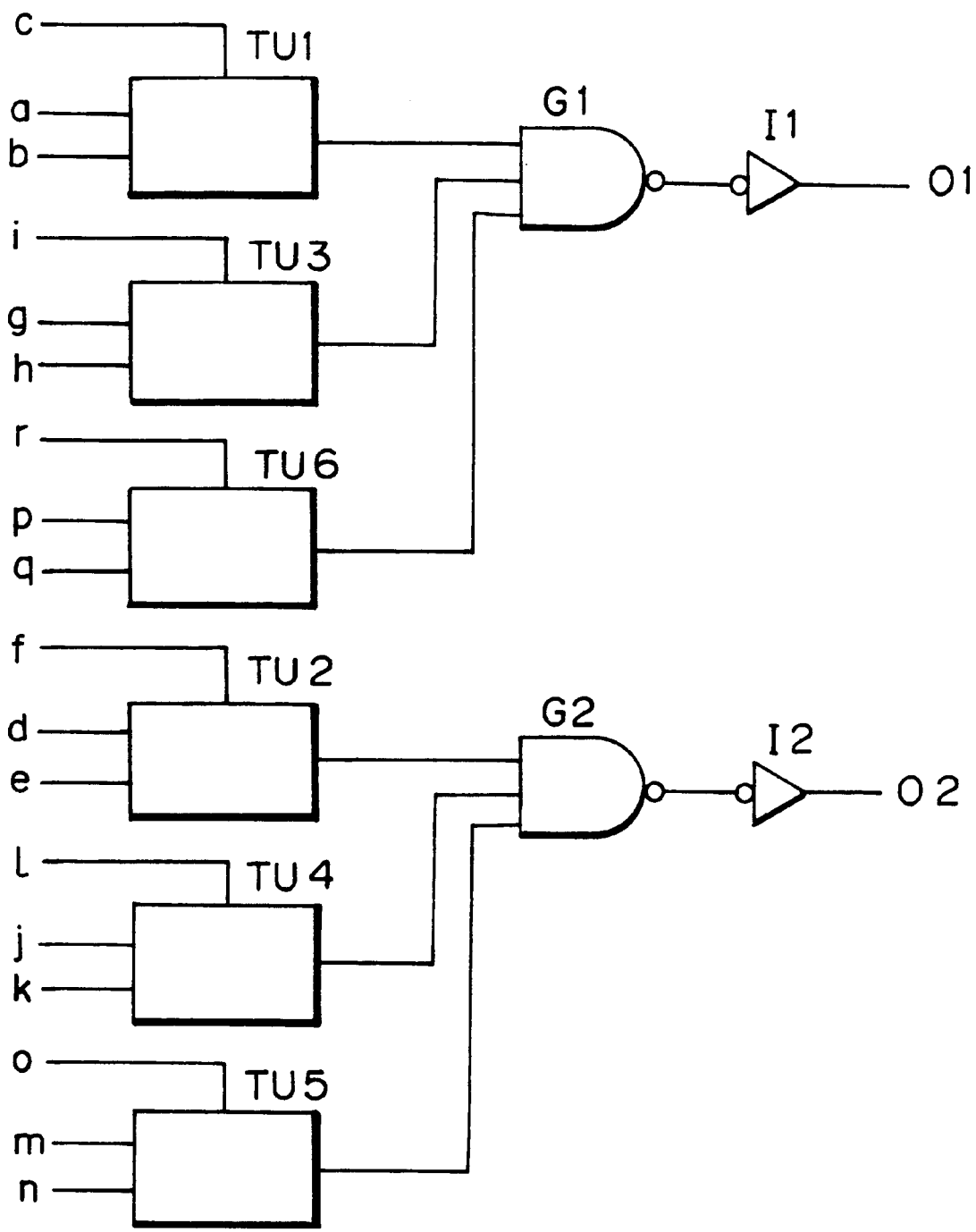

FIG. 22 illustrates a third example of a logic circuit which can be formed in the programmable logic block according to the present embodiment.

In the logic circuit shown FIG. 22, the output O1 provides the result of the logical operation represented by the expression (8) shown below. In this logical operation, up to nine variables can be dealt with, and up to eight product terms each including up to six variables can be expressed.

$$O1 = a \cdot c \cdot g \cdot i \cdot p \cdot r + a \cdot c \cdot g \cdot i \cdot q \cdot \bar{r} + a \cdot c \cdot h \cdot \bar{i} \cdot p \cdot r + a \cdot c \cdot h \cdot \bar{i} \cdot q \cdot \bar{r} + b \cdot \bar{c} \cdot g \cdot i \cdot p \cdot r + b \cdot \bar{c} \cdot g \cdot i \cdot q \cdot \bar{r} + b \cdot \bar{c} \cdot h \cdot \bar{i} \cdot p \cdot r + b \cdot \bar{c} \cdot h \cdot \bar{i} \cdot q \cdot \bar{r} \quad (8)$$

In the logic circuit shown FIG. 22, the output O2 provides the result of the logical operation represented by the expression (9) shown below. In this logical operation, upt to nine variables can be dealt with, and up to eight product terms each including up to six variables can be expressed.

$$O2 = d \cdot f \cdot j \cdot l \cdot m \cdot o + d \cdot f \cdot j \cdot l \cdot n \cdot \bar{o} + d \cdot f \cdot k \cdot \bar{l} \cdot m \cdot o + d \cdot f \cdot k \cdot \bar{l} \cdot n \cdot \bar{o} + e \cdot \bar{f} \cdot j \cdot l \cdot m \cdot o + e \cdot \bar{f} \cdot j \cdot l \cdot n \cdot \bar{o} + e \cdot \bar{f} \cdot k \cdot \bar{l} \cdot m \cdot o + e \cdot \bar{f} \cdot k \cdot \bar{l} \cdot n \cdot \bar{o} \quad (9)$$

As described above, the programmable logic block according to the present invention makes it possible to form a composite pass-transistor logic circuit having various configurations by properly programming the programmable switches. As disclosed in the co-pending patent application Ser. No. 08/716,883, the composite pass-transistor logic circuit can express complex logical operations with a reduced number of stages of pass transistors, which leads to an improvement in operating speed. Furthermore, various logical operations including those which cannot be efficiently expressed by conventional pass-transistor logic circuitry can be expressed with a smaller number of transistors than required when expressed by the conventional CMOS logic circuit. Besides, the logic circuit according to the present invention can operate at a high speed, with low power consumption. Thus, it is possible to realize a high-performance FPGA using the programmable logic blocks in which such the composite pass-transistor logic circuits having the above-described various features and advantages are formed. The feature that the composite pass-transistor logic circuit can express complex logic functions is of particular significance when the programmable logic block of the invention is used in an FGPA. Programmable interconnections among programmable logic blocks in FPGAs generally have large series resistances and large parallel capacitances. Therefore, in order to improve the operating speed and to reduce power consumption, it is desirable to express complex logical operations in the respective programmable logic blocks thereby reducing the number of programmable logic blocks required to achieve a desired logic function, and thus reducing the number of programmable interconnections among programmable logic blocks.

Figure 3:
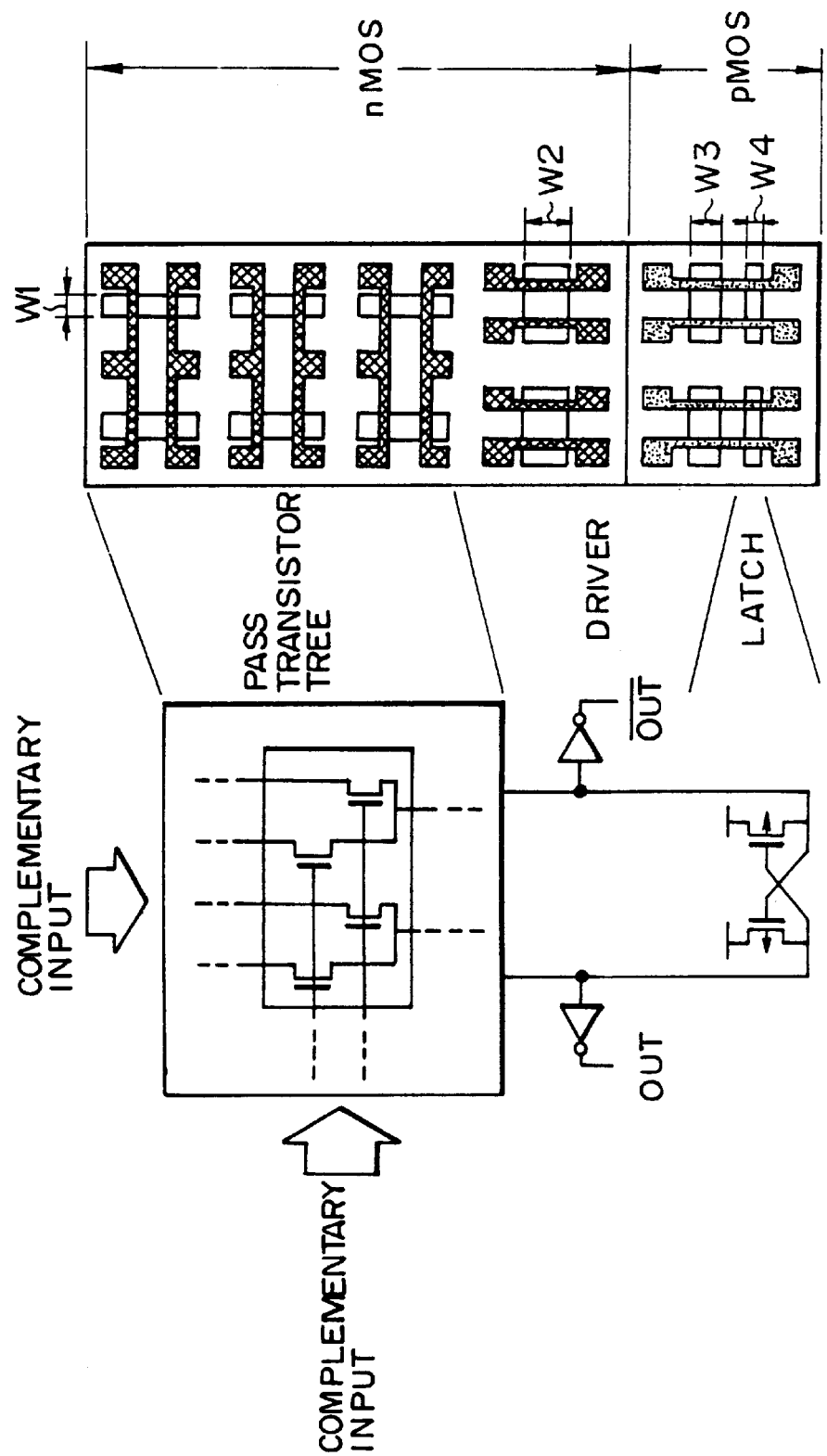
FIG. 3 illustrates the layout of a base cell for use in a gate array according to a conventional technique and also illustrates a circuit diagram of a pass transistor logic circuit constructed using the above base cell.
Figure 4:
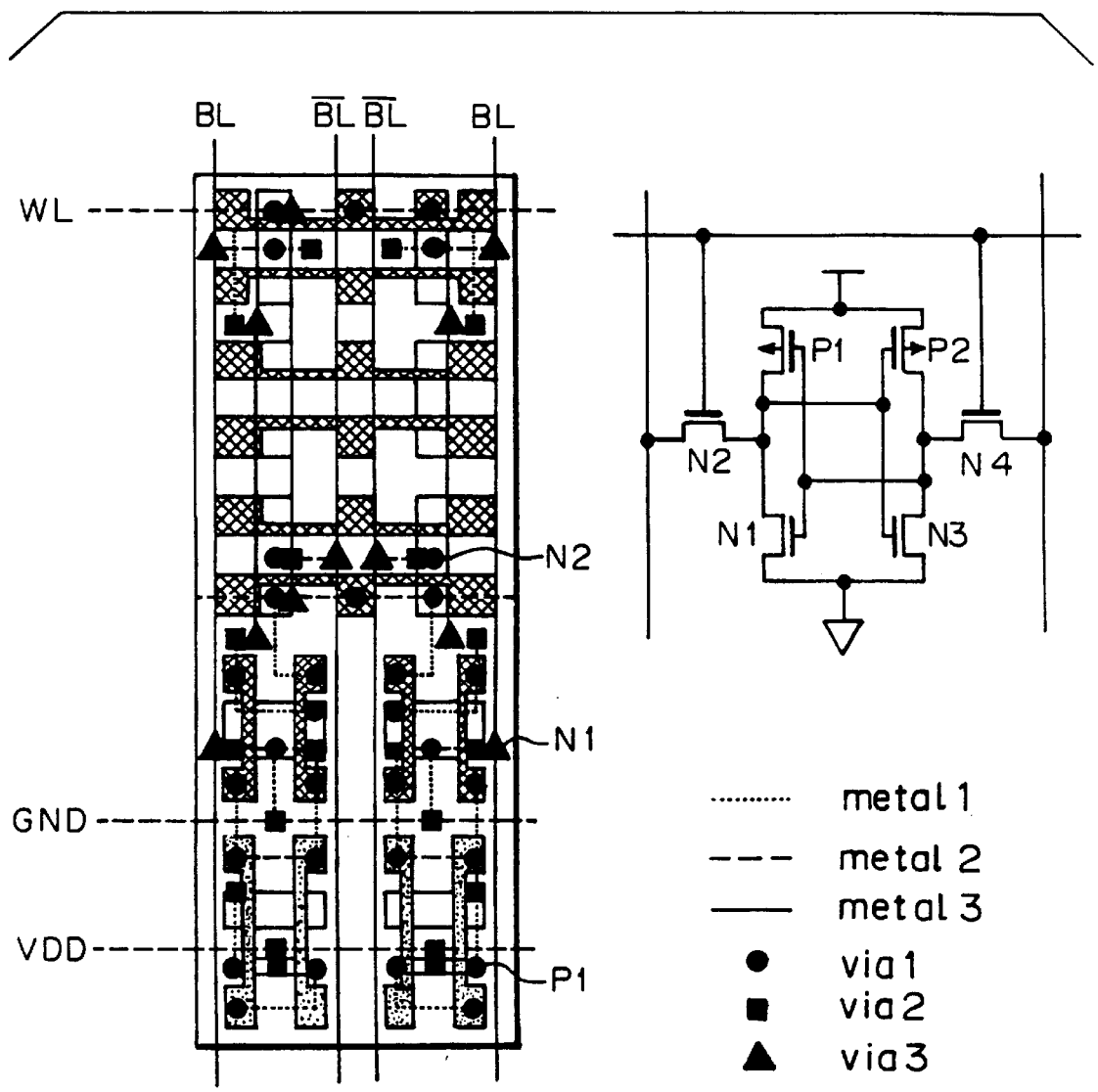
FIG. 4 illustrates a circuit diagram of an SRAM cell constructed using the base cell shown in FIG. 3 and interconnections to form the SRAM.
Figure 5:
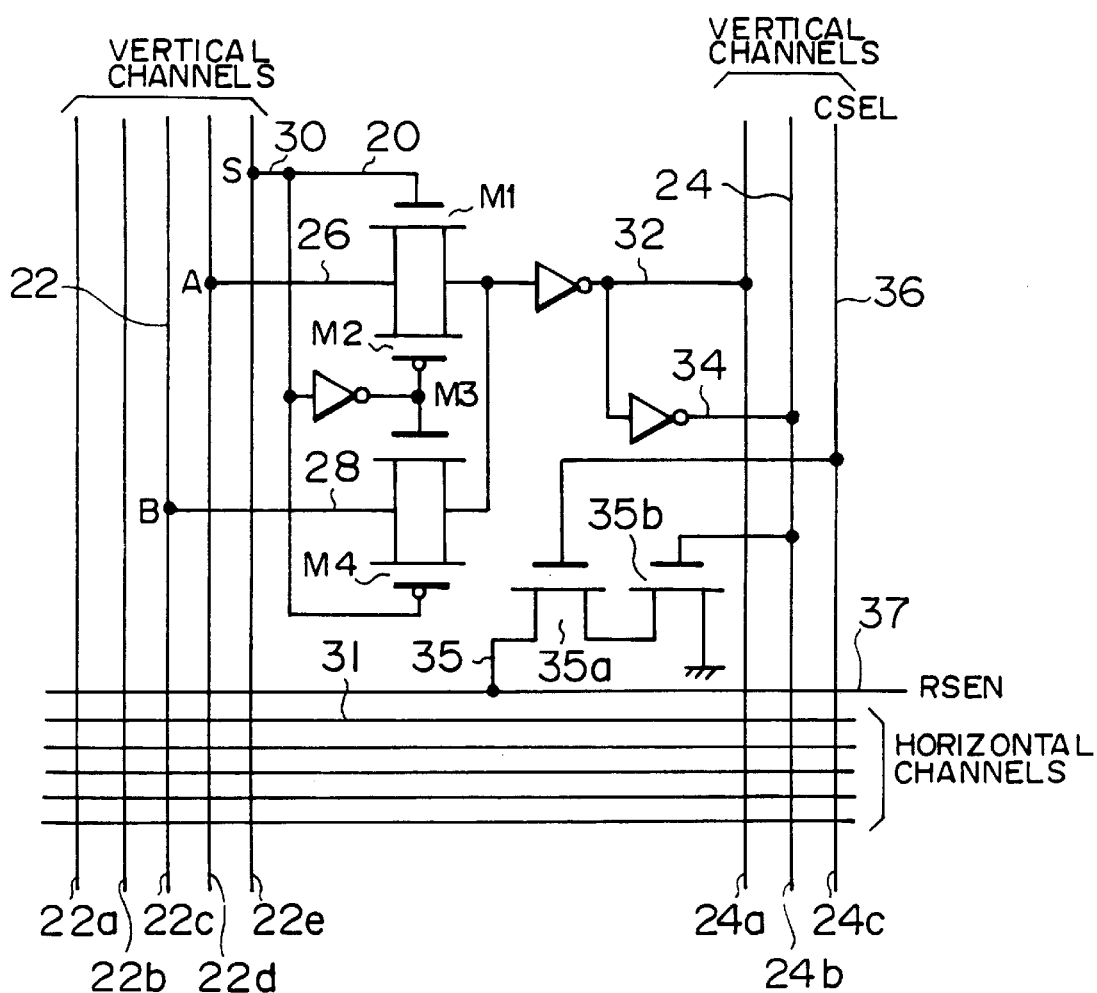
FIG. 5 is a circuit diagram of an example of a programmable logic block for use in an FPGA according to a conventional technique.
Figure 6:
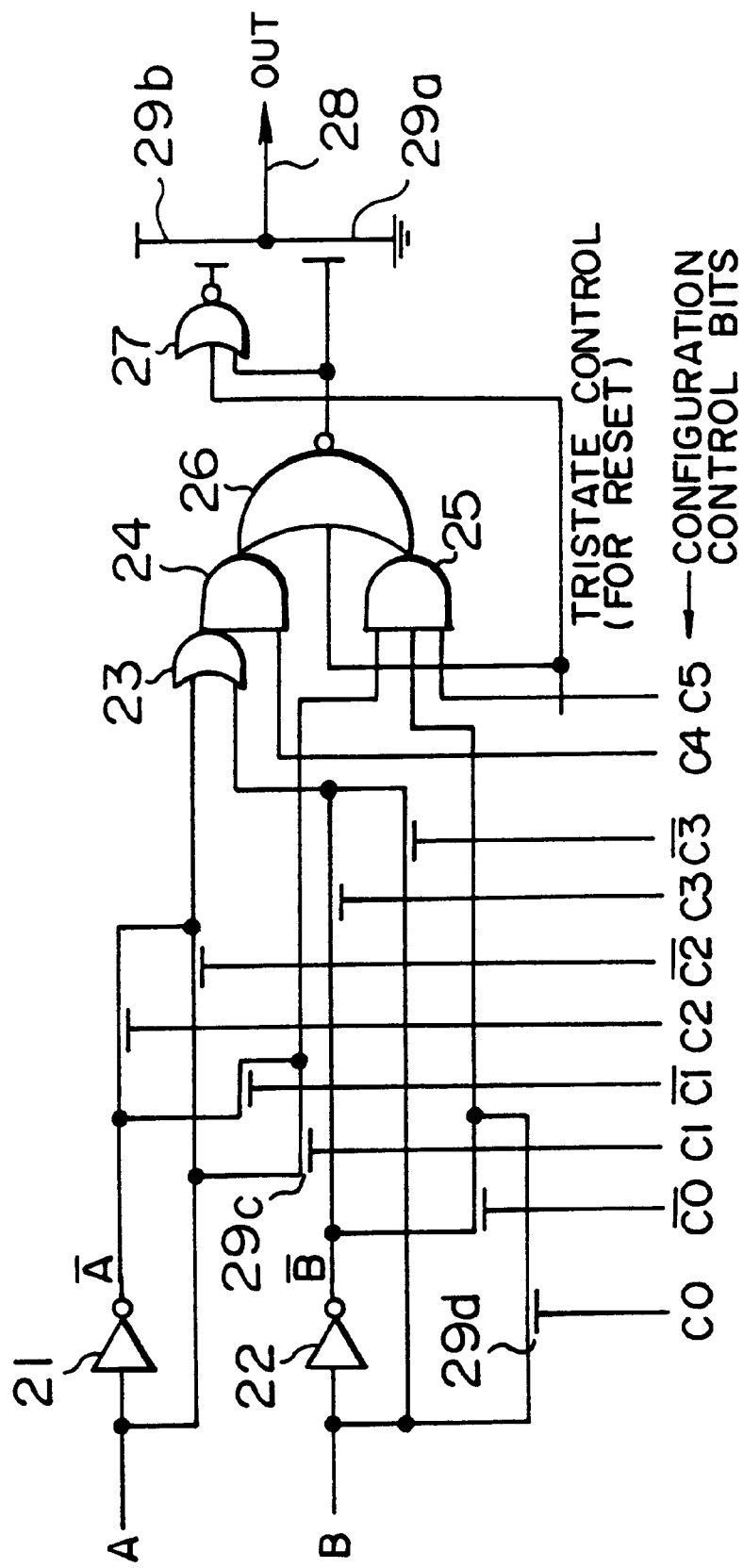
FIG. 6 is a circuit diagram of another example of a programmable logic block for use in an FPGA according to a conventional technique.

The above feature is in contrast to that of the conventional programmable logic blocks using pass-transistors. For example, in the programmable logic block shown in FIG. 5, since there are only two pass gates, only very simple logical operations can be expressed, and thus a great number of programmable interconnections among programmable logic blocks are required, which results in low operating speed and high power consumption.

In the programmable logic block according to the present embodiment of the invention, it is possible to flexibly construct a composite pass-transistor logic circuit in various forms such as a composite pass-transistor logic circuit having a dual-stage pass-transistor logic tree, a composite pass-transistor logic circuit having three pass-transistor logic trees, two composite pass-transistor logic circuits, etc., using a limited number of pair pass-transistor elements in common. That is, a small number of pair pass-transistor elements are used in a highly efficient manner to form logic circuits. Furthermore, input logic signals can be applied to such various logic circuits either directly or after being inverted. Still furthermore, the intermediate input nodes of the multiple-input gate can receive not only the intermediate logic signals from the pass-transistor logic trees but also input logic signals from other programmable logic blocks. These features allow a wide variety of logical operations to be expressed in a highly efficient manner.

In the specific embodiment of the programmable logic block described above, a triple-input NAND gate is employed as the multiple-input logic circuit. However, the present invention is not limited to that function, and other types of logic gates such as a multiple-input NOR gate may also be employed.

Figure 23:
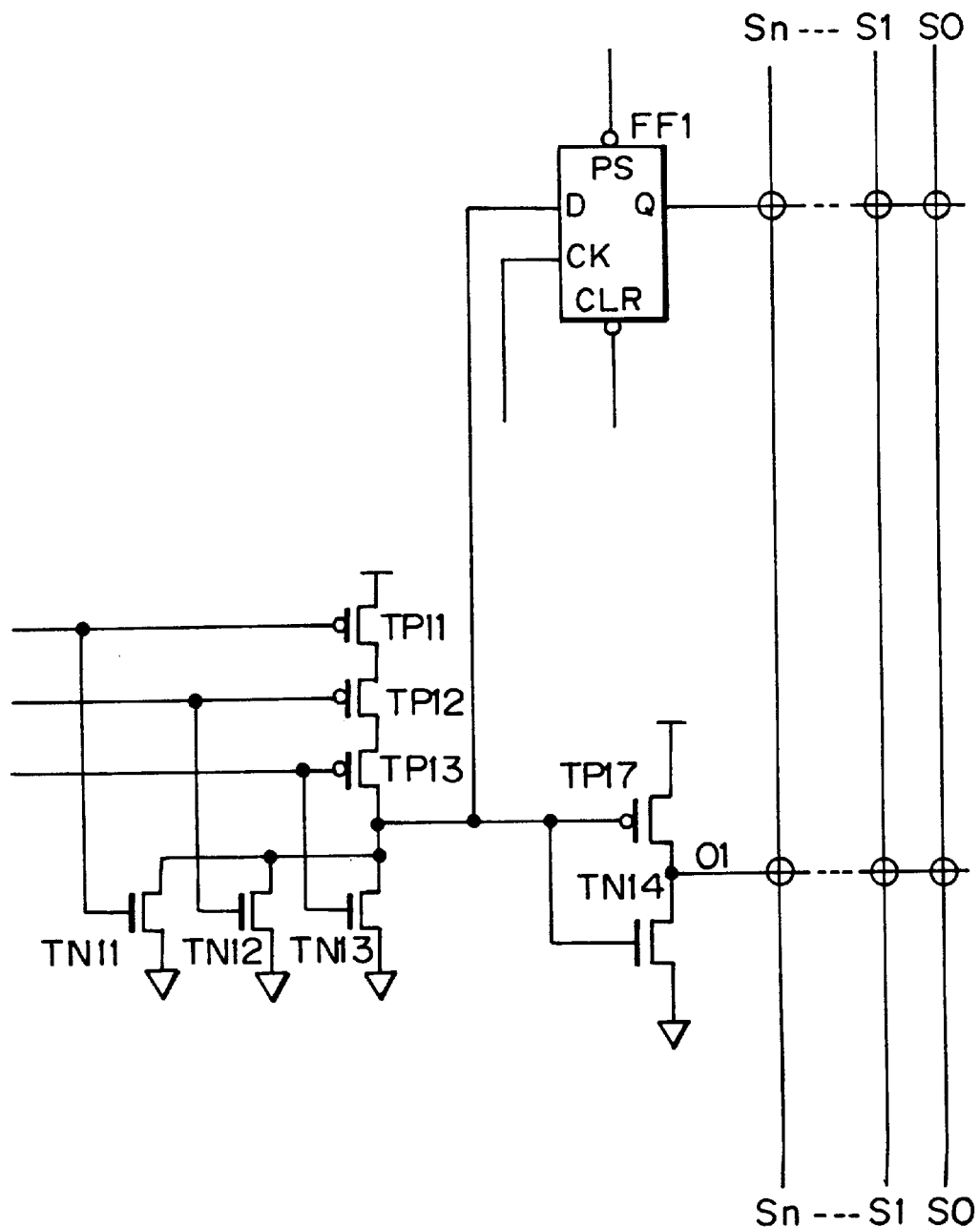
FIG. 23 is a circuit diagram of a sub-logic block including a triple-input NOR gate which can be used in a programmable logic block of an FPGA, according to the present invention.
Figure 24:
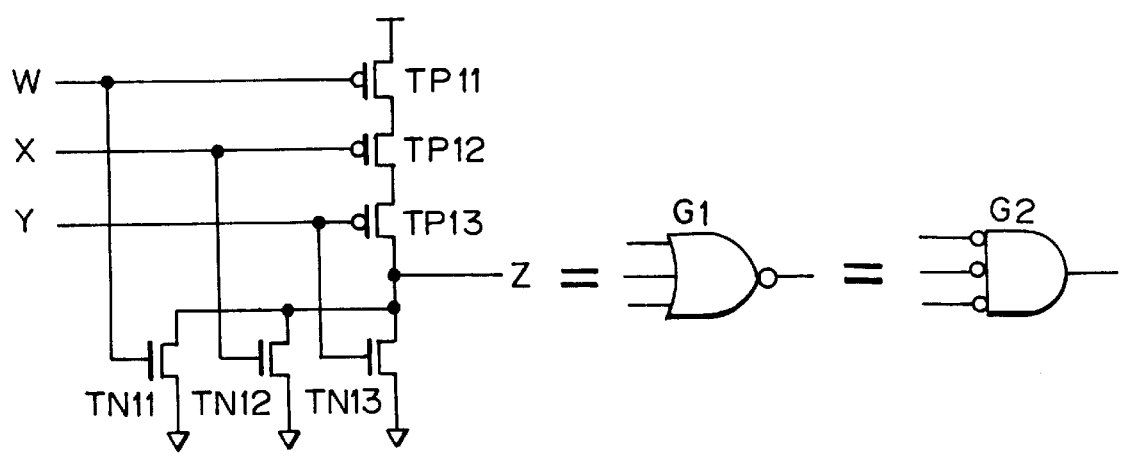
FIG. 24 illustrates schematic symbols of a triple-input NOR gate in the sub-logic block shown in FIG. 23.

For example, in the programmable logic block shown in FIG. 7, the sub-logic blocks D4 and D5 may be replaced by that shown in FIG. 23. In the case of the sub-logic block shown in FIG. 23, a triple-input NOR gate is constructed with P channel MOS transistors TP11–TP13 and N channel MOS transistors TN11–TN13. This logic gate performs a logical operation represented by $Z = \overline{W + X + Y}$. Hereinafter, this type of NOR gate will be denoted by the schematic symbol G1 or G2 shown in FIG. 24. A triple-input NOR gate of the same type is included in each sub-logic block D4 and D5.

Figure 25:
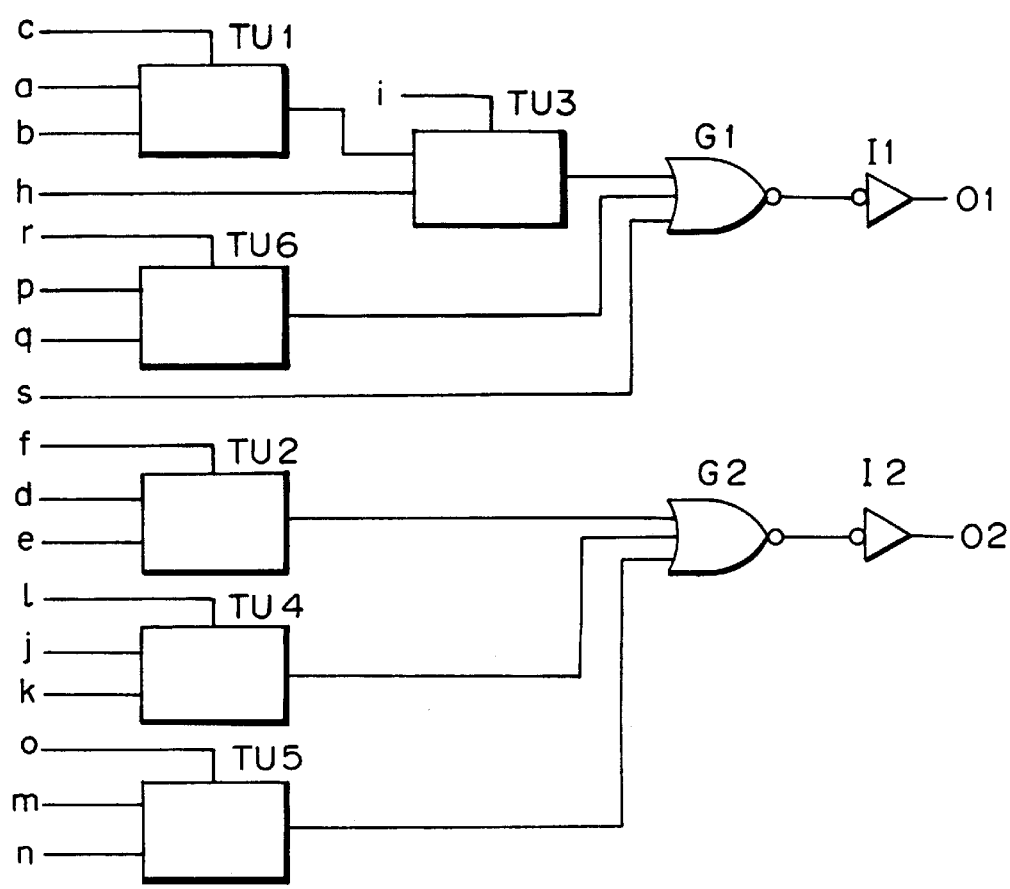
FIG. 25 is a circuit diagram of an example of a logic circuit which can be formed in a programmable logic block having the sub-logic block shown in FIG. 23.

FIG. 25 shows an example of a composite pass transistor logic circuit which can be formed in the programmable logic block including such triple-input NOR gates. In FIG. 25, the output 01 provides the result of the logical operation represented by the expression (10) shown below. In this logical operation up to nine variables, up to two product terms each including up to three variables can be dealt with, and up to three product terms each including up to two variables, and up to one product term including one variable can be expressed.

$$O1 = a \cdot c \cdot i + b \cdot \bar{c} \cdot i + h \cdot \bar{i} + p \cdot r + q \cdot \bar{r} + s \quad (10)$$

In FIG. 25, the output 02 provides the result of the logical operation represented by the expression (11) shown below. In this logical operation up to nine variables can be dealt with, and up to six product terms each including up to two variables can be expressed.

$$O2 = d \cdot f + e \cdot \bar{f} + j \cdot l + k \cdot \bar{l} + m \cdot o + n \cdot \bar{o} \quad (11)$$

Alternatively, the sub-logic block D4 may include a triple-input NAND gate such as that shown in FIG. 11 and the sub-logic block D5 may include a triple-input NOR gate such as that shown in FIG. 23.

Figure 26:
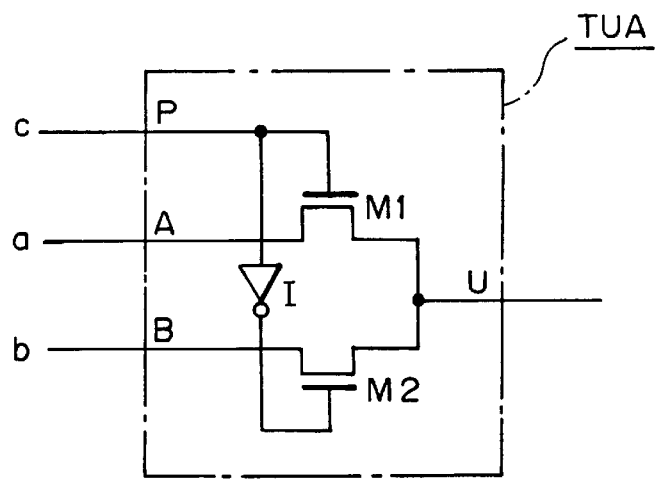
FIG. 26 illustrates an example of a pair pass-transistor element which can be used, instead of the pair pass-transistor element shown in FIG. 13, to form a pass-transistor logic tree.

In the programmable logic block of the above embodiment, the pair pass-transistor elements of the type shown in FIG. 13 are employed as elements for constructing pass-transistor logic trees. This pair pass-transistor element includes two sets of unit pass transistors each including an N channel MOS transistor and a P channel MOS transistor having a smaller size than that of the N channel MOS transistor. However, the present invention is not limited to this configuration. For example, as shown in FIG. 26, the pair pass-transistor element for use in the pass-transistor logic tree may also be configured using only two N channel MOS transistors in such a manner that the drains of the two N channel MOS transistors are coupled. In this case, each N channel MOS transistor serves as a pass transistor. In this case, however, the logical amplitude decreases when a logic signal passes through the pass-transistor logic tree. Therefore, if pass-transistor logic trees are formed with elements of the type shown in FIG. 26 and a composite pass-transistor logic circuit is formed by combining the above pass-transistor logic trees with a multiple-input logic gate such as that shown in FIG. 14, then a large static feedthrough current flows through the multiple-input logic gate, and power consumption increases.

Figure 27:
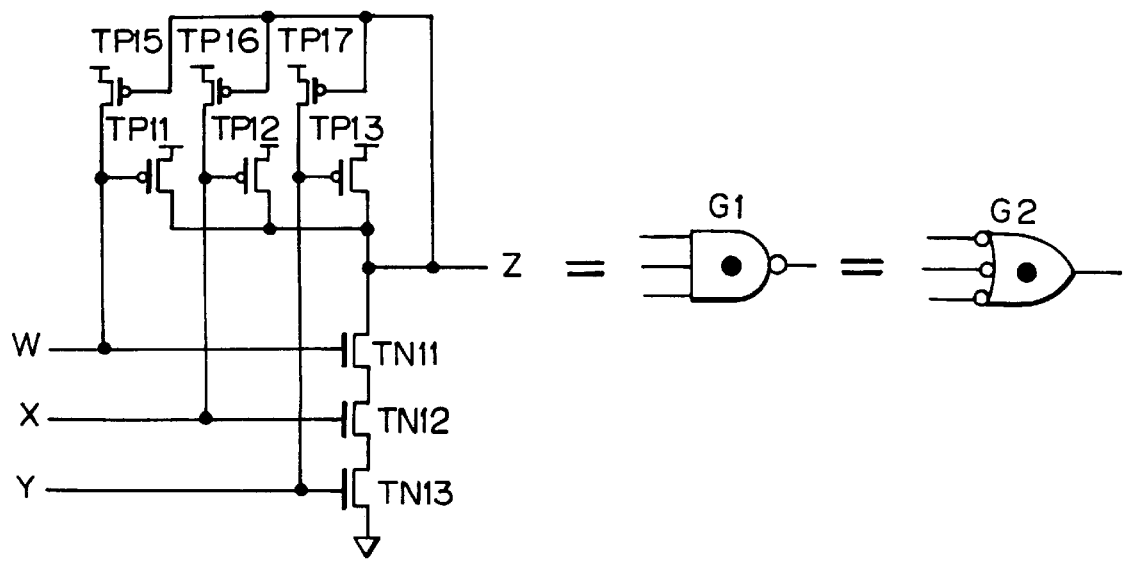
FIG. 27 illustrates a circuit diagram and schematic symbols of a triple-input NAND gate provided with a pull-up circuit.

To avoid the above problem in forming a composite pass-transistor logic circuit by combining the pass-transistor logic trees including the elements of the type shown in FIG. 26 with a multiple-input logic gate, it is preferable to employ a multiple-input logic gate such as that shown in FIG. 27. In the circuit shown in FIG. 27, a triple-input NAND gate is constructed with P channel MOS transistors TP11, TP12, and TP13 and N channel MOS transistors TN11, TN12, and TN13. Furthermore, there are provided P channel MOS transistors TP15, TP16, and TP17 which serve as a pull-up circuit for pulling up the potentials of the intermediate input nodes in response to the output logic signal of the multiple-input NAND gate. More particularly, only when the signal Z is LOW, that is, only when all the intermediate logic signals received by the intermediate input nodes W,X and Y are HIGH, potentials at all the intermediate input nodes are pulled up. Thus, potentials of all the intermediate input nodes are restored in response to the potential of the multiple-input logic gate. As a result, potentials of the intermediate output nodes of all the pass-transistor logic trees that provide the intermediate logic signals to the intermediate input nodes of the triple-input NAND gate are pulled up, or restored. This results in suppression of the static feedthrough current of the multiple-input logic gate.

As disclosed in the co-pending patent application Ser. No. 08/716,883, the above pull-up circuit can operate with less probability of logical collision with the logic circuit in the preceding stage. Thus, the power consumption is reduced compared with the case that a conventional pull-up circuit, which operates in response to the potential of the corresponding intermediate output anode is employed.

However, if the pair pass-transistor elements of the type shown in FIG. 13 are employed as elements to construct the pass-transistor logic trees, the problem of logical collision does not occur, and a further reduction in the power consumption can be achieved. Furthermore, if the pair pass-transistor element shown in FIG. 13 is employed, a stable operation is ensured even when the power supply voltage (=power supply potential-reference potential) becomes as low as about 1 V and the static feedthrough current of the multiple-input logic gate can surely be suppressed. In contrast, in the case of the pull-up circuit shown in FIG. 27, it becomes difficult to suppress the static feedthrough current when the power supply voltage decreases to about 1.5 V or lower. For the above reasons, it is preferable to employ the pair pass-transistor element shown in FIG. 13.

Figure 28:
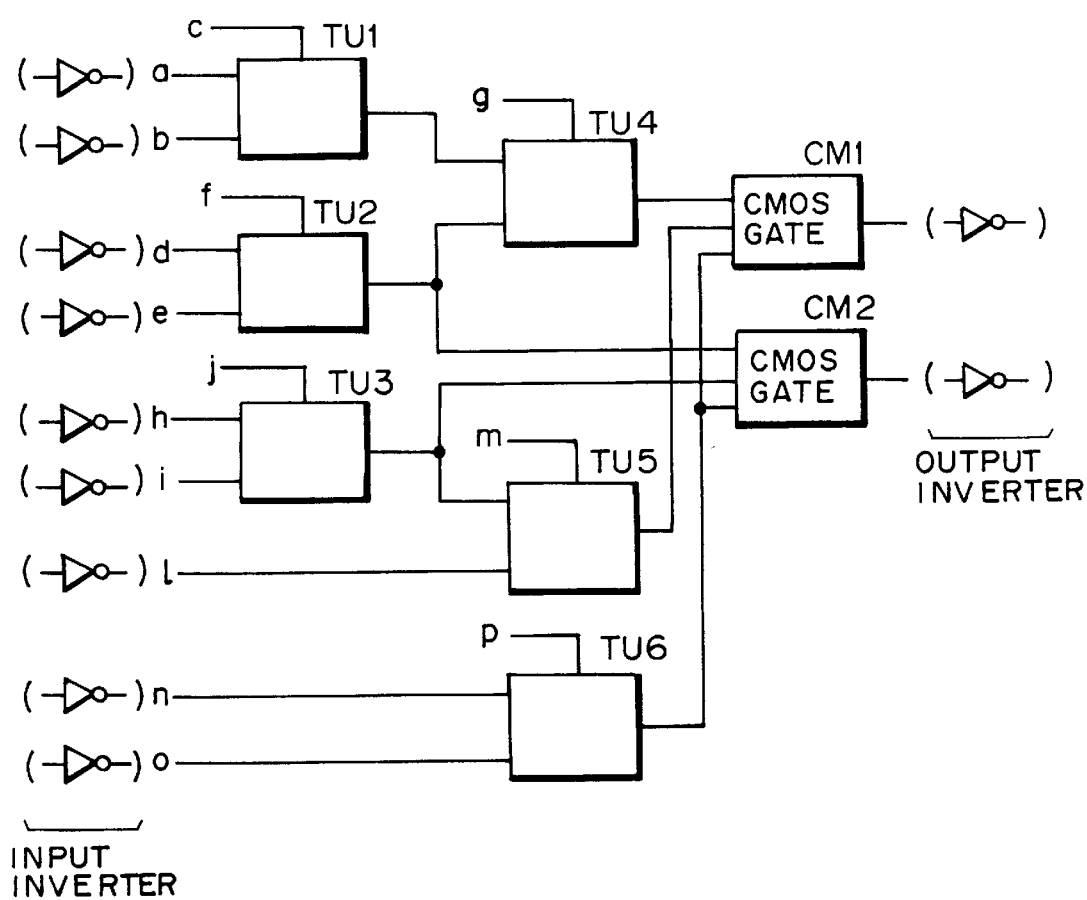
FIG. 28 is a block diagram of an example of a logic circuit which can be formed in a basic cell for use in a mask programmable gate array integrated circuit, according to the present invention.

FIG. 28 is a block diagram illustrating an example of a logic circuit which can be formed in a basic cell of a mask programmable gate array integrated circuit (hereinafter referred to simply as a "gate array") according to the present invention. In FIG. 28, the blocks TU1–TU6 represented by the symbol shown in FIG. 20 are pair pass-transistor elements of the type shown in FIG. 13.

In the present embodiment, various circuit elements such as pair pass-transistor elements may be formed in a basic cell. In the specific example shown in FIG. 28, the maximum allowable number of pair pass-transistor elements and the maximum allowable number of multiple-input CMOS gates are formed in a basic cell. Each pair pass-transistor element TU1–TU6 has the circuit configuration shown in FIG. 13 and thus includes two unit pass transistors and an inverter (gate inverter). In the conventional gate array, a basic cell is generally designed to form logic circuits expressing logical operations including four or five variables. In contrast, the basic cell of the present embodiment can form logic circuits expressing logical operations including up to eighteen variables and can produce two output logic signals. In other words, the basic cell of the present embodiment can express logical operations with a degree of complexity a few times that which can be expressed in a basic cell of the conventional gate array.

More specifically, the base cell of the present embodiment is designed such that up to six pair pass-transistor elements TU1–TU6 and up to two multiple-input CMOS logic gates CM1 and CM2 may be formed in an efficient fashion. Further, if a complex logic circuit which cannot be formed in one basic cell is required in a specific application, a plurality of neighboring basic cells may be used to realize such a complex logic circuit.

SRAMs and other sequential logic circuits are required in many applications. The base cell of the present embodiment can also meet such a requirement.

Figure 29:
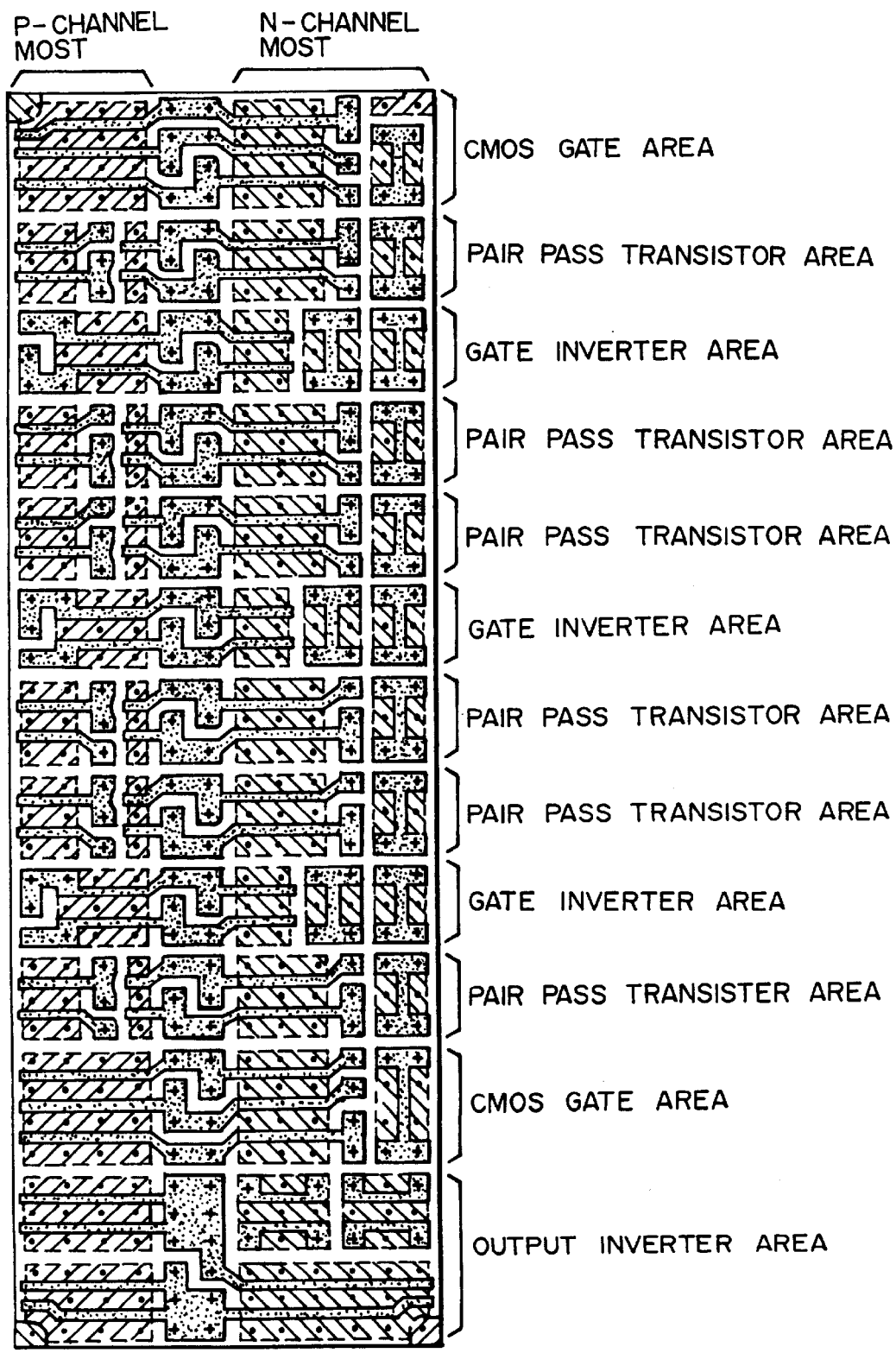
FIG. 29 illustrates an example of a mask layout of a basic cell of a gate array according to the present invention.

FIG. 29 shows an example of a mask layout of the basic cell of the present embodiment. The areas surrounded by broken lines are active areas and the areas surrounded by solid lines are gate areas. The widths of the gate areas on the active areas, that is the gate lengths of the transistors (the length defined on a mask) are substantially equal over the whole cell. Although not shown in FIG. 29, the active areas on the right-hand side of the basic cell are n-type active areas each formed in p-wells. The active areas on the left-hand side of the basic cell are p-type active areas each formed in n-wells. In FIG. 29, each symbol "+" denotes the location where a contact hole for connecting a gate electrode to a metal interconnection may be formed. Similarly, each dot denotes the location where a contact hole for connecting an active area to a metal interconnection may be formed.

The basic cell shown in FIG. 29 includes six pair transistor areas, three gate inverter areas, two CMOS gate areas, and one output inverter area. A pair pass transistor element may be formed using transistors prepared in a pair pass transistor area and transistors prepared in a gate inverter area. A multiple-input logic gate may be formed using transistors prepared in a CMOS gate area. The output inverter is formed using transistors prepared in the output inverter area.

In each pair pass transistor area, there are two N channel MOS transistors which share an area for their source/drain and two P channel MOS transistor which also share another area for their source/drain. In general, the source and drain of a MOS transistor can be replaced by each other. Therefore, two MOS transistors which share the same area for their source/drain can behave as: 1) two transistors in which their sources are coupled; 2) two transistors in which their drains are coupled; or 3) two transistor in which the source of one transistor is connected to the drain of the other. In these transistors, the gate of each of two N channel MOS transistors is connected to the gate of corresponding one of two P channel MOS transistors. The gate width of P channel MOS transistors is smaller than that of N channel MOS transistors. Although the representation of FIG. 29 is not accurate in terms of dimensions, the gate width of P channel MOS transistors is typically ¼ times that of N channel MOS transistors. Two N channel MOS transistors and two P channel MOS transistors may be used to form one pair pass-transistor element. Hereinafter, the term "transistors in a pair pass transistor area" will be used to represent those four transistors. Each pair pass transistor area also includes another two P channel MOS transistors which share the same area for their source/drain, and one N channel MOS transistor. These transistors are used for example to form an inverter, as will be described later. The areas other than the pair pass transistor areas also include similar transistors for forming inverter, as will be described later. These transistors are hereinafter referred to as the "inverter transistors".

In each gate inverter area, there are two N channel MOS transistors which share a source/drain area and two P channel MOS transistors which also share a source/drain area. In these transistors, the gate of each of two N channel MOS transistors is connected to the gate of corresponding one of two P channel MOS transistors. The gate width of P channel MOS transistors is greater than that of N channel MOS transistors. In a typical case, the gate width of P channel MOS transistors is 1.5 times that of N channel MOS transistors. The gate widths of these two N channel MOS transistors are smaller than those of the N channel MOS transistors used to form a pair pass-transistor element. In a typical case, the gate width of the former N channel MOS transistors is ⅔ times that of the latter N channel MOS transistors. These two N channel MOS transistors and two P channel MOS transistors are used to form an inverter I of the two pair pass-transistor elements. Hereinafter, those transistors will be referred to as "transistors in a gate inverter area". Each gate inverter area also includes another two N channel MOS transistors. These two N channel MOS transistors are also refered to as the "inverter transistors". In the present embodiment, each basic cell includes three gate inverter areas. Therefore, up to six gate inverters may be formed in each basic cell, and these six gate inverters may be combined with the transistors in the above-described six pair pass transistor areas to form up to six pair pass-transistor elements.

In each CMOS gate area, there are three N channel MOS transistors which share source/drain areas and three P channel MOS transistors which also share source/drain areas. In these transistors, the gate of each of three N channel MOS transistors is connected to the gate of corresponding one of three P channel MOS transistors. The gate width of P channel MOS transistors is greater than that of N channel MOS transistor. In a typical case, the gate width of P channel MOS transistors is 1.5 times that of N channel MOS transistors. The gate width of these three N channel MOS transistors is substantially equal to that of the N channel MOS transistors used to form a pair pass-transistor element. These three N channel MOS transistors and three P channel MOS transistors are used to form one triple-input CMOS logic gate. Hereinafter, those transistors will be referred to as "transistors in a CMOS gate area". Each CMOS gate area also includes another N channel MOS transistor, which is also referred to as an "inverter transistor". In the present embodiment, each basic cell includes two CMOS gate areas. Therefore, up to two CMOS logic gates may be formed in each basic cell.

In each output inverter area, there are two N channel MOS transistors which share a source/drain area and two sets of two P channel MOS transistors which also share a source/drain area (thus there are two N channel MOS transistors and four P channel MOS transistors). The gates of the two P channel MOS transistors which share the source/drain area are connected to each other. Furthermore, the gates connected in common of the P channel MOS transistors are connected to the gate of one N channel MOS transistor. The sum of the gate widths of the two P channel MOS transistors is 1.5 times that of the N channel MOS transistors. The gate width of the N channel MOS transistors in the output inverter area is greater than that of the N channel MOS transistors in the CMOS gate area. These two N channel MOS transistors and four P channel MOS transistors are used to form one output inverter. Hereinafter, these transistors will be referred to as "transistors in an output inverter area". Each output inverter area also includes another two N channel MOS transistors. These two MOS transistors are also referred to as "inverter transistors".

The output inverter formed in the output inverter area has a large transistor size (or a large W/L ratio) so that they have a larger driving capacity than the multiple-input CMOS logic gates. That is, these output inverters have a large enough driving capacity to drive a long cell-to-cell interconnection with a large parallel capacitance. In the present embodiment, up to two output inverters may be formed in each basic cell.

In the present embodiment, the inverter formed in a gate inverter area may be used not only to form a pair pass-transistor element but also for other purposes. For example, the inverter may be used as an inverter (input inverter) for inverting a signal to be applied to a pass-transistor logic tree. As will be described later, an inverter is also required in a D-type flip-flop or an SRAM cell. In the present embodiment, in addition to the above-described six inverters in the gate inverter areas, twelve inverters may be formed using the inverter transistors in each basic cell.

In the gate array of the present embodiment, basic cells having the layout shown in FIG. 29 and basic cells having a mirror-inverted layout are alternately arranged in both horizontal and vertical directions, thereby forming a core of the gate array.

Figure 30:
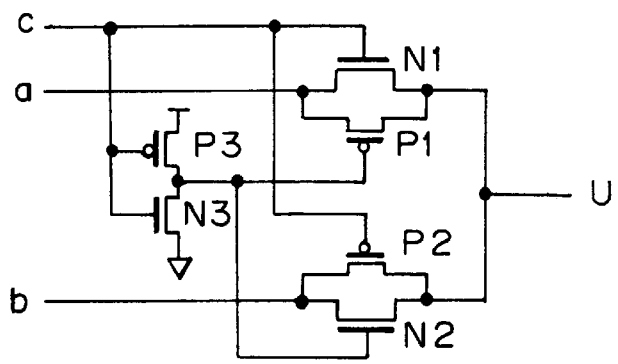
FIGS. 30 and 31 illustrate a circuit diagram and interconnections of a pair pass transistor element formed using the basic cell shown in FIG. 29.
Figure 31:
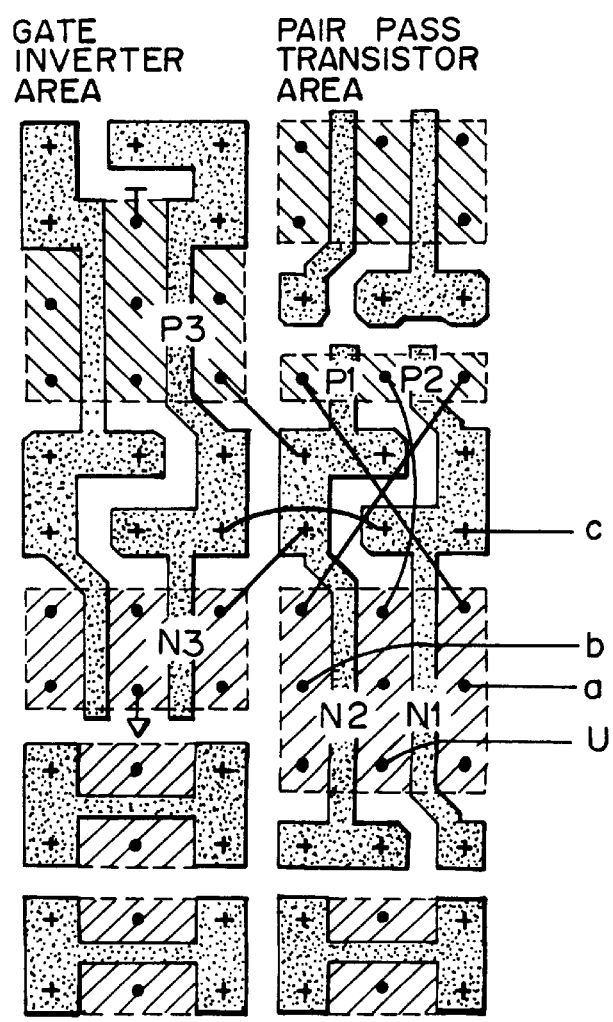

FIG. 30 is a circuit diagram of a pair pass-transistor element formed using the basic cell shown in FIG. 29. FIG. 31 illustrates the layout pattern of the pair pass-transistor element formed by making metal interconnections on the basic cell shown in FIG. 29. In FIG. 31, the symbols denoting the respective transistors correspond to those used in the circuit diagram shown in FIG. 30. The solid lines in FIG. 31 represent the metal interconnections.

As shown in FIG. 31, this pair pass-transistor element is constructed with two N channel MOS transistors and two P channel MOS transistors in a pair pass transistor area and one N channel MOS transistor and one P channel MOS transistor in a gate inverter area. In this pair pass-transistor element, the inverter formed with the P channel MOS transistor P3 and the N channel MOS transistor N3 in the gate inverter area is used to provide a logic signal to the gates of the transistors in the same basic cell, and thus this inverter is not needed to have a large driving capacity. Therefore, the size of the transistor N3 may be smaller than that of the N channel MOS transistor Ni which is used as a pass transistor. On the other hand, it is desirable that the P channel MOS transistor P3 have a size greater than that of N3 so that it has a driving capacity similar to that of N3.

In the pair pass-transistor element shown in FIG. 31, the P channel MOS transistor and the N channel MOS transistor located in the left-hand half of the gate inverter area are not used. In the basic cell of the present embodiment, as shown in FIG. 29, pair pass transistor areas are located at either side of each gate inverter area. Those transistors in the left-hand half of the gate inverter area and which are not used in the above-described pair pass transistor element may be used as a gate inverter in a pair pass-transistor element which may be formed using the transistors in the pair pass transistor area which is not shown in FIG. 31 but is present at the opposite side of the gate inverter area.

Figure 32:
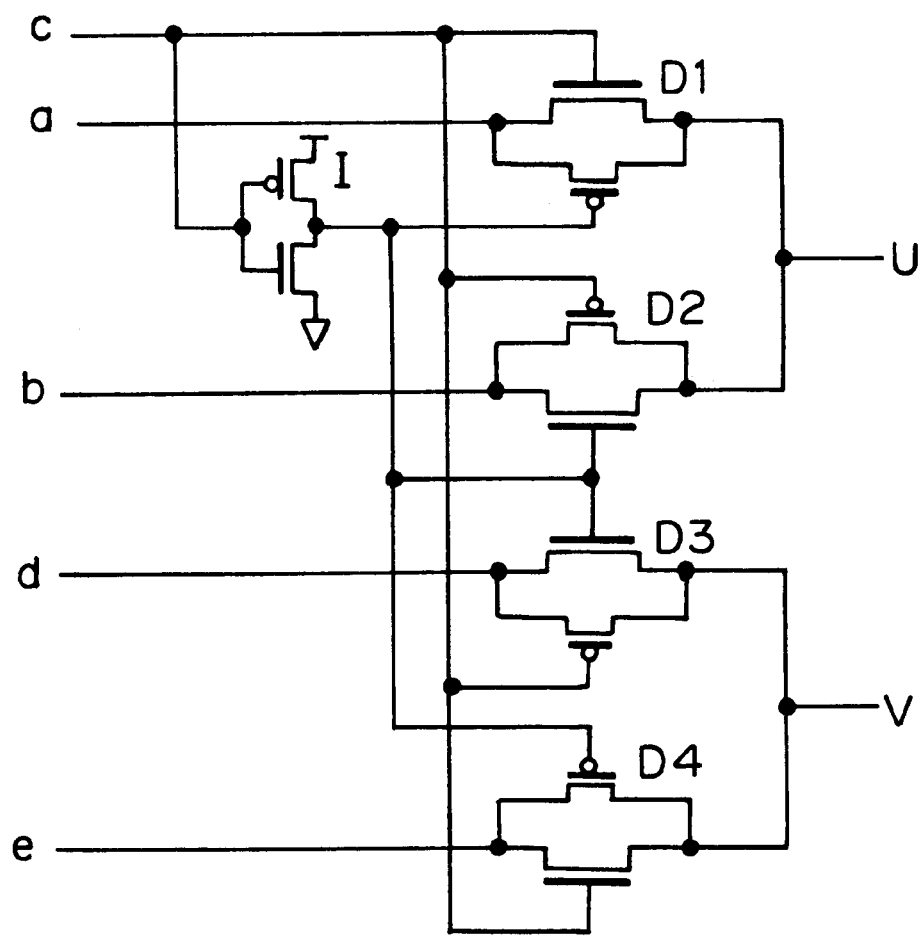
FIG. 32 is a circuit diagram of two pair pass transistor elements formed using the basic cell shown in FIG. 29.

As described above, the basic cell shown in FIG. 29 includes transistors which may be used to form up to six pair pass-transistor elements each including, as shown in FIG. 13, two unit pass transistors and one inverter. In practice, however, all pair pass-transistor elements do not have to have their own inverter. FIG. 32 illustrates an example in which two pair pass transistor elements are formed using the basic cell shown in FIG. 29. In this example, one inverter is shared by two pair pass transistor elements. Therefore, half of the transistors in one gate inverter area remain unused. These transistors may be used for other purposes.

In the present embodiment, the basic cell shown in FIG. 29 is designed such that up to six pair pass-transistor elements can be formed therein. In the gate array of the present invention, however, the maximum number of pair pass-transistor elements which can be formed in one basic cell is not limited to six. For example, the maximum possible number may be smaller than six. However, it is desirable that two full dual-stage pass-transistor logic trees can be formed in one basic cell and thus it is desirable that six pair pass-transistor elements can be formed in one basic cell. Conversely, if the base cell is designed such that a very large number of pair pass-transistor elements can be formed, then a large number transistors will remain unused in practical applications. Thus, the suitable number of available pair pass-transistor elements is six to ten.

Figure 33:
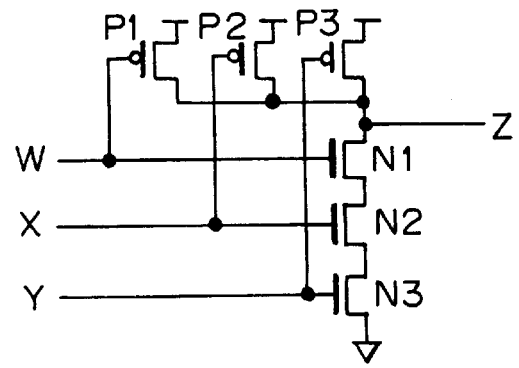
FIGS. 33, 34, 35, and 36 illustrate circuit diagrams and interconnections of two kinds of multiple-input logic gates formed using the basic cell shown in FIG. 29.
Figure 35:
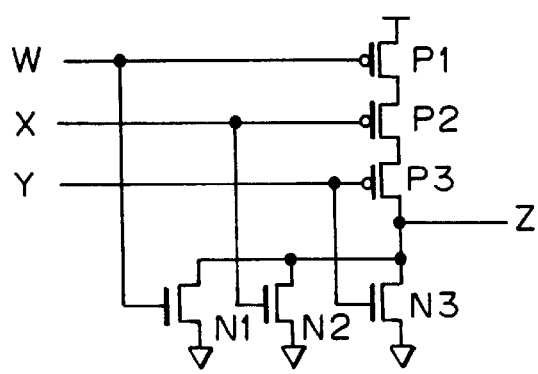

FIGS. 33 and 35 show two examples of multiple-input CMOS logic gates formed using the basic cell shown in FIG. 29.

Figure 34:
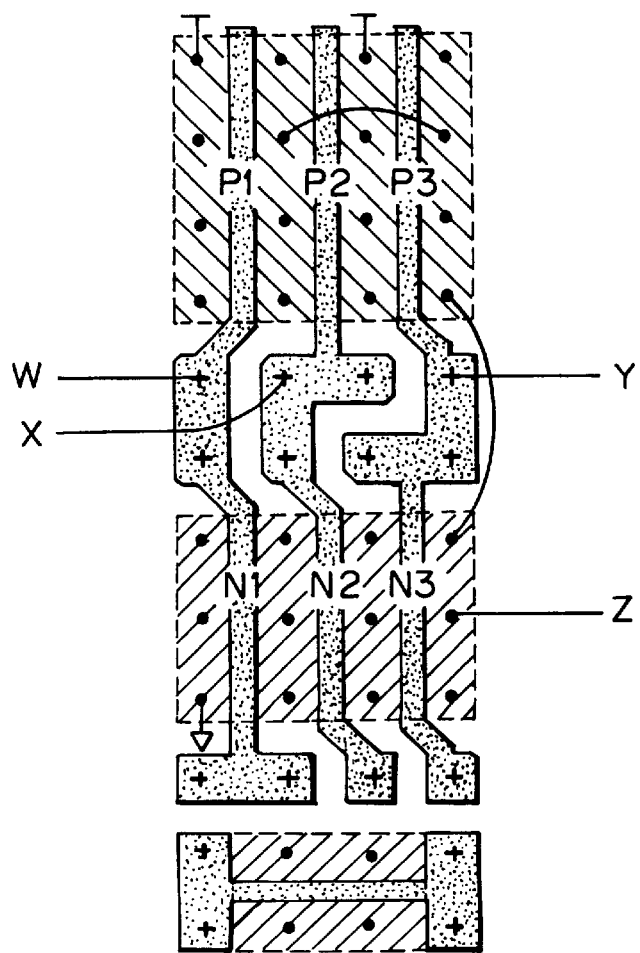

In the example shown in FIG. 33, a triple-input NAND gate is formed. This triple-input NAND gate can be formed by making metal interconnections in a CMOS gate area as shown in FIG. 34. In FIG. 34, the symbols denoting the respective transistors correspond to those used in the circuit diagram shown in FIG. 33, and symbols W, X, Y, and Z in FIG. 34 correspond to similar symbols used in the circuit diagram. The solid lines in FIG. 34 represent the metal interconnections.

Figure 36:
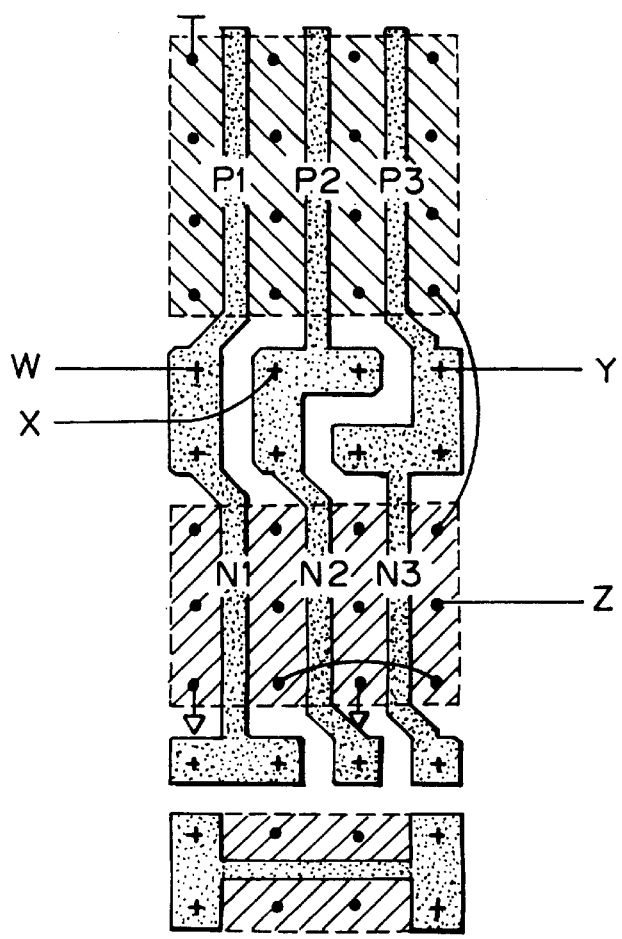

In the example shown in FIG. 35, a triple-input NOR gate is formed. This triple-input NOR gate can be formed by making metal interconnections in a CMOS gate area as shown in FIG. 36.

As shown in FIGS. 33–36, the multiple-input logic gate formed in the basic cell of the present embodiment can have up to three intermediate input nodes. Of course, a logic gate having two intermediate input nodes such as a dual-input NAND gate or a dual-input NOR gate may also be formed if three intermediate input nodes are not necessary.

In the case where the logic signal is transmitted to a logic circuit formed in a neighboring base cell, the interconnection required is short and thus the interconnection has a small parallel capacitance. Therefore, a large driving capacity is not required. On the other hand, when the logic signal is transmitted to a logic circuit formed in a distant base cell, the interconnection has a large parallel capacitance. In this case or in the case where the fan-out number is large, a large driving capacity is required. If the multiple-input CMOS logic gates themselves are required to have such a high driving capacity, then the transistors in the CMOS gate regions have to have a very large size. The basic cell shown in FIG. 29 includes two CMOS gate areas each including three N channel MOS transistors and three P channel MOS transistors used to form a multiple-input CMOS gate. Thus, each base cell has twelve transistors for forming two multiple-input CMOS gates. To give a large driving capacity to these multiple-input CMOS gates, all the twelve transistors should have a large size. This results in a great increase in the area of the basic cell. In both the multiple-input NAND gate and the multiple-input NOR gate, either the N channel MOS transistors or the P channel MOS transistors are connected in series. If this is taken into account, the sizes of the transistors should be further greater or the multiple-input logic gates cannot have a sufficient driving capacity. To avoid above problem, the basic cell of the present embodiment is designed such that output drivers having a large driving capacity and capable of being used in conjunction with the multiple-input CMOS logic gates may be formed. Thus, in the present embodiment, the sizes of the MOS transistors used to form multiple-input CMOS logic gates are small but still greater than a lower limit to have the ability of driving short interconnections to the neighboring basic cells. When a large driving capacity is required, an output inverter is combined with the multiple-input CMOS gate. This technique allows a reduction in the size of the basic cell.

Figure 37:
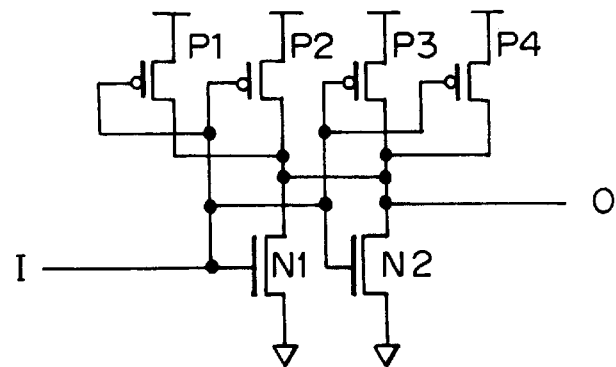
FIGS. 37 and 38 illustrate a circuit diagram and interconnections of an output inverter formed using the basic cell shown in FIG. 29.
Figure 38:
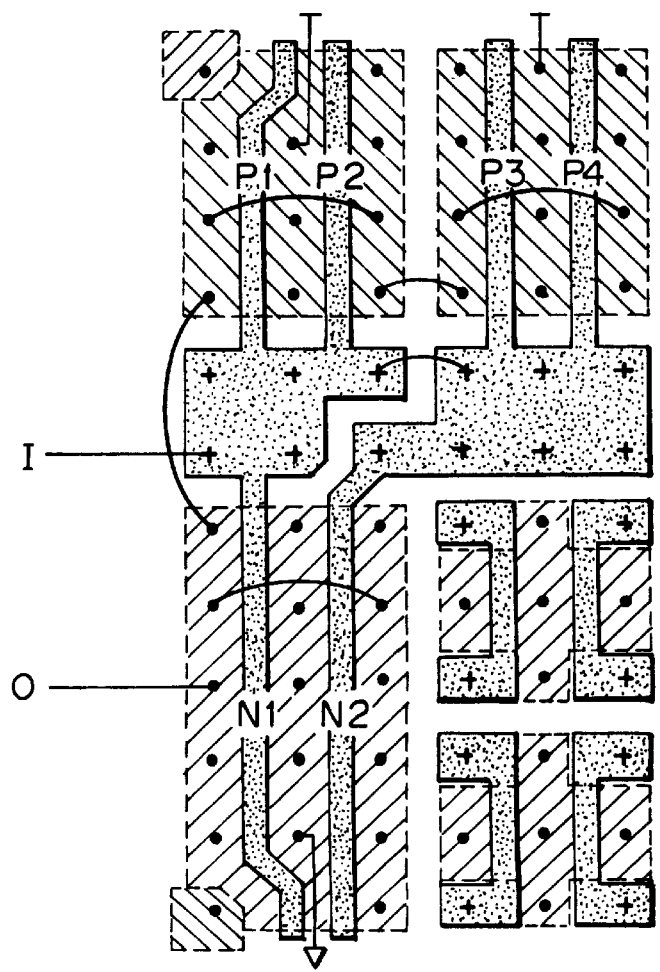

FIG. 37 is a circuit diagram of an output inverter which can be formed using the basic cell of the present embodiment. This output inverter can be formed by making metal interconnections on an output inverter area as shown in FIG. 38. In FIG. 38, the symbols denoting the respective transistors correspond to the symbols used in the circuit diagram shown in FIG. 37. Symbols I and O in FIG. 38 correspond to similar symbols used to denote the nodes in the circuit diagram of FIG. 37. As described above, the sizes (or the W/L ratios) of the N channel MOS transistors N1 and N2 used in the output inverter are greater than the sizes of the N channel MOS transistors used to form the CMOS logic gates. As for the P channel MOS transistors, two transistors P1 and P2 are connected in parallel and another two transistors P3 and P4 are connected in parallel so that the overall P channel MOS transistors can act as a large-size transistor. As a result, the output inverter formed using such large-sized N and P channel MOS transistors has a larger driving capacity than the multiple-input logic gates formed with transistors located in the CMOS gate areas. More specifically, its driving capacity is 4 to 12 times that of a multiple-input logic gate. In the specific example shown in FIGS. 37 and 38, one output inverter is formed using two N channel MOS transistors and four P channel MOS transistors. Alternatively, two output inverters may also be formed using one N channel MOS transistor and two P channel MOS transistors for each output inverter. In this case, each output inverter has a driving capacity 2 to 6 times that of a multiple-input CMOS logic gate.

Figure 39:
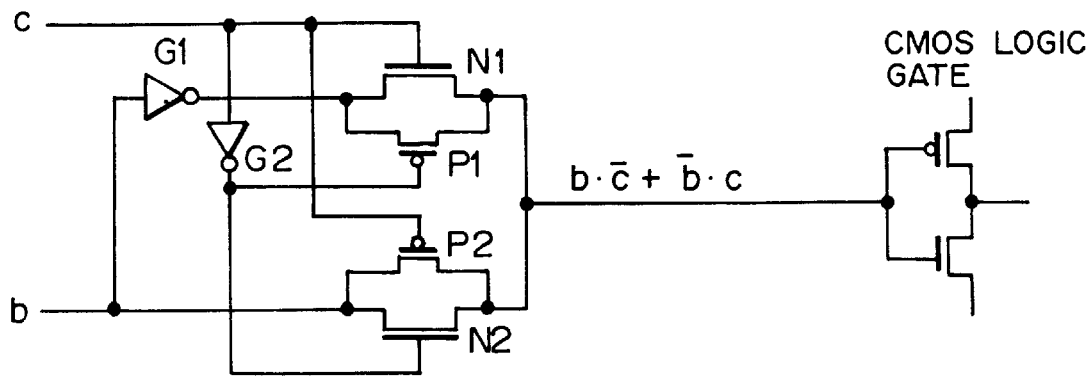
FIG. 39 is a circuit diagram illustrating a part of a logic circuit formed using the basic cell shown in FIG. 29.

FIG. 39 is a circuit diagram partially showing a logic circuit which can be formed using the basic cell shown in FIG. 29. In FIG. 39, the part of the circuit labelled "CMOS LOGIC GATE" is a part of, for example, a dual-input NAND gate. In the circuit shown in FIG. 39, a logic signal b is applied to the input terminal of the unit pass transistor including N channel MOS transistor N2. The logic signal b is inverted by the inverter G1 and is applied to the input terminal of the unit pass transistor including N channel MOS transistor N1. Thus, logic signals which are complementary are input to the respective input terminals of the two unit pass transistors constituting a pair pass-transistor element. In many practical logic circuits, such complementary signals are often required. One possible technique to meet such requirement is to form an inverter which can produce complementary signals in the basic cell in which a logic circuit in the preceding stage is formed, and transmit the both signals which are complementary to each other via interconnections between different basic cells. However, this technique results in an increased number of interconnections, which leads to an increased interconnection area. Instead, in the present embodiment, complementary signals are produced by an input inverter provided in a basic cell. In this case, only one logic signal needs to be transmitted between different basic cells, since a signal complementary to the received logic signal is produced in the receiving base cell. This allows a reduction in the area required for interconnections.

As described above, there are as many as inverter transistors in the basic cell shown in FIG. 29 as required to form up to twelve inverters in addition to the gate inverters. Therefore, each of six pair pass-transistor elements formed in the basic cell can have two input inverters, although it is rare that all these inverters are actually used as input inverters in practical applications. If there are some remaining inverters, they may be used for other purposes.

Figure 40:
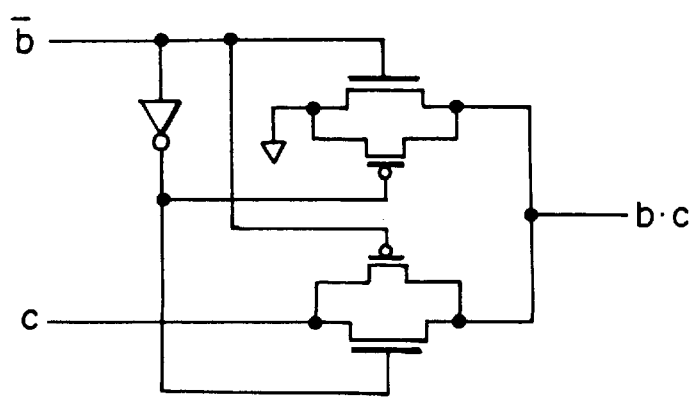
FIG. 40 is a circuit diagram of an example of a pair pass transistor element formed using the basic cell shown in FIG. 29.

Careless use of an input inverter causes an increase in signal delay and also an increase in power consumption. Therefore, it is desirable that the number of input inverters should be minimized. By way of example, it is assumed here that logic signals c and $\bar{b}$ are received from a logic circuit in the preceding stage and a logical operation b·c is performed. In this case, as shown in FIG. 40, if the logic signal c is applied to the input terminal of one unit pass transistor of a pair pass-transistor element and the logic signal $\bar{b}$ is applied to the control terminal of another unit pass transistor in the same pair pass-transistor element, the result of the logical operation b·c is provided at the output of the pair pass-transistor element without having to use an input inverter for generating a logic signal b from $\bar{b}$.

Figure 41:
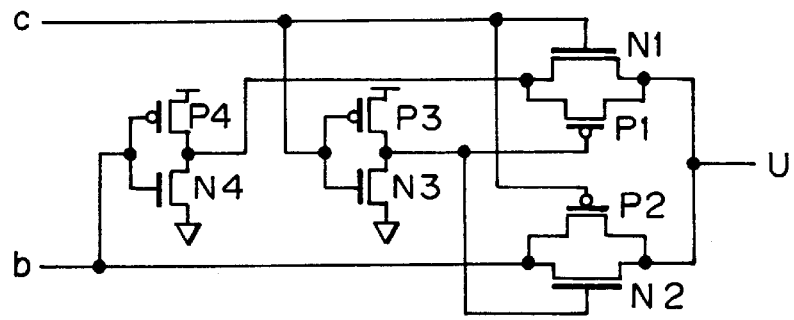
FIGS. 41 and 42 illustrate a circuit diagram and interconnections of an example of an exclusive OR gate formed using the basic cell shown in FIG. 29.

FIG. 41 is a circuit diagram of an exclusive OR logic circuit which can be formed using the basic cell shown in FIG. 29. In this example, the exclusive OR logic circuit is formed using one pair pass-transistor element including two unit pass transistors and one gate inverter and also using one input inverter including a P channel MOS transistor P4 and an N channel MOS transistor N4.

Figure 42:
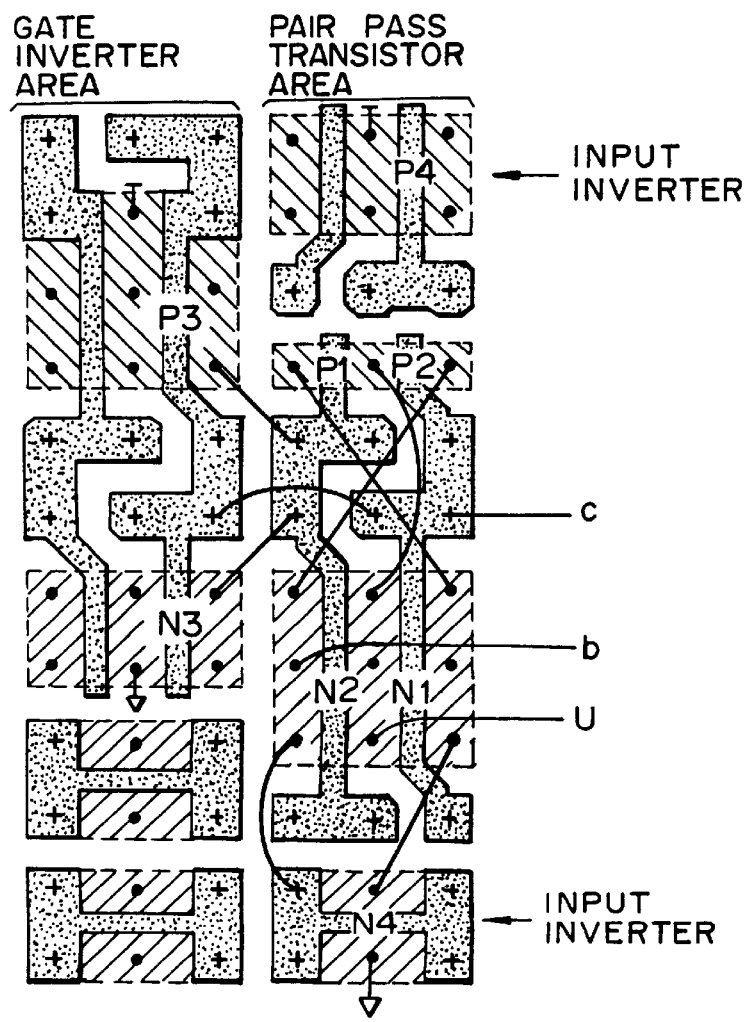

The exclusive OR logic circuit shown in FIG. 41 can be formed by making metal interconnections on a pair pass transistor area and a gate inverter area as shown in FIG. 42. The solid lines in FIG. 42 represent the metal interconnections. In FIG. 42, the symbols denoting the respective transistors correspond to the symbols in the circuit diagram of FIG. 41. The symbols c, b, and U in FIG. 42 correspond to the similar symbols used in the circuit diagram. As shown, the input inverter is formed using the inverter transistors in the pair pass transistor area. As can be seen from FIG. 42, the size of the N channel MOS transistor, N4 used in the input inverter is smaller than the sizes of the N channel MOS transistors N1 and N2 used as the pass transistors. Since this input inverter is used only to transmit a signal to a transistor located in the same basic cell, the input inverter does not need to have a large driving capacity. Therefore, the input inverter formed using the small-size transistor and having a small driving capacity can fulfill the assigned role.

Digital logic circuits are generally classified as combinational logic circuits and sequential logic circuits. Combinational logic circuits can be realized using a composite pass transistor logic circuit formed with pass transistor logic trees and a multiple-input logic gate. On the other hand, sequential logic circuits need other types of circuits such as a flip-flop; register, and counter. Although the layout of the basic cell shown in FIG. 29 is designed primarily to efficiently realize composite pass-transistor logic circuits, the basic cell can also be used to realize a sequential logic circuit and thus the basic cell shown in FIG. 29 can be used as a basic cell for use in general-purpose gate arrays for realizing various logic LSIs.

Figure 43:
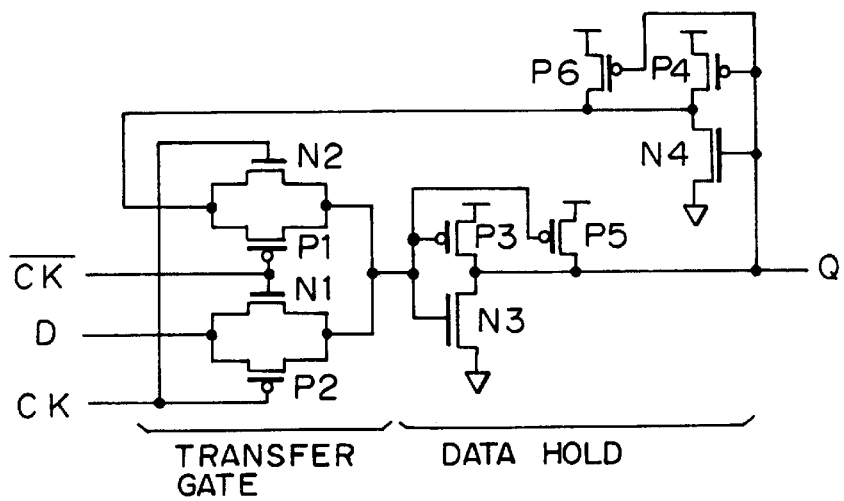
FIGS. 43 and 44 illustrate a circuit diagram and interconnections of an example of a D-type flip-flop formed using the basic cell shown in FIG. 29.
Figure 44:
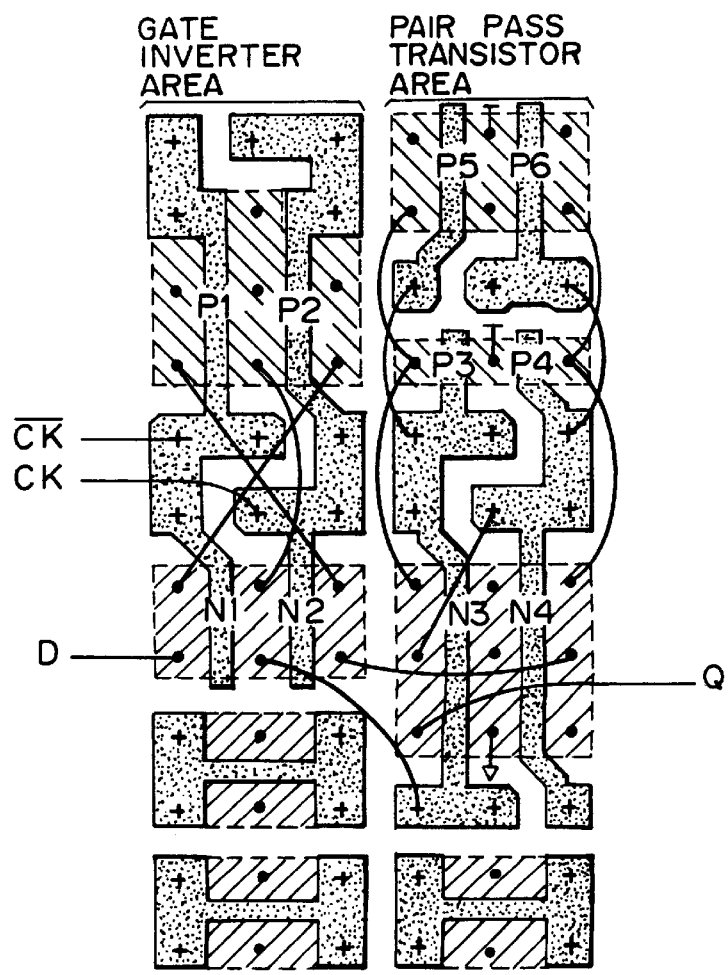

FIG. 43 is a circuit diagram illustrating an example of a D-type flip-flop formed using the basic cell shown in FIG. 29. This D-type flip-flop is formed, as shown in FIG. 44, using transistors prepared in a pair transistor area and gate inverter area. More specifically, a data hold circuit of the D-type flip-flop is constructed using transistors in a pair pass transistor area and a transfer gate is constructed using transistors in a gate inverter area. In the above construction of the D-type flip-flop, the P channel MOS transistors P5 and P6 are connected in parallel with the P channel MOS transistors P3 and P4, respectively, in the data hold circuit so that the small driving capacities of the small-sized P channel MOS transistors P3 and P4 are reinforced by the P channel MOS transistors P5 and P6 thereby increasing the operating speed. The transfer gate constructed with the N channel MOS transistors Ni and N2 and the P channel MOS transistors P1 and P2 in the gate inverter area has a circuit configuration similar to that of the pair pass-transistor element shown in FIG. 13. However, in the transfer gate shown in FIG. 43, as opposed to the circuit shown in FIG. 13, the sizes of the P channel MOS transistors are larger than those of the N channel MOS transistors. Thus, the transfer gate has a high driving capacity to shorten the rise-time of signals.

A D-type flip-flop may also be constructed using transistors in the basic cell shown in FIG. 29 other than those used in the above D-type flip-flop shown in FIGS. 43 and 44. For example, transistors in a CMOS gate area may be used to construct a data hold circuit, and a transfer gate may be constructed using a combination of transistors including inverter transistors in a pair pass transistor area. It is also possible to construct a D-type flip-flop using transistors including inverter transistors in two pair pass transistor areas. In this case, a data hold circuit may be constructed using N channel and P channel MOS transistors prepared for use as pair pass-transistor elements and inverter transistors in one pair pass transistor area, and a transfer gate may be constructed using N channel and P channel MOS transistors prepared for use as pair pass-transistor elements and inverter transistors in another pair pass transistor area.

In general, an inverted clock signal CK which is an inversion of a clock signal CK is used in common in a plurality of sequential logical circuits. To avoid the problem of skew, it is desirable that the inverted clock signal be produced using an inverter having a large driving capacity. To this end, an output inverter in the basic cell may be employed.

Up to six similar D-type flip-flops may be formed in one basic cell shown in FIG. 29. D-type flip-flops are fundamental elements in sequential logic circuits. Registers, counters, and other circuits may be constructed using a plurality of D-type flip-flops. As described above, the basic cell shown in FIG. 29 may be used to form not only combinational logic circuits but also sequential logic circuits in an efficient fashion.

Figure 45:
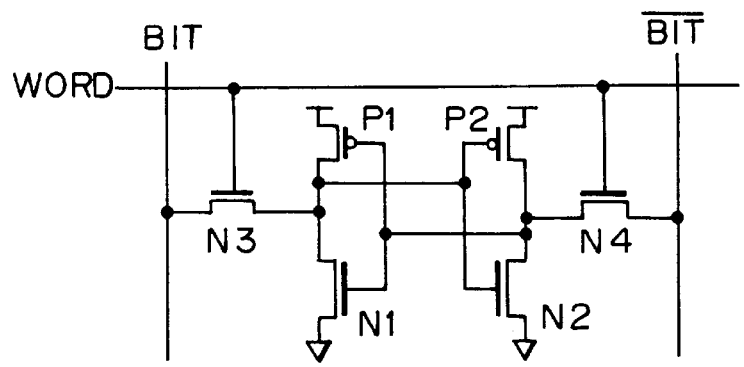
FIGS. 45 and 46 illustrate a circuit diagram and interconnections of an example of an SRAM cell formed using the basic cell shown in FIG. 29.
Figure 46:
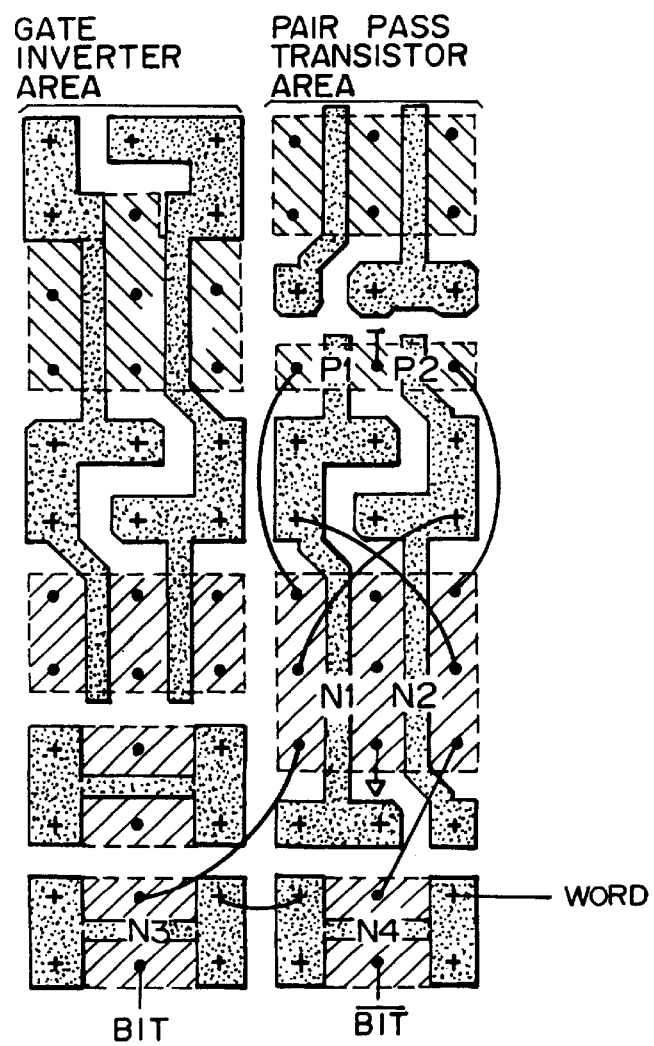

FIG. 45 is a circuit diagram illustrating an example of an SRAM cell formed using the basic cell shown in FIG. 29. This SRAM cell can be constructed using a pair pass transistor area and a gate inverter area in the basic cell as shown in FIG. 46. With the increasing integration density of integrated circuits, it has become popular to integrate a memory in a gate array. Thus in gate arrays, it is required that not only digital circuits but also SRAM can be formed in a basic cell. The SRAM cell shown in FIGS. 45 and 46 is constructed such that the following requirements are met.

(1) The conductance of N channel MOS transistors N1 and N2 should be greater than that of N channel MOS transistors N3 and N4 to achieve a stable reading operation.

(2) The conductance of N channel MOS transistors N3 and N4 should be greater than that of P channel MOS transistors P1 and P2 to achieve a stable writing operation of "0"s.

As can be seen from the layout shown in FIG. 46, the N channel MOS transistors prepared for use as pair pass-transistor element in a pair pass transistor area are employed as the N channel MOS transistors N1 and N2, and the P channel MOS transistors prepared for use as pair pass-transistor element in the pair pass transistor area are employed as the P channel MOS transistors P1 and P2. On the other hand, the N channel MOS transistors prepared for use as inverters in the pair pass transistor area and in a gate inverter area are employed as the N channel MOS transistors N3 and N4. A 6-bit SRAM cells may be formed using the basic cell shown in FIG. 29.

The procedure of forming a composite pass-transistor logic circuit using the basic cell will be described below.

(1) Taking into account the logical operation to be expressed, the number of pass-transistor logic trees, the number of stages of each pass-transistor logic tree, the number of input inverters, the type of the multiple-input logic gate (for example NAND or NOR), and the number of intermediate input nodes of the multiple-input logic gate are determined.

(2) In accordance with the design given in the above step (1), transistors used to form pair pass-transistor elements are selected from the transistors in the pair pass transistor areas and the gate inverter areas. Interconnections among the selected transistors are made so that a required number of pass-transistor logic trees with a required number of stages are formed.

(3) In accordance with the design given in the above step (1), transistors used to form a required number of input inverts are selected and interconnections among the selected transistors are made thereby forming the input inverters. The obtained inverters are connected to the desired input nodes of the pass-transistor logic trees formed in the step (2).

(4) In accordance with the design given in the above step (1), transistors used to form a multiple-input logic gate are selected from the transistors in a CMOS gate area and interconnections among the selected transistors are made thereby forming the multiple-input logic gate.

(5) The intermediate output nodes of the respective pass-transistor logic trees are connected to the corresponding intermediate input nodes of the multiple-input logic gate. Thus, a composite pass-transistor logic circuit including a plurality of pass-transistor logic trees and a multiple-input logic gate can be formed.

Several examples of composite pass-transistor logic circuits which can be formed using the basic cell of the present embodiment will be described below.

Figure 47:
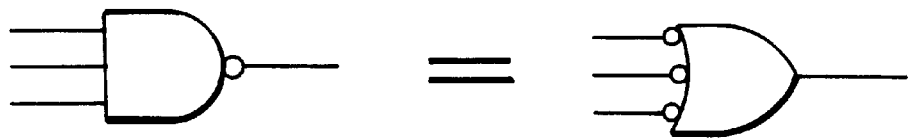
FIGS. 47, 48, and 49 illustrate schematic symbols of a triple-input NAND gate, a dual-input NAND gate, and a dual-input NOR gate, respectively.
Figure 48:
Figure 49:
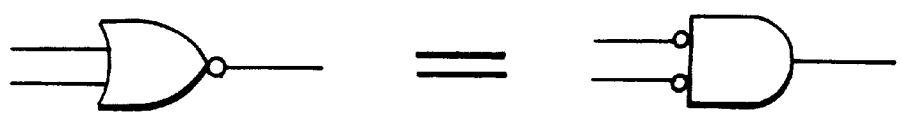

Hereinafter, the triple-input NAND gate shown in FIG. 33 is denoted by the symbols shown in FIG. 47. Similarly, the dual-input NAND gate is denoted by the symbols shown in FIG. 48, and the dual-input NOR gate is denoted by the symbols shown in FIG. 49. In the examples described below, each circuit can be realized using one basic cell unless otherwise stated.

Figure 50:
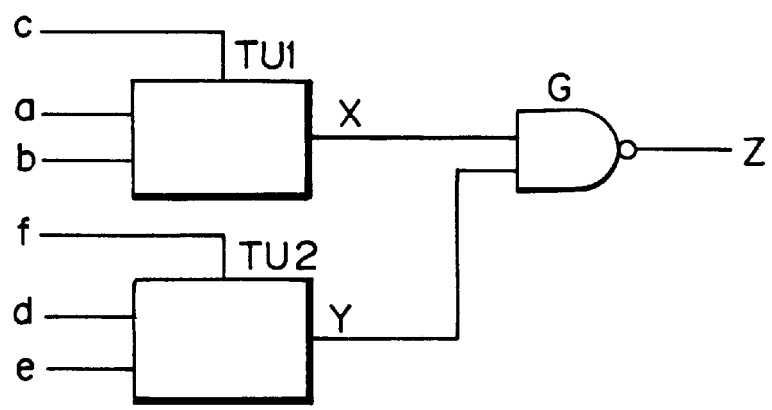
FIGS. 50, 51, 52, 53, 54, 55, 56, and 57 are circuit diagrams illustrating examples of composite pass-transistor logic circuits which can be formed using the basic cell shown in FIG. 29.

FIG. 50 is a circuit diagram of a composite pass-transistor logic circuit having two single-stage pass-transistor logic trees. In this circuit, a pair pass-transistor element TU1 forms a first pass-transistor logic tree. In this first pass-transistor logic tree, one control terminal and two input terminals, and thus three terminals in total, may be used as input nodes. When logic signals a, b, and c are applied to the respective input nodes, the logical operation shown below is performed and the result is given as an intermediate logic signal X:

$$X = a \cdot c + b \cdot \bar{c} \qquad (12)$$

A part of the logic signals a, b, and c or all these logic signals are input logic signals which are produced, for example, by a logic circuit in the preceding stage and transmitted via interconnections to the logic circuit shown in FIG. 50. However, all signals a, b, and c are not necessarily input logic signals. Some input node may be connected, for example, to the first or second power supply means so that a logic signal fixed to either HIGH or LOW state is received. It is preferable, however, that each pass transistor logic tree receive at least two input logic signals. For example if the logic signals c and a, or c and b, are input logic signals, that is, if one input logic signal is applied to the control terminal of the pair pass-transistor element and the other input logic signal is applied to either one of the two input terminals, then the pass-transistor logic tree performs a logical operation including a product term containing these two input logic signals.

When the pass transistor logic tree performs a logical operation including a product term containing input logic signals, various logical operations can be expressed in an efficient manner by means of a combination of pass-transistor logic trees and a multiple-input logic gate.

On the other hand, in the logic circuit shown in FIG. 50, a second pass-transistor logic tree is formed with a pair pass-transistor element TU2. This second pass-transistor logic tree performs a logical operation represented by the expression (13) shown below on the logic signals d, e, and f, and provides the result as an intermediate logic signal Y.

$$Y = d \cdot f + e \cdot \bar{f} \qquad (13)$$

In the circuit shown in FIG. 50, a dual-input NAND gate G is employed as the multiple-input logic gate. This NAND gate G receives, at its respective intermediate input nodes, the intermediate logic signals X and Y output by the first and second pass transistor logic trees. The NAND gate G performs a logical operation represented by the expression (14) shown below on the intermediate logic signals X and Y, and provides the result as an output logic signal Z.

$$Z=\overline{X \cdot Y}=\bar{X}+\bar{Y} \qquad (14)$$

Therefore, as a whole, the circuit shown in FIG. 50 performs a logical operation represented by the expression (15) shown below on the logic signals a through f, and provides the result as an output logic signal Z.

$$Z=\overline{a \cdot c+b \cdot \bar{c}} \cdot \overline{d \cdot f+e \cdot \bar{f}}=\bar{a} \cdot c+\bar{b} \cdot \bar{c}+\bar{d} \cdot f+\bar{e} \cdot \bar{f} \qquad (15)$$

If negative logic is employed for the output logic signal, then the above logical operation becomes as follows:

$$\bar{Z}=(a \cdot c+b \cdot \bar{c}) \cdot (d \cdot f+e \cdot \bar{f})=a \cdot c \cdot d \cdot f+a \cdot c \cdot e \cdot \bar{f}+b \cdot \bar{c} \cdot d \cdot f+b \cdot \bar{c} \cdot e \cdot \bar{f} \qquad (16)$$

As can be seen from the expressions (15) and (16), the circuit shown in FIG. 50 can deal with up to six variables or six logic signals a through f. When positive logic is employed for the output logic signal, the circuit can perform a logical operation including up to four product terms each including up to two variables. On the other hand, if negative logic is employed for the output logic signal, the circuit can perform a logical operation including up to four product terms each including up to four variables.

Figure 51:
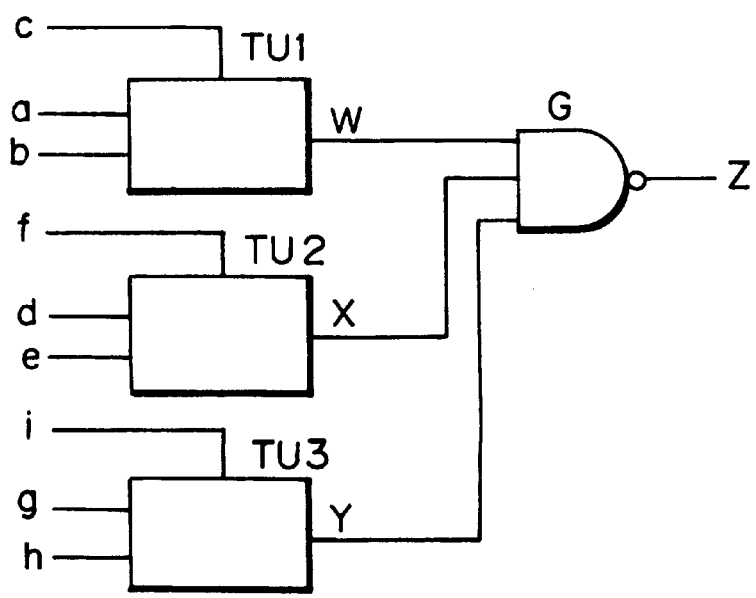

FIG. 51 is a circuit diagram of a composite pass-transistor logic circuit having three single-stage pass-transistor logic trees. In this circuit, a first pass-transistor logic tree is formed with a pair pass-transistor element TU1. This first pass-transistor logic tree performs a logical operation represented by the expression (17) shown below on the logic signals a, b, and c, and provides the result as an intermediate logic signal W.

$$W=a \cdot c+b \cdot \bar{c} \qquad (17)$$

On the other hand, a second pass-transistor logic tree is formed with a pair pass-transistor element TU2. This second pass-transistor logic tree performs a logical operation represented by the expression (18) shown below on the logic signals d, e, and f, and provides the result as an intermediate logic signal X.

$$X=d \cdot f+e \cdot \bar{f} \qquad (18)$$

Furthermore, a third pass-transistor logic tree is formed with a pair pass-transistor element TU3. This third pass-transistor logic tree performs a logical operation represented by the expression (19) shown below on the logic signals g, h, and i, and provides the result as an intermediate logic signal Y.

$$Y=g \cdot i+h \cdot \bar{i} \qquad (19)$$

The above intermediate logic signals W, X, and Y output by the first, second, and third pass-transistor logic trees, respectively, are input to the respective intermediate input nodes of a triple-input NAND gate G. The triple-input NAND gate G performs a logical operation represented by the expression (20) shown below on these received intermediate logic signals, and provides the result as an output logic signal Z.

$$Z=\overline{W \cdot X \cdot Y}=\bar{W}+\bar{X}+\bar{Y} \qquad (20)$$

Therefore, as a whole, the circuit shown in FIG. 51 performs a logical operation represented by the expression (21) shown below and provides an output logic signal Z, or performs a logical operation represented by the expression (22) shown below and provides an output logic signal $\bar{Z}$ in the negative logic form.

$$Z=\bar{W}+\bar{X}+\bar{Y}=\overline{a \cdot c+b \cdot \bar{c}}+\overline{d \cdot f+e \cdot \bar{f}}+\overline{g \cdot i+h \cdot \bar{i}}=\bar{a} \cdot c+\bar{b} \cdot \bar{c}+\bar{d} \cdot f+\bar{e} \cdot \bar{f}+\bar{g} \cdot i+\bar{h} \cdot \bar{i} \qquad (21)$$

$$\bar{Z}=\overline{W \cdot X \cdot Y}=(a \cdot c+b \cdot \bar{c}) \cdot (d \cdot f+e \cdot \bar{f}) \cdot g \cdot i+h \cdot \bar{i}=$$
$$a \cdot c \cdot d \cdot f \cdot g \cdot i+a \cdot c \cdot d \cdot f \cdot h \cdot \bar{i}+a \cdot c \cdot e \cdot \bar{f} \cdot g \cdot i+a \cdot c \cdot e \cdot \bar{f} \cdot h \cdot \bar{i}+$$
$$b \cdot \bar{c} \cdot d \cdot f \cdot g \cdot i+b \cdot \bar{c} \cdot d \cdot f \cdot h \cdot \bar{i}+b \cdot \bar{c} \cdot e \cdot \bar{f} \cdot g \cdot i+b \cdot \bar{c} \cdot e \cdot \bar{f} \cdot h \cdot \bar{i} \qquad (22)$$

As can be seen from the expressions (21) and (22), the circuit shown in FIG. 51 can deal with up to nine variables or nine logic signals a through i. When positive logic is employed as in the expression (21), the circuit can perform a logical operation including up to six product terms each including up to two variables. On the other hand, if negative logic is employed, the circuit can perform a logical operation including up to eight product terms each including up to six variables.

Figure 52:
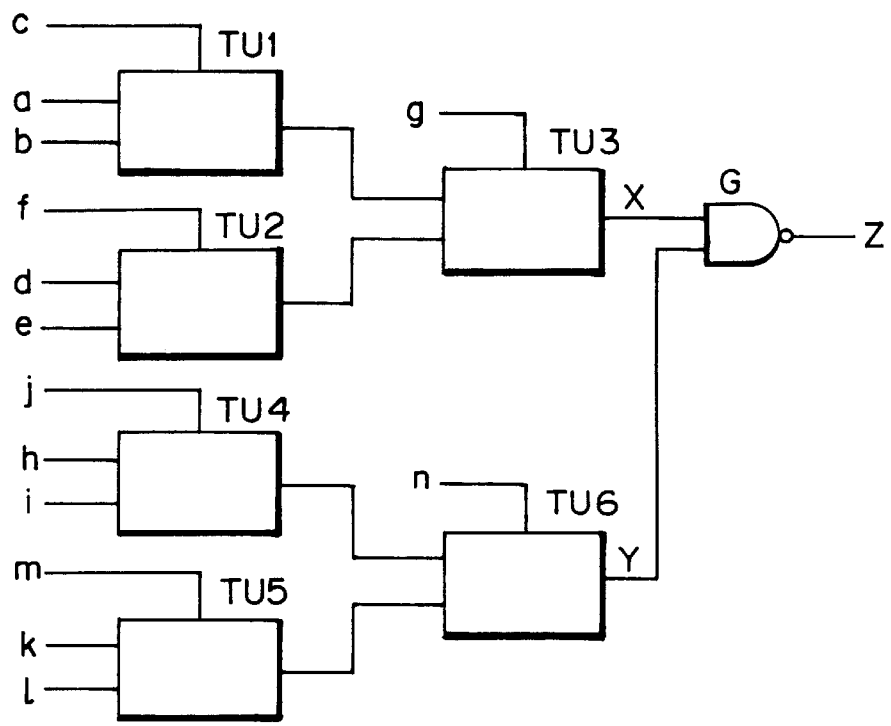

FIG. 52 is a circuit diagram of a third example of a composite pass-transistor logic circuit having two dual-stage pass-transistor logic trees. In this circuit, a first pass-transistor logic tree is formed with pair pass-transistor elements TU1, TU2, and TU3. That is, the first pass-transistor logic tree is composed of a first first-stage pair pass-transistor element TU1 and a second first-stage pair pass-transistor element TU2 connected to a second-stage pair pass-transistor element TU3. This first pass-transistor logic tree performs a logical operation represented by the expression (23) shown below on the logic signals a through g, and provides the result as an intermediate logic signal X.

$$X=a \cdot c \cdot g+b \cdot \bar{c} \cdot g+d \cdot f \cdot \bar{g}+e \cdot \bar{f} \cdot \bar{g} \qquad (23)$$

A second pass-transistor logic tree is formed with pair pass-transistor elements TU4, TU5, and TU6. This second pass-transistor logic tree performs a logical operation represented by the expression (24) shown below on the logic signals h through n, and provides the result as an intermediate logic signal Y.

$$Y=h \cdot j \cdot n+i \cdot \bar{j} \cdot n+k \cdot m \cdot \bar{n}+l \cdot \bar{m} \cdot \bar{n} \qquad (24)$$

The composite pass-transistor logic circuit shown in FIG. 52 also includes a dual-input NAND gate G serving as the multiple-input logic gate. This dual-input NAND gate G performs a logical operation represented by the expression (25) shown below on the intermediate logic signals X and Y received from the respective pass-transistor logic trees and provides the result as an intermediate logic signal Z.

$$Z=\overline{X \cdot Y}=\bar{X}+\bar{Y} \qquad (25)$$

Therefore, as a whole, the circuit shown in FIG. 52 performs a logical operation represented by the expression (26) shown below and provides an output logic signal Z, or performs a logical operation represented by the expression

(27) shown below and provides an output logic signal $\overline{Z}$ in the negative logic form.

$$Z=\bar{a}\cdot c\cdot g+b\cdot \bar{c}\cdot g+\bar{d}\cdot f\cdot \bar{g}+\bar{e}\cdot f\cdot \bar{g}+\bar{h}\cdot j\cdot n+\bar{i}\cdot j\cdot n+\bar{k}\cdot m\cdot \bar{n}+\bar{l}\cdot \bar{m}\cdot \bar{n} \quad (26)$$

$$\overline{Z}=a\cdot c\cdot g\cdot h\cdot j\cdot n+a\cdot c\cdot g\cdot i\cdot j\cdot n+a\cdot c\cdot g\cdot k\cdot m\cdot \bar{n}+a\cdot c\cdot g\cdot l\cdot \bar{m}\cdot \bar{n}+b\cdot \bar{c}\cdot g\cdot h\cdot j\cdot n+$$
$$b\cdot \bar{c}\cdot g\cdot i\cdot j\cdot n+b\cdot \bar{c}\cdot g\cdot k\cdot m\cdot \bar{n}+b\cdot \bar{c}\cdot g\cdot l\cdot \bar{m}\cdot \bar{n}+d\cdot \bar{f}\cdot \bar{g}\cdot h\cdot j\cdot n+d\cdot \bar{f}\cdot \bar{g}\cdot i\cdot j\cdot n+$$
$$d\cdot \bar{f}\cdot \bar{g}\cdot k\cdot m\cdot \bar{n}+d\cdot \bar{f}\cdot \bar{g}\cdot l\cdot \bar{m}\cdot \bar{n}+e\cdot \bar{f}\cdot \bar{g}\cdot h\cdot j\cdot n+e\cdot \bar{f}\cdot \bar{g}\cdot i\cdot j\cdot n+e\cdot \bar{f}\cdot \bar{g}\cdot k\cdot m\cdot \bar{n}+$$
$$e\cdot \bar{f}\cdot \bar{g}\cdot l\cdot \bar{m}\cdot \bar{n} \quad (27)$$

As can be seen from the expressions (26) and (27), the circuit shown in FIG. 52 can deal with up to fourteen variables or fourteen logic signals a through n. When positive logic is employed as in the expression (26), the circuit can perform a logical operation including up to eight product terms each including up to three variables. On the other hand, if negative logic is employed, the circuit can perform a logical operation including up to sixteen product terms each including up to six variables.

Figure 53:
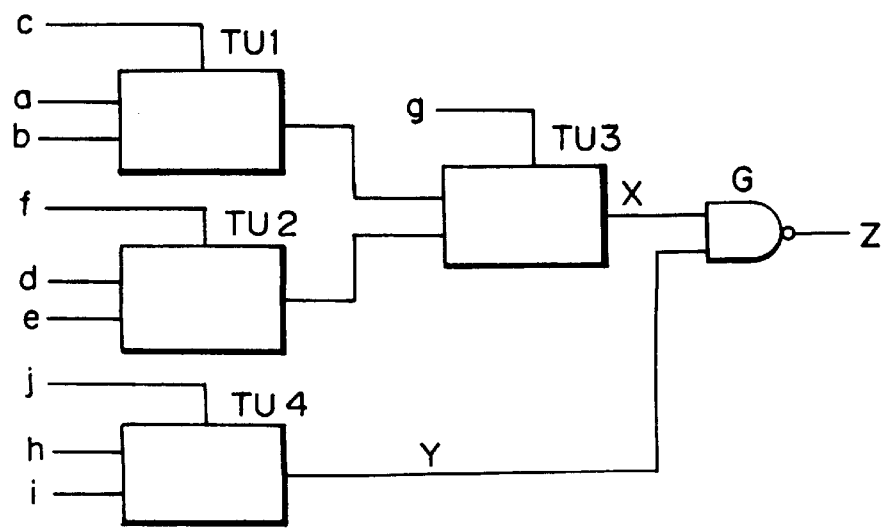

FIG. 53 is a circuit diagram of a fourth example of a composite pass-transistor logic circuit having a single-stage pass-transistor logic tree and a dual-stage pass-transistor logic tree. In this circuit, a first pass-transistor logic tree is constructed with pair pass-transistor elements TU1, TU2, and TU3. This first pass-transistor logic tree performs a logical operation represented by the logic expression (28) shown below on the logic signals a through g, and provides the result as an intermediate logic signal X.

$$X=a\cdot c\cdot g+b\cdot \bar{c}\cdot g+d\cdot \bar{f}\cdot \bar{g}+e\cdot \bar{f}\cdot \bar{g} \quad (28)$$

A second pass-transistor logic tree is constructed with a pair pass-transistor element TU4. This second pass-transistor logic tree performs a logical operation represented by the expression (29) shown below on the logic signals h through j, and provides the result as an intermediate logic signal Y.

$$Y=h\cdot j+i\cdot j \quad (29)$$

The composite pass-transistor logic circuit shown in FIG. 53 further includes a dual-input NAND gate G serving as the multiple-input logic gate. This dual-input NAND gate G performs a logical operation represented by the expression (30) shown below on the intermediate logic signals X and Y and provides the result as an output logic signal Z.

$$Z=\overline{X\cdot Y}=\bar{X}+\bar{Y} \quad (30)$$

Therefore, as a whole, the circuit shown in FIG. 53 performs a logical operation represented by the expression (31) shown below and provides an output logic signal Z, or performs a logical operation represented by the expression (32) shown below and provides an output logic signal $\overline{Z}$ in the negative logic form.

$$Z=\bar{a}\cdot c\cdot g+b\cdot \bar{c}\cdot g+\bar{d}\cdot f\cdot \bar{g}+\bar{e}\cdot f\cdot \bar{g}+\bar{h}\cdot j+\bar{i}\cdot j \quad (31)$$

$$\overline{Z}=a\cdot c\cdot g\cdot h\cdot j+a\cdot c\cdot g\cdot i\cdot j+b\cdot \bar{c}\cdot g\cdot h\cdot j+b\cdot \bar{c}\cdot g\cdot i\cdot j+d\cdot \bar{f}\cdot \bar{g}\cdot h\cdot j+d\cdot \bar{f}\cdot \bar{g}\cdot i\cdot j+$$
$$e\cdot \bar{f}\cdot \bar{g}\cdot h\cdot j+e\cdot \bar{f}\cdot \bar{g}\cdot i\cdot j \quad (32)$$

As can be seen from the expressions (31) and (32), the circuit shown in FIG. 53 can deal with up to ten variables or ten logic signals a through j. When positive logic is employed, the circuit can perform a logical operation including up to four product terms each including up to three variables and up to two product terms each including up to two variables, as shown in the expression (31). On the other hand, if negative logic is employed for the output logic signal, the circuit can perform a logical operation including up to eight product terms each including up to five variables, as shown in the expression (32).

Figure 54:
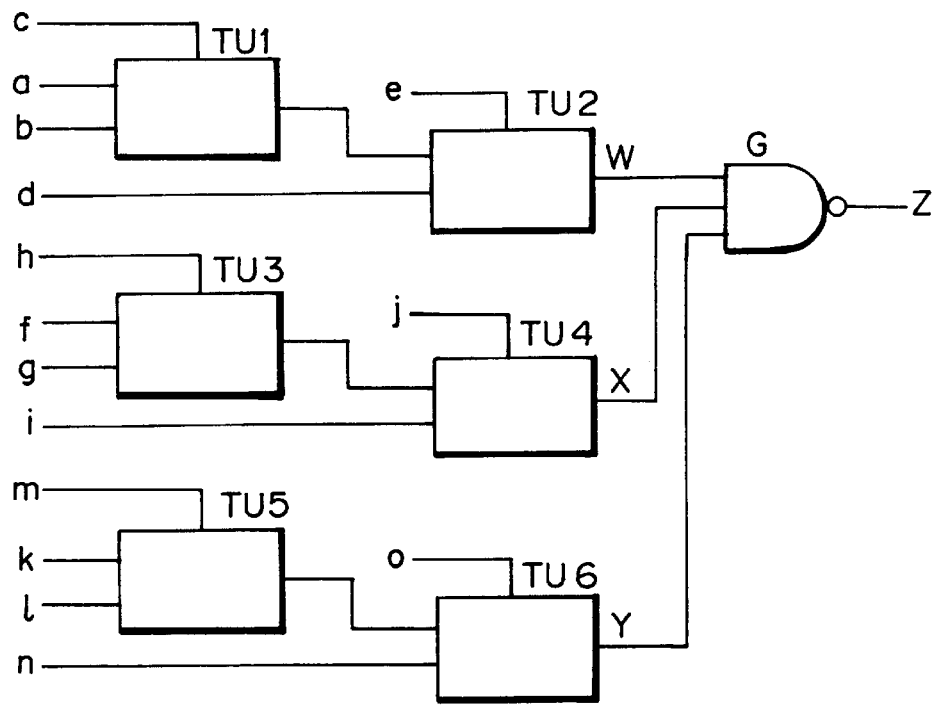

FIG. 54 is a circuit diagram of a composite pass-transistor logic circuit having three dual-stage pass transistor logic trees. In this circuit, a first pass-transistor logic tree is constructed with a pair pass-transistor element TU1 at the first stage and a pair pass-transistor element TU2 at the second stage. This first pass-transistor logic tree performs a logical operation represented by the expression (33) shown below on the logic signals a through e, and provides the result as an intermediate logic signal W.

$$W=a\cdot c\cdot e+b\cdot \bar{c}\cdot e+d\cdot \bar{e} \quad (33)$$

Similarly, a second pass-transistor logic tree is constructed with pair pass-transistor elements TU3 and TU4. This second pass-transistor logic tree performs a logical operation represented by the expression (34) shown below on the logic signals f through j, and provides the result as an intermediate logic signal X.

$$X=f\cdot h\cdot j+g\cdot \bar{h}\cdot j+i\cdot \bar{j} \quad (34)$$

A third pass-transistor logic tree is constructed with pair pass-transistor elements TU5 and TU6. This third pass-transistor logic tree performs a logical operation represented by the expression (35) shown below on the logic signals k through o, and provides the result as an intermediate logic signal Y.

$$Y=k\cdot m\cdot o+l\cdot \bar{m}\cdot o+n\cdot \bar{o} \quad (35)$$

The composite pass-transistor logic circuit shown in FIG. 54 further includes a triple-input NAND gate G serving as the multiple-input logic gate. This triple-input NAND gate G performs a logical operation represented by the expression (36) shown below and provides the result as an output logic signal Z, or performs a logical operation represented by the expression (37) shown below and provides the result as an output logic signal $\overline{Z}$ in the form of negative logic.

$$Z=\overline{W\cdot X\cdot Y}=\bar{W}+\bar{X}+\bar{Y} \quad (36)$$

$$\overline{Z}=W\cdot X\cdot Y \quad (37)$$

Therefore, as a whole, the circuit shown in FIG. 54 performs a logical operation represented by the expression (38) shown below and provides an output logic signal Z, or performs a logical operation represented by the expression (39) shown below and provides an output logic signal $\overline{Z}$ in the negative logic form.

$$Z=\bar{a}\cdot c\cdot e+b\cdot \bar{c}\cdot e+\bar{d}\cdot \bar{e}+f\cdot h\cdot j+\bar{g}\cdot \bar{h}\cdot j+\bar{i}\cdot \bar{j}+k\cdot m\cdot o+l\cdot \bar{m}\cdot o+\bar{n}\cdot \bar{o} \quad (38)$$

$$\overline{Z}=a\cdot c\cdot e\cdot f\cdot h\cdot j\cdot k\cdot m\cdot o+a\cdot c\cdot e\cdot f\cdot h\cdot j\cdot l\cdot \bar{m}\cdot o+a\cdot c\cdot e\cdot f\cdot h\cdot j\cdot n\cdot \bar{o}+a\cdot c\cdot e\cdot g\cdot \bar{h}\cdot j\cdot k\cdot m\cdot o+$$
$$a\cdot c\cdot e\cdot g\cdot \bar{h}\cdot j\cdot l\cdot \bar{m}\cdot o+a\cdot c\cdot e\cdot g\cdot \bar{h}\cdot j\cdot n\cdot \bar{o}+a\cdot c\cdot e\cdot i\cdot \bar{j}\cdot k\cdot m\cdot o+a\cdot c\cdot e\cdot i\cdot \bar{j}\cdot l\cdot \bar{m}\cdot o+$$
$$a\cdot c\cdot e\cdot i\cdot \bar{j}\cdot n\cdot \bar{o}+b\cdot \bar{c}\cdot e\cdot f\cdot h\cdot j\cdot k\cdot m\cdot o+b\cdot \bar{c}\cdot e\cdot f\cdot h\cdot j\cdot l\cdot \bar{m}\cdot o+b\cdot \bar{c}\cdot e\cdot f\cdot h\cdot j\cdot n\cdot \bar{o}+$$
$$b\cdot \bar{c}\cdot e\cdot g\cdot \bar{h}\cdot j\cdot k\cdot m\cdot o+b\cdot \bar{c}\cdot e\cdot g\cdot \bar{h}\cdot j\cdot l\cdot \bar{m}\cdot o+b\cdot \bar{c}\cdot e\cdot g\cdot \bar{h}\cdot j\cdot n\cdot \bar{o}+$$
$$b\cdot \bar{c}\cdot e\cdot i\cdot \bar{j}\cdot k\cdot m\cdot o+b\cdot \bar{c}\cdot e\cdot i\cdot \bar{j}\cdot l\cdot \bar{m}\cdot o+b\cdot \bar{c}\cdot e\cdot i\cdot \bar{j}\cdot n\cdot \bar{o}+d\cdot \bar{e}\cdot f\cdot h\cdot j\cdot k\cdot m\cdot o+$$
$$d\cdot \bar{e}\cdot f\cdot h\cdot j\cdot l\cdot \bar{m}\cdot o+d\cdot \bar{e}\cdot f\cdot h\cdot j\cdot n\cdot \bar{o}+d\cdot \bar{e}\cdot g\cdot \bar{h}\cdot j\cdot k\cdot m\cdot o+d\cdot \bar{e}\cdot g\cdot \bar{h}\cdot j\cdot l\cdot \bar{m}\cdot o+$$
$$d\cdot \bar{e}\cdot g\cdot \bar{h}\cdot j\cdot n\cdot \bar{o}+d\cdot \bar{e}\cdot i\cdot \bar{j}\cdot k\cdot m\cdot o+d\cdot \bar{e}\cdot i\cdot \bar{j}\cdot l\cdot \bar{m}\cdot o+d\cdot \bar{e}\cdot i\cdot \bar{j}\cdot n\cdot \bar{o} \quad (39)$$

As can be seen from the expressions (38) and (39), the circuit shown in FIG. 54 can deal with up to fifteen variables or fifteen logic signals a through o. When positive logic is employed, the circuit can perform a logical operation including up to six product terms each including up to three variables and up to three product terms each including up to two variables, as shown in the expression (38). On the other hand, if negative logic is employed, the circuit can perform a logical operation including up to eight product terms each including up to nine variables, up to twelve product terms each including up to eight variables, up to six product terms each including up to seven variables, and up to one product term including up to six variables, as shown in the expression (39).

Figure 55:
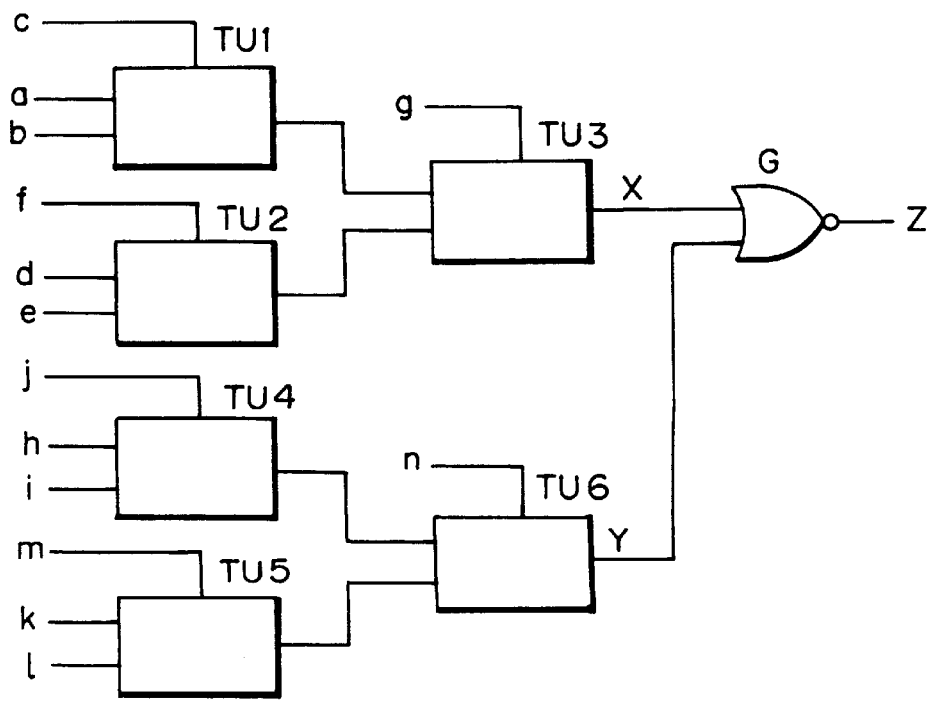

FIG. 55 is a circuit diagram of a composite pass-transistor logic circuit having two dual-stage pass-transistor logic trees. In this circuit, a first pass-transistor logic tree is formed with pair pass-transistor elements TU1, TU2, and TU3. This first pass-transistor logic tree performs a logical operation represented by the expression (40) shown below on the logic signals a through g, and provides the result as an intermediate logic signal X.

$$X = a \cdot c \cdot g + b \cdot \bar{c} \cdot g + d \cdot f \cdot \bar{g} + e \cdot f \cdot \bar{g} \tag{40}$$

A second pass-transistor logic tree is formed with pair pass-transistor elements TU4, TU5, and TU6. This second pass-transistor logic tree performs a logical operation represented by the expression (41) shown below on the logic signals h through n, and provides the result as an intermediate logic signal Y.

$$Y = h \cdot j \cdot n + i \cdot f \cdot n + k \cdot m \cdot \bar{n} + l \cdot \bar{m} \cdot \bar{n} \tag{41}$$

The circuit shown in FIG. 55 further includes a dual-input NOR gate G serving as the multiple-input logic gate. This dual-input NOR gate G performs a logical operation represented by the expression (42) shown below and provides the result as an output logic signal Z, or performs a logical operation represented by the expression (43) shown below and provides the result as an output logic signal $\bar{Z}$ in the form of negative logic.

$$\bar{Z} = X + Y \tag{42}$$

$$Z = \overline{X \cdot Y} = \bar{X} \cdot \bar{Y} \tag{43}$$

Therefore, as a whole, the circuit shown in FIG. 55 performs a logical operation represented by the expression (44) shown below and provides an output logic signal $\bar{Z}$ in the negative logic form, or performs a logical operation represented by the expression (45) shown below and provides an output logic signal z.

$$\bar{Z} = a \cdot c \cdot g + b \cdot \bar{c} \cdot g + d \cdot f \cdot \bar{g} + e \cdot f \cdot \bar{g} + h \cdot j \cdot n + i \cdot f \cdot n + k \cdot m \cdot \bar{n} + l \cdot \bar{m} \cdot \bar{n} \tag{44}$$

$$Z = \bar{a} \cdot c \cdot g \cdot \bar{h} \cdot j \cdot n + \bar{a} \cdot c \cdot g \cdot \bar{i} \cdot f \cdot n + \bar{a} \cdot c \cdot g \cdot \bar{K} \cdot m \cdot \bar{n} + \bar{a} \cdot c \cdot g \cdot \bar{l} \cdot \bar{m} \cdot \bar{n} + b \cdot \bar{c} \cdot g \cdot \bar{h} \cdot j \cdot n + \\
b \cdot \bar{c} \cdot g \cdot \bar{i} \cdot f \cdot n + b \cdot \bar{c} \cdot g \cdot \bar{k} \cdot m \cdot \bar{n} + b \cdot \bar{c} \cdot g \cdot \bar{l} \cdot \bar{m} \cdot \bar{n} + \bar{d} \cdot f \cdot \bar{g} \cdot \bar{h} \cdot j \cdot n + \bar{d} \cdot f \cdot \bar{g} \cdot \bar{i} \cdot f \cdot n + \\
\bar{d} \cdot f \cdot \bar{g} \cdot \bar{k} \cdot m \cdot \bar{n} + \bar{d} \cdot f \cdot \bar{g} \cdot \bar{l} \cdot \bar{m} \cdot \bar{n} + \bar{e} \cdot f \cdot \bar{g} \cdot \bar{h} \cdot j \cdot n + \bar{e} \cdot f \cdot \bar{g} \cdot \bar{i} \cdot f \cdot n + \bar{e} \cdot f \cdot \bar{g} \cdot \bar{k} \cdot m \cdot \bar{n} + \\
\bar{e} \cdot f \cdot \bar{g} \cdot \bar{l} \cdot \bar{m} \cdot \bar{n} \tag{45}$$

As can be seen from the expressions (44) and (45), the circuit shown in FIG. 54 can deal with up to fourteen variables or fourteen logic signals a through n. When negative logic is employed, the circuit can perform a logical operation including up to eight product terms each including up to three variables, as shown in the expression (44). On the other hand, if positive logic is employed, the circuit can perform a logical operation including up to sixteen product terms each including up to six variables, as shown in the expression (45).

Figure 56:
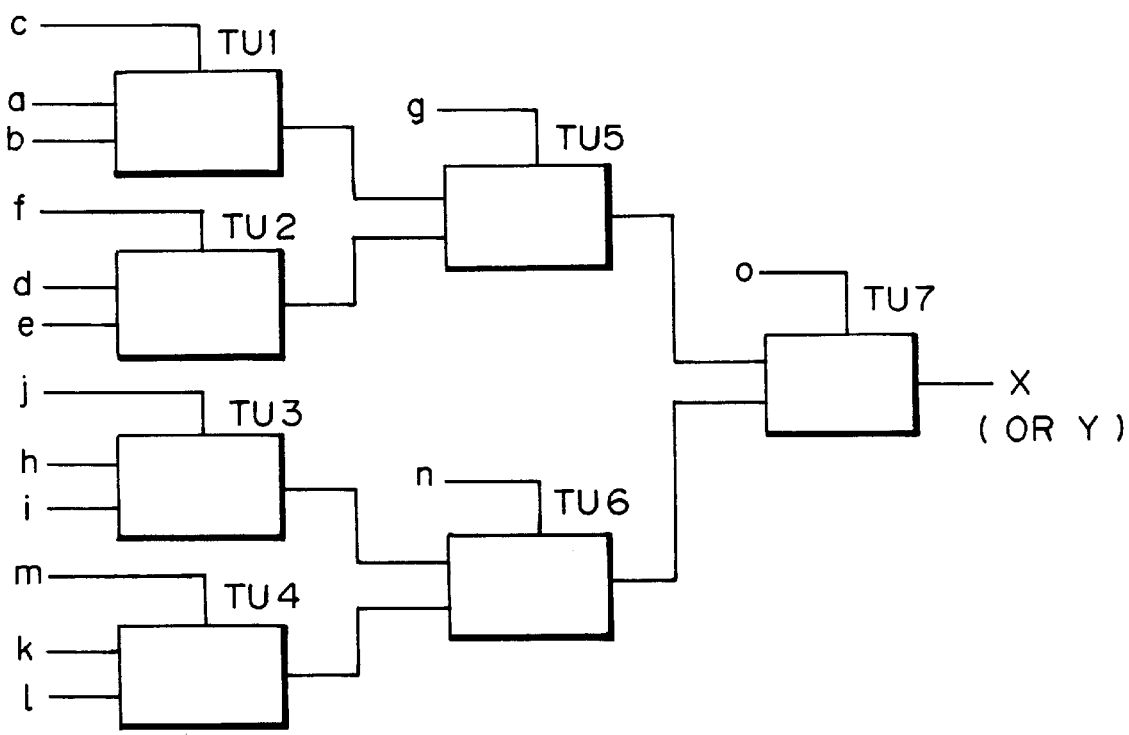
Figure 57:
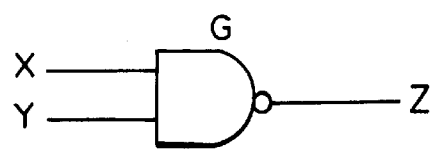

FIGS. 56 and 57 illustrate a composite pass-transistor logic circuit having two triple-stage pass transistor logic trees. This logic circuit is formed using three basic cells shown in FIG. 29.

In this circuit, both first and second pass-transistor logic trees have the same triple-stage circuit configuration as shown in FIG. 56, wherein the first pass-transistor logic tree outputs an intermediate logic signal X and the second pass-transistor logic tree output an intermediate logic signal Y. The first pass-transistor logic tree performs a logical operation represented by expression (46) and provides the result as an intermediate logic signal X.

$$X = o \cdot g \cdot (a \sim c + b \cdot \bar{c}) + o \cdot \bar{g} \cdot (d \cdot f + e \cdot \bar{f}) + \bar{o} \cdot n \cdot (h \cdot j + i \cdot \bar{f}) + \bar{o} \cdot \bar{n} \cdot (k \cdot m + l \cdot \bar{m}) = a \cdot c \cdot g \cdot o + \\
b \cdot \bar{c} \cdot g \quad o + d \cdot f \cdot \bar{g} \cdot o + e \cdot f \cdot \bar{g} \cdot o + h \cdot j \cdot n \cdot \bar{o} + i \cdot f \cdot n \cdot \bar{o} + k \cdot m \cdot \bar{n} \cdot \bar{o} + l \cdot \bar{m} \cdot \bar{n} \cdot \bar{o} \tag{46}$$

The second pass-transistor logic tree performs a logical operation represented by a logic expression which has the same form as the expression (46) except for the variable names, and provides the result as an intermediate logic signal Y.

FIG. 57 illustrates a dual-input NAND gate G employed in this composite pass-transistor logic circuit. This dual-input NAND gate G performs a logical operation represented by the expression (47) shown below.

$$Z = \overline{X \cdot Y} = \bar{X} + \bar{Y} \tag{47}$$

If the expression (46) representing the intermediate logic signal X and the similar logic expression representing the intermediate logic signal Y are substituted into the expression (47), then the resultant logic expression represents the logical operation performed by the composite pass transistor logic circuit as a whole. In this circuit, up to thirty variables can be dealt with. If the output logic signal is dealt with in positive logic, the circuit can perform a logical operation including up to sixteen product terms each containing up to four variables. In the case where the output logic signal is dealt with in negative logic, the circuit can perform a logical operation including up to sixty four product terms each containing up to eight variables.

In addition to the above examples, the composite pass-transistor logic circuit may be formed in other fashions. For example, a composite pass-transistor logic circuit with three dual-stage pass-transistor logic trees, a composite pass-transistor logic circuit with four single-stage pass transistor logic trees, or a composite pass-transistor logic circuit having a combination of any of the above pass-transistor logic tree configurations.

However, it is not desirable that the pass-transistor logic tree have an unnecessarily great number of stages. As can be understood from the expression (46), the logic signals which are input to the nodes located at further right-hand side in FIG. 56 have greater influence on the output logic signal Z. This limits the logical operations which can be realized in the composite pass-transistor logic circuit shown in FIGS. 56 and 57. Furthermore, when only particular part of product terms need four variables, the majority of pass transistors are not used. Furthermore, there are large differences in the number of stages present in the signal transmission path and also in the load capacitance for the logic circuit in the preceding stage, between the logic signals applied to the input nodes (for example the input node a) located at the left-hand side of FIG. 56 and those applied to the input nodes (for example the input node o) at the right-hand side. This means that the operating timing greatly varies from an input node to another, which makes it difficult to verify the operation timing. When, for example, only a partial modification of design is made, then it is required to re-verify the entire operation timing.

In the specific examples described above, various composite pass-transistor logic circuits are formed in the basic cell shown in FIG. 29, using various numbers of pass-transistor logic trees having various numbers of stages. In these examples, the number of pass-transistor logic trees is equal to the number of the intermediate input nodes of the multiple-input logic gate. However, the present invention is not limited to this configuration. A logic circuit may also be formed in the basic cell of the present embodiment in different ways. For example, it is also possible to form a composite pass-transistor logic circuit in which two pass-transistor logic trees are combined with a triple-input logic gate. In this case, the intermediate input node, which is not used to receive an intermediate logic signal from a pass-transistor logic tree, can be used to receive an input logic signal.

In the examples described above, all the intermediate output nodes of pass-transistor logic trees are connected directly to the intermediate input nodes of a multiple-input logic gate. Instead, some or all of the intermediate output nodes may also be connected via an inverter to the intermediate input nodes so. that some or all of the intermediate logic signals are received after being inverted.

The basic cell shown in FIG. 29 may also be used to form various logic circuits other than composite pass-transistor logic circuits. For example, simple logic circuits such as an NAND gate, NOR gate, or the like, may be realized using only a multiple-input logic gate in simpler and more efficient manner.

In the examples described above, either a NAND gate or a NOR gate is employed as the multiple-input logic gate. Other logic gates may also be employed as the multiple-input logic gate. However, to use composite pass-transistor logic circuits in their best way in which various logical operations can be expressed in a simple and efficient fashion by combining a plurality of pass-transistor logic circuit with a multiple-input logic gate, it is preferable to employ a simple logic gate such as NAND, NOR, AND, OR, or the like. The use of such a simple logic gate allows a reduction in the number of transistors and also in the number of types thereof which should be prepared in each CMOS gate area. This also leads to a reduction in the size of the basic cell. If a greater number of transistors are prepared so that more complex multiple-input logic gates can be formed, particular kinds of logical operations may be expressed in a more efficient way. However, in general, the number of transistors which are not used at all increases with the number of prepared transistors.

As described above, the gate array of the present invention includes basic cells capable of efficiently forming a composite pass-transistor logic circuit including a plurality of pass-transistor logic trees and a multiple-input logic gate for receiving the intermediate logic signals from the respective pass-transistor logic trees. Thus, the present invention provides a high-performance gate array integrated circuit in which various logical operations are expressed by using composite pass-transistor logic circuits having the advantage that the logic circuits can be realized with a smaller number of transistors than the conventional pass-transistor logic circuits and the conventional CMOS logic circuits and also having the advantage that the circuit can operate at a high speed with low power consumption. In the present embodiment, a 6-bit SRAM cell or six D-type flip-flops can be realized in one basic cell. Therefore, the gate array of the resent embodiment is also suitable to realize a function which needs a high-capacity memory or a large number of sequential logic circuits.

When a semiconductor integrated circuit having a desired function is produced using a gate array integrated circuit, logic circuits expressing the required logical operations are in practice first formed in the respective basic cells. Some base cells are used to form a flip-flop, SRAM, and/or other circuits. Interconnection among the above logic circuits, flip-flop, SRAM, and other circuits are then made so that the desired function can be ralized by the resultant gate array as a whole. Thus a certain logic circuit in the obtained gate array may receive various input logic signals such as a logic signal produced by another logic circuit, a logic signal read from an SRAM, a logic signal input from the outside via an I/O circuit, or the like.

In the present invention, as described above, composite pass-transistor logic circuits each including a plurality of pass-transistor logic trees and a multiple-input logic gate are used as elementary circuit units to form an integrated circuit. Composite pass-transistor logic circuits can express various complex logical operations in a highly efficient manner, and the obtained logic circuits can operate at a high speed. Thus, it is possible to realize various desired functions on integrated circuits using composite pass-transistor logic circuits having the above-described features and advantages. In particular, the present invention is very useful when applied to FPGAs, since complex logical operations can be expressed using composite pass-transistor logic circuits, and the obtained FPGAs can operate at a high speed with low power consumption.

Furthermore, in the present invention, the programmable logic block for use in an FPGA can flexibly construct a composite pass-transistor logic circuit in various forms. In the present invention, pair pass-transistor elements are used in common to construct logic circuits in various forms. This allows more efficient use of circuit elements in a programmable logic block. That is, a desired function can be realized in on a smaller FPGA chip.

The foregoing description of the present invention is illustrative, and variations and additions to the constructions described will occur to persons skilled in the art. The scope of the invention is intended to be limited only by the following claims.

What is claimed is:

1. A logic circuit formed on a surface of a semiconductor substrate, comprising:

a basic cell having a first area including a first configuration of first switching devices and a second area including a second configuration of second switching devices, the first and the second configurations being different;

at least two pass-transistor logic trees, each of the logic trees comprising a pair of pass transistors formed with first selected ones of the first switching devices, the pair of pass transistors having output terminals coupled with each other to make an intermediate output node; and a multiple-input logic gate formed with selected ones of the second switching devices, the multiple-input logic gate having at least two intermediate input nodes, each of the two intermediate input nodes receiving an intermediate logic signal from the intermediate output node of one of the pass-transistor logic trees.

2. A logic circuit formed on a surface of a semiconductor substrate, comprising:

a first basic cell and a second basic cell, the first basic cell having a first area including a first configuration of first switching devices and a second area including a second configuration of second switching devices, the first and the second configurations being different, one of the first and the second basic cells having a third area including a third configuration of third switching devices;

a first pass-transistor logic tree including a first pair of pass transistors formed with first selected ones of the first switching devices, the first pair of pass transistors having output terminals coupled with each other to make a first intermediate output node;

a second pass-transistor logic tree including a second pair of pass transistors formed with first selected ones of the third switching devices, the second pair of pass transistors having output terminals coupled with each other to make a second intermediate output node; and a multiple-input logic gate formed with selected ones of the second switching devices, the multiple-input logic gate having intermediate input nodes for receiving intermediate logic signals from the first and the second intermediate output nodes of the first and the second pass-transistor logic trees.

3. A mask pattern for forming interconnections over a first basic cell and a second basic cell formed on a surface of a semiconductor substrate, the first basic cell having a first area including a first configuration of first switching devices and a second area including a second configuration of second switching devices, the first and the second configurations being different, one of the first and the second basic cells having a third area including a third configuration of third switching devices, the mask pattern comprising:

first interconnection patterns for interconnecting first selected ones of the first switching devices to form a first pass-transistor logic tree including a first pair of pass transistors, the first pair of pass transistors having output terminals coupled with each other to make a first intermediate output node;

second interconnection patterns for interconnecting first selected ones of the third switching devices to form a second pass-transistor logic tree including a second pair of pass transistors, the second pair of pass transistors having output terminals coupled with each other to make a second intermediate output terminal; and third interconnection patterns for interconnecting selected ones of the second switching devices to form a multiple-input logic gate, the multiple-input logic gate having intermediate input nodes for receiving intermediate logic signals from the first and the second intermediate output nodes of the first and the second pass-transistor logic trees.

4. The logic circuit according to claim 1, wherein the first configuration is different from the second configuration in a number of switching devices, a conduction type of at least one of switching devices, or a driving capacity of at least one of switching devices.

5. The logic circuit according to claim 1, wherein each of the pass-transistor logic trees includes an inverter formed with second selected ones of the first switching devices, the inverter producing a complementary logic signal of a logic signal received by a control terminal of a first one of the pair of pass transistors and providing the complementary logic signal to a control terminal of a second one of the pair of pass transistors.

6. The logic circuit according to claim 1, wherein the first and the second areas are aligned in a first direction and have a common dimension in a direction perpendicular to the first direction.

7. The logic circuit according to claim 1, wherein each of the first and the second areas has a rectangular shape.

8. A logic circuit formed on a surface of a semiconductor substrate, comprising:

a basic cell having a first area including a first configuration of first switching devices and a second area including a second configuration of second switching devices, the first and the second configurations being different;

a pass-transistor logic tree including a pair of pass transistors formed with first selected ones of the first switching devices, the pair of pass transistors having output terminals coupled with each other to make an intermediate output node; and a multiple-input logic gate formed with selected ones of the second switching devices, the multiple-input logic gate having an intermediate input node for receiving an intermediate logic signal from the intermediate output node of the pass-transistor logic tree.

9. The logic circuit according to claim 8, wherein the first configuration is different from the second configuration in a number of switching devices, a conduction type of at least one of switching devices, or a driving capacity of at least one of switching devices.

10. The logic circuit according to claim 8, wherein the pass-transistor logic tree includes an inverter formed with second selected ones of the first switching devices, the inverter producing a complementary logic signal of a logic signal received by a control terminal of a first one of the pair of pass transistors and providing the complementary logic signal to a control terminal of a second one of the pair of pass transistors.

11. The logic circuit according to claim 8, wherein the first and the second areas are aligned in a first direction and have a common dimension in a direction perpendicular to the first direction.

12. The logic circuit according to claim 8, wherein each of the first and the second areas has a rectangular shape.

13. The logic circuit according to claim 2, wherein the first configuration is different from the second configuration in a number of switching devices, a conduction type of at least one of switching devices, or a driving capacity of at least one of switching devices.

14. The logic circuit according to claim 2, wherein the first and the third configurations are substantially identical in a number of switching devices, conduction types of switching devices and driving capacities of switching devices.

15. The logic circuit according to claim 14, wherein a layout of the first switching devices and a layout of the third switching devices are substantially identical.

16. The logic circuit according to claim 14, wherein a layout of the first switching devices and a layout of the third switching devices are mirror-inverted.

17. The logic circuit according to claim 2, wherein:

the first pass-transistor logic tree includes a first inverter formed with second selected ones of the first switching devices, the first inverter producing a complementary logic signal of a logic signal received by a control terminal of a first one of the first pair of pass transistors and providing the complementary logic signal to a control terminal of a second one of the first pair of pass transistors; and the second pass-transistor logic tree includes a second inverter formed with second selected ones of the third switching devices, the second inverter producing a complementary logic signal of a logic signal received by a control terminal of a first one of the second pair of pass transistors and providing the complementary logic signal to a control terminal of a second one of the second pair of pass transistors.

18. The logic circuit according to claim 2, wherein the first and the second areas are aligned in a first direction and the first, the second and the third areas have a common dimension in a direction perpendicular to the first direction.

19. The logic circuit according to claim 2, wherein each of the first, the second and the third areas has a rectangular shape.

20. The logic circuit according to claim 2, wherein the first and the second basic cells are neighboring basic cells.

21. A method of forming a logic circuit on a surface of a semiconductor substrate, comprising:

providing a basic cell on the surface of the semiconductor substrate, the basic cell having a first area including a first configuration of first switching devices and a second area including a second configuration of second switching devices, the first and the second configurations being different;

forming at least two pass-transistor logic trees, each of the logic trees comprising a pair of pass transistors by interconnecting first selected ones of the first switching devices, the pair of pass transistors having output terminals coupled with each other to make an intermediate output node; and forming a multiple-input logic gate by interconnecting selected ones of the second switching devices, the multiple-input logic gate having at least two intermediate input nodes, each of the two intermediate nodes receiving an intermediate logic signal from the intermediate output node of one of the pass-transistor logic trees.

22. The method according to claim 21, wherein the first configuration is different from the second configuration in a number of switching devices, a conduction type of at least one of switching devices, or a-driving capacity of at least one of switching devices.

23. The method according to claim 21, wherein said forming at least two pass-transistor logic trees includes forming inverters by interconnecting second selected ones of the first switching devices, each of the inverters corresponding to one of the pass-transistor logic trees and producing a complementary logic signal of a logic signal received by a control terminal of a first one of the pair of pass transistors and providing the complementary logic signal to a control terminal of a second one of the pair of pass transistors.

24. A method of forming a logic circuit on a surface of a semiconductor substrate, comprising:

providing a basic cell on the surface of the semiconductor substrate, the basic cell having a first area including a first configuration of first switching devices and a second area including a second configuration of second switching devices, the first and the second configurations being different;

forming a pass-transistor logic tree including a pair of pass transistors by interconnecting first selected ones of the first switching device, the pair of pass transistors having output tenminals coupled with each other to make an intermediate output node; and forming a multiple-input logic gate by interconnecting selected ones of the second switching devices, the multiple-input logic gate having an intermediate input node for receiving an intermediate logic signal from the intermediate output node of the pass-transistor logic tree.

25. The method according to claim 24, wherein the first configuration is different from the second configuration in a number of switching devices, a conduction type of at least one of switching devices, or a driving capacity of at least one of switching devices.

26. The method according to claim 24, wherein said forming a pass-transistor logic tree includes forming an inverter by interconnecting second selected ones of the first switching devices, the inverter producing a complementary logic signal of a logic signal received by a control terminal of a first one of the pair of pass transistors and providing the complementary logic signal to a control terminal of a second one of the pair of pass transistors.

27. A method of forming a logic circuit on a surface of a semiconductor substrate, comprising:

providing a first basic cell and a second basic cell on the surface of the semiconductor substrate, the first basic cell having a first area including a first configuration of first switching devices and a second area including a second configuration of second switching devices, the first and the second configurations being different, one of the first and the second basic cells having a third area including a third configuration of third switching devices;

forming a first pass-transistor logic tree including a first pair of pass transistors by interconnecting first selected ones of the first switching devices, the first pair of pass transistors having output terminals coupled with each other to make a first intermediate output node;

forming a second pass-transistor logic tree including a second pair of pass transistors by interconnecting first selected ones of the third switching devices, the second pair of pass transistors having output terminals coupled with each other to make a second intermediate output node; and forming a multiple-input logic gate by interconnecting selected ones of the second switching devices, the multiple-input logic gate having intermediate input nodes for receiving intermediate logic signals from the first and the second intermediate output nodes of the first and the second pass-transistor logic trees.

28. The method according to claim 27, wherein the first configuration is different from the second configuration in a number of switching devices, a conduction type of at least one of switching devices, or a driving capacity of at least one of switching devices.

29. The method according to claim 27, wherein the first and the third configurations are substantially identical in a number of switching devices, conduction types of switching devices and driving capacities of switching devices.

30. The method according to claim 27, wherein:

said forming the first pass-transistor logic tree includes forming a first inverter by interconnecting second selected ones of the first switching devices, the first inverter producing a complementary logic signal of a logic signal received by a control terminal of a first one of the first pair of pass transistors and providing the complementary logic signal to a control terminal of a second one of the first pair of pass transistors; and said forming the second pass-transistor logic tree includes forming a second inverter by interconnecting second selected ones of the third switching devices, the second inverter producing a complementary logic signal of a logic signal received by a control terminal of a first one of the second pair of pass transistors and providing the complementary logic signal to a control terminal of a second one of the second pair of pass transistors.

31. A mask pattern for forming interconnections over a basic cell formed on a surface of a semiconductor substrate, the basic cell having a first area including a first configuration of first switching devices and a second area including a second configuration of second switching devices, the first and the second configurations being different, the mask pattern comprising:
- first interconnection patterns for interconnecting first selected ones of the first switching devices to form at least two pass-transistor logic trees, each of the logic trees comprising a pair of pass transistors, the pair of pass transistors having output terminals coupled with each other to make an intermediate output node; and
- second interconnection patterns for interconnecting selected ones of the second switching devices to form a multiple-input logic gate, the multiple-input logic gate having at least two intermediate input nodes, each of the two intermediate input nodes receiving an intermediate logic signal from the intermediate output node of one of the pass-transistor logic trees.

32. The mask pattern according to claim 31, wherein the first configuration is different from the second configuration in a number of switching devices, a conduction type of at least one of switching devices, or a driving capacity of at least one of switching devices.

33. The mask pattern according to claim 31, further comprising:
- a third interconnection patterns for interconnecting second selected ones of the first switching devices to form inverters, each of the inverters corresponding to one of the pass-transistor logic trees and producing a complementary logic signal of a logic signal received by a control terminal of a first one of the pair of pass transistors and providing the complementary logic signal to a control terminal of a second one of the pair of pass transistors.

34. A mask pattern for forming interconnections over a basic cell formed on a surface of a semiconductor substrate, the basic cell having a first area including a first configuration of first switching devices and a second area including a second configuration of second switching devices, the first and the second configurations being different, the mask pattern comprising:
- first interconnection patterns for interconnecting first selected ones of the first switching devices to form a pass-transistor logic tree comprising a pair of pass transistors, the pair of pass transistors having output terminals coupled with each other to make an intermediate output node; and
- second interconnection patterns for interconnecting selected ones of the second switching devices to form a multiple-input logic gate, the multiple-input logic gate having an intermediate input node for receiving a intermediate logic signal from the intermediate output node of the pass-transistor logic tree.

35. The mask pattern according to claim 34, wherein the first configuration is different from the second configuration in a number of switching devices, a conduction type of at least one of switching devices, or a driving capacity of at least one of switching devices.

36. The mask pattern according to claim 34, furher comprising:
- a third interconnection patterns for interconnecting second selected ones of the first switching devices to form an inverter, the inverter producing a complementary logic signal of a logic signal received by a control terminal of a first one of the pair of pass transistors and providing the complementary logic signal to a control terminal of a second one of the pair of pass transistors.

37. The mask pattern according to claim 3, wherein the first configuration is different from the second configuration in a number of switching devices, a conduction type of at least one of switching devices, or a driving capacity of at least one of switching devices.

38. The mask pattern according to claim 3, wherein the first and the third configurations are substantially identical in a number of switching devices, conduction types of switching devices and driving capacities of switching devices.

39. The mask pattern according to claim 3, further comprising:
- a fourth interconnection patterns for interconnecting second selected ones of the first switching devices to form a first inverter, the first inverter producing a complementary logic signal of a logic signal received by a control terminal of a first one of the first pair of pass transistors and providing the complementary logic signal to a control terminal of a second one of the first pair of pass transistors; and
- a fifth interconnection patterns for interconnecting second selected ones of the third switching devices to form a second inverter, the second inverter producing a complementary logic signal of a logic signal received by a control terminal of a first one of the second pair of pass transistors and providing the complementary logic signal to a control terminal of a second one of the second pair of pass transistors.

40. A basic cell of a gate array semiconductor integrated circuit, comprising:
- a first area including a first configuration of first switching devices, the first configuration forming at least one pair of pass transistor elements each of the pass transistor elements including a pair of pass-transistors having output terminals coupled with each other; and
- a second area including a second configuration of second switching devices, the second configuration forming a multiple-input logic gate.

41. The basic cell according to claim 40, wherein the first configuration is different from the second configuration in a number of switching devices, a conduction type of at least one of switching devices, or a driving capacity of at least one of switching devices.

42. The basic cell according to claim 40, wherein the first switching devices include:
- a pair of first N channel MOS transistors having a first W/L ratio, the pair of first transistors having a common active area;
- a second N channel MOS transistor having a second W/L ratio that is less than the first W/L ratio; and
- a P channel MOS transistor, the second N channel MOS transistor and the P channel MOS transistor having a common gate area.

43. The basic cell according to claim 40, wherein the first switching devices include:
- M pairs of first N channel MOS transistors having a first W/L ratio, each of the pairs having a common active area, where M is an integer greater than zero;
- M second N channel MOS transistors, the second N channel MOS transistors having a second W/L ratio that is less than the first W/L ratio; and
- M P channel MOS transistors, each of the P channel MOS transistors corresponding to one of the second N channel MOS transistors.

44. The basic cell according to claim 43, wherein each of the second N channel MOS transistors and a corresponding P channel MOS transistor have a common gate area.

* * * * *